United States Patent
Morie et al.

(10) Patent No.: US 11,782,680 B2
(45) Date of Patent: Oct. 10, 2023

(54) ARITHMETIC LOGIC UNIT, MULTIPLY-ACCUMULATE OPERATION DEVICE, MULTIPLY-ACCUMULATE OPERATION CIRCUIT, AND MULTIPLY-ACCUMULATE OPERATION SYSTEM

(71) Applicant: Sony Corporation, Tokyo (JP)

(72) Inventors: Takashi Morie, Fukuoka (JP); Masatoshi Yamaguchi, Fukuoka (JP); Hakaru Tamukoh, Fukuoka (JP)

(73) Assignee: Sony Group Corporation, Tokyo (JP)

( * ) Notice: Subject to any disclaimer, the term of this patent is extended or adjusted under 35 U.S.C. 154(b) by 384 days.

(21) Appl. No.: 17/258,309

(22) PCT Filed: Jul. 5, 2019

(86) PCT No.: PCT/JP2019/026835
§ 371 (c)(1),
(2) Date: Jan. 6, 2021

(87) PCT Pub. No.: WO2020/017362
PCT Pub. Date: Jan. 23, 2020

(65) Prior Publication Data
US 2021/0271453 A1   Sep. 2, 2021

(30) Foreign Application Priority Data

Jul. 17, 2018  (JP) .................................. 2018-134590
Feb. 4, 2019  (JP) .................................. 2019-017843

(51) Int. Cl.
*G06F 7/544*   (2006.01)
*G06G 7/16*    (2006.01)
(Continued)

(52) U.S. Cl.
CPC .............. *G06F 7/57* (2013.01); *G06F 7/5443* (2013.01); *G06G 7/16* (2013.01); *G06G 7/161* (2013.01);
(Continued)

(58) Field of Classification Search
CPC .. G06F 7/5443; G06F 7/57; G06F 2207/4824; G06G 7/16–161; G06N 3/065; H03K 17/30; H03K 19/0944
See application file for complete search history.

(56) References Cited

U.S. PATENT DOCUMENTS 10,175,947 B1 *  1/2019  Marukame .............. G06F 7/487
2019/0171418 A1  6/2019  Morie et al.

FOREIGN PATENT DOCUMENTS

JP    H02133888 A    5/1990
JP    H04237364 A    8/1992
(Continued)

OTHER PUBLICATIONS

T. Morie, J. Funakoshi, M. Nagata and A. Iwata, "An analog-digital merged neural circuit using pulse width modulation technique", IEICE Trans. Fund. Electron. Commun. Comput. Sci., vol. E82-A, pp. 356-363, 1999 (Year: 1999).*

(Continued)

*Primary Examiner* — Matthew D Sandifer
(74) *Attorney, Agent, or Firm* — Michael Best & Friedrich LLP

(57) ABSTRACT

An arithmetic logic unit according to an embodiment of the present technology includes: a plurality of input lines; and a multiply-accumulate operation device. Electrical signals are input to the plurality of input lines. The multiply-accumulate operation device includes a pair of output lines, a plurality of multiplication units including a weight unit that generates, on the basis of the electrical signals input to the
(Continued)

plurality of input lines, charges corresponding to multiplication values obtained by multiplying signal values represented by the electrical signals by weight values, a holding unit that holds a binary state, and a switch unit that outputs, on the basis of the held binary state, the charges generated by the weight unit to one of the pair of output lines, an accumulation unit that accumulates the charges output to the pair of output lines by the plurality of multiplication units, and an output unit that outputs, on the basis of the accumulated charges, a multiply-accumulate signal representing a sum of the multiplication values.

23 Claims, 24 Drawing Sheets

(51) Int. Cl.
  *G06N 3/065*  (2023.01)
  *G06G 7/161*  (2006.01)
  *G06F 7/57*  (2006.01)
  *H03K 17/30*  (2006.01)
  *H03K 19/0944*  (2006.01)

(52) U.S. Cl.
  CPC ............ *G06N 3/065* (2023.01); *H03K 17/30* (2013.01); *H03K 19/0944* (2013.01)

(56) References Cited

FOREIGN PATENT DOCUMENTS

| JP | 2007066258 A | 3/2007 |
|---|---|---|
| JP | 2007-241475 A | 9/2007 |
| WO | 2018/034163 A1 | 2/2018 |

OTHER PUBLICATIONS

Liu Rui et al., "Parallelizing SRAM Arrays with Customized Bit-Cell for Binary Neural Networks", 2018 55th ACM/ESDA/IEEE Design Automation Conference (DAC), IEEE, Jun. 24, 2018 (Jun. 24, 2018), pp. 1-6, XP033406020, DOI: 10.1109/DAC.2018.8465935(retrieved on Sep. 13, 2018].

Takashi Morie et al., "An Analog-Digital Merged Neural Circuit Using Pulse Width Modulation Technique", Analog Integrated Circuits and Signal Processing, Dec. 1, 2000 (Dec. 1, 2000), pp. 319-328, XP055468842, BostonDOI: 10 1023/A:1008338200493Retrieved from the Internet: URL:https://link.springer.com/content/pdf/10.1023/A:1008338200493.pdf.

Extended European Search Report dated Jul. 29, 2021 for corresponding European Application No. 19837671.7.

International Search Report (PCT/ISA/210), International Application No. PCT/JP2019/026835, dated Jul. 31, 2019.

Written Opinion of the International Search Authority (PCT/ISA237), International Application No. PCT/JP2019/026835, dated Aug. 13, 2019.

Notification of Transmittal of the International Search Report and the Written Opinion of the International Searching Authority, or the Declaration (PCT/ISA/220), International Application No. PCT/JP2019/026835, dated Aug. 13, 2019.

T. Morie, "Brain-like Analog Computing and Dedicated Integrated Circuits," Journal of the Japanese Society for Artificial Intelligence. vol. 33, No. 1, Jan. 1, 2018. pp. 39-44. ISSN 2188-2266.

\* cited by examiner mode = 0 : Multiply-accumulate operation mode
mode = 1 : Weight setting mode type = 0 :TACT system (Spike timing system)
type = 1 : PWM system

ARITHMETIC LOGIC UNIT, MULTIPLY-ACCUMULATE OPERATION DEVICE, MULTIPLY-ACCUMULATE OPERATION CIRCUIT, AND MULTIPLY-ACCUMULATE OPERATION SYSTEM

TECHNICAL FIELD

The present technology relates to an arithmetic logic unit, a multiply-accumulate operation device, a multiply-accumulate operation circuit, and a multiply-accumulate operation system that are applicable to a multiply-accumulate operation using an analog system.

BACKGROUND ART

In the past, a technology for performing a multiply-accumulate operation has been developed. The multiply-accumulate operation is an operation that multiplies each of a plurality of input values by a weight and adds the multiplication results to each other, and is used for, for example, processing of recognizing an image and voice by a neural network or the like.

For example, Patent Literature 1 describes an analog circuit in which processing of a multiply-accumulate operation is performed by an analog system.

In this analog circuit, a weight corresponding to each of a plurality of electrical signals is set. Further, charges corresponding to the corresponding electrical signal and the weight are output, and the output charges are appropriately accumulated in a capacitor. Then, a value to be calculated representing the multiply-accumulate result is calculated on the basis of the voltage of the capacitor in which charges are accumulated. As a result, the power consumed by the multiply-accumulate operation can be reduced as compared with processing using a digital system, for example (paragraphs [0003], [0049] to [0053], and of the specification and FIG. 3 of Patent Literature 1, etc.).

CITATION LIST

Patent Literature

Patent Literature 1: WO 2018/034163

DISCLOSURE OF INVENTION

Technical Problem

The use of such a circuit using an analog system is expected to lead to lower power consumption of a neural network or the like, and there is a need for a technology that easily integrates the circuit of the analog system performing a multiply-accumulate operation.

In view of the circumstances as described above, it is an object of the present technology to provide an arithmetic logic unit, a multiply-accumulate operation device, a multiply-accumulate operation circuit, and a multiply-accumulate operation system that are capable of easily integrating the circuit of the analog system performing a multiply-accumulate operation.

Solution to Problem

In order to achieve the above-mentioned object, an arithmetic logic unit according to an embodiment of the present technology includes: a plurality of input lines; and a multiply-accumulate operation device.

Electrical signals are input to the plurality of input lines.

The multiply-accumulate operation device includes a pair of output lines, a plurality of multiplication units including a weight unit that generates, on the basis of the electrical signals input to the plurality of input lines, charges corresponding to multiplication values obtained by multiplying signal values represented by the electrical signals by weight values, a holding unit that holds a binary state, and a switch unit that outputs, on the basis of the held binary state, the charges generated by the weight unit to one of the pair of output lines, an accumulation unit that accumulates the charges output to the pair of output lines by the plurality of multiplication units, and an output unit that outputs, on the basis of the accumulated charges, a multiply-accumulate signal representing a sum of the multiplication values.

In this arithmetic logic unit, electrical signals are input to a plurality of input lines. A plurality of multiplication units of a multiply-accumulate operation device generates charges corresponding to multiplication values obtained by multiplying signal values of the electrical signals by weight values. The generated charges are input to one of a pair of output lines on the basis of a state of a holding unit that holds a binary state. The charges output from each of the plurality of multiplication units are accumulated, and a multiply-accumulate signal is output on the basis of the accumulated charges. Such a configuration of the multiplication unit can be integrated using a technology for producing integrated circuits, or the like, making it possible to easily integrate the circuit of the analog system performing a multiply-accumulate operation.

The weight unit may include a MOS transistor including an input terminal, an output terminal, and a gate terminal for controlling conduction between the input terminal and the output terminal.

As a result, it is possible to easily configure the weight unit by using a technology for producing MOS transistors, or the like, and easily integrate the circuit of the analog system performing a multiply-accumulate operation.

The weight value may be set by a resistance between the input terminal and the output terminal.

As a result, for example, by setting a weight value as appropriate, it is possible to appropriately control the amount of charges corresponding to the multiplication value. As a result, it is possible to appropriately execute a multiply-accumulate operation.

The holding unit may include a first terminal and a second terminal that switch and output, on the basis of the held binary state, two types of voltages so that the voltages differ from each other.

As a result, it is possible to appropriately execute switch control in accordance with the binary state, for example, and appropriately execute a multiply-accumulate operation.

The gate terminal may be connected to the input line. In this case, the input terminal may be connected to one of the first terminal, the second terminal, and a predetermined constant voltage source.

As a result, for example, it is possible to stabilize the potential of the input terminal, and improve the stability of the processing.

The input terminal may be connected to the input line. In this case, the gate terminal may be connected to one of the first terminal, the second terminal, and a predetermined gate voltage source.

As a result, for example, it is possible to separate the line that controls the gate terminal and the line that transmits electrical signals and charges from each other, and suppress the influence of GND noise, and the like.

The weight unit may include a first MOS transistor and a second MOS transistor connected to the same input line. In this case, the switch unit may include the first and second MOS transistors.

As a result, it is possible to suppress the number of necessary MOS transistors, and the like. As a result, it is possible to reduce the device area, and increase the element density.

The pair of output lines may include a first output line and a second output line. In this case, the switch unit may include a first switch element that connects the output terminal and the first output line to each other and a second switch element that connects the output terminal and the second output line to each other.

As a result, it is possible to appropriately switch the connection destination of the output terminal, and appropriately execute a multiply-accumulate operation.

The holding unit may be connected to the input terminal. In this case, the weight unit may output a control signal for controlling the binary state of the holding unit from the input terminal.

As a result, it is possible to suppress the number of necessary MOS transistors, and the like. As a result, it is possible to reduce the device area, and increase the element density.

The weight unit may generate charges corresponding to a multiplication value obtained by multiplying the signal value by an absolute value of the weight value. In this case, the holding unit may hold a binary state corresponding to a sign of the weight value.

As a result, for example, it is possible to easily realize processing of multiplying by the positive and negative weight values, and perform multiplication processing with a simple circuit configuration.

The weight value may be set to one of a first value and a second value having equal absolute values and different signs in the plurality of multiplication units.

As a result, for example, it is possible to implement a binarized weight value whose positive and negative signs are set in accordance with the binary state. As a result, it is possible to perform a multiply-accumulate operation of the binary connection method.

The plurality of input lines may include a pair of a plurality of the input lines, the pair including a first input line and a second input line. In this case, the multiplication unit may include a first weight unit connected to the first input line and a second weight unit connected to the second input line, of the pair of input lines.

As a result, it is possible to perform, for example, weight processing for a two-input electrical signal including a positive signal and a negative signal. As a result, it is possible to execute a multiply-accumulate operation of various methods.

The multiplication unit may include a first switch unit that outputs, on the basis of the held binary state, charges generated by the first weight unit to one of the pair of output lines, and a second switch unit that outputs charges generated by the second weight unit to the other of the pair of output lines.

As a result, it is possible to perform, for example, weight processing for a two-input electrical signal including a positive signal and a negative signal. As a result, it is possible to perform a multiply-accumulate operation of various methods.

The weight unit may include a high-resistance element that controls an amount of charges corresponding to the multiplication value.

As a result, for example, it is possible to control the amount of charges accumulated in the accumulation unit, and calculate a multiply-accumulate result with desired accuracy.

The weight unit may include a MOS transistor that operates in a subthreshold region.

As a result, for example, it is possible to control the amount of charges accumulated in the accumulation unit, and sufficiently suppress the power consumption required for the multiply-accumulate operation, and the like.

The arithmetic logic unit may further include a plurality of the multiply-accumulate operation devices connected in parallel to each of the plurality of input lines.

As a result, for example, it is possible to execute a plurality of multiply-accumulate operations at the same time, and exhibit excellent operation performance.

The plurality of input lines may be wired so as to cross a plurality of pairs of the output lines included in the plurality of multiply-accumulate operation devices.

As a result, it is possible to use a crossbar structure where the input line and the output line cross with each other, and easily integrate the circuit of the analog system performing a multiply-accumulate operation.

The electrical signal may be a signal representing the signal value by timing within an input period or a pulse width. In this case, the multiply-accumulate operation device may include a charging unit that charges the accumulation unit at a constant charging speed in an output period after the input period. Further, the output unit may output the multiply-accumulate signal by performing threshold determination on a potential of the accumulation unit in the output period.

As a result, it is possible to easily detect charges accumulated in the accumulation unit with high accuracy. As a result, it is possible to easily generate a multiply-accumulate signal with high precision.

The charging unit may connect the accumulation unit to the pair of output lines in the input period, and may connect the accumulation unit to a current source in the output period, the current source supplying a current corresponding to the constant charging speed.

As a result, it is possible to appropriately accumulate charges in the input period, appropriately read charges in the output period, and appropriately execute a multiply-accumulate operation.

The charging unit may connect the accumulation unit to a GND before the input period.

As a result, for example, it is possible to initialize the accumulation state by setting charges or the like accumulated in the accumulation unit to zero, and repeatedly execute appropriate arithmetic processing.

A multiply-accumulate operation device according to an embodiment of the present technology includes: a pair of output lines; a plurality of multiplication units; an accumulation unit; and an output unit.

The multiplication unit includes a weight unit that generates, on the basis of the electrical signals input to the plurality of input lines, charges corresponding to multiplication values obtained by multiplying signal values represented by the electrical signals by weight values, a holding unit that holds a binary state, and a switch unit that outputs, on the basis of the held binary state, the charges generated by the weight unit to one of the pair of output lines.

The accumulation unit accumulates the charges output to the pair of output lines by the plurality of multiplication units.

The output unit outputs, on the basis of the accumulated charges, a multiply-accumulate signal representing a sum of the multiplication values.

A multiply-accumulate operation circuit according to an embodiment of the present technology includes: a pair of output lines; a plurality of multiplication units; an accumulation unit; and an output unit.

The multiplication unit includes a weight unit that generates, on the basis of the electrical signals input to the plurality of input lines, charges corresponding to multiplication values obtained by multiplying signal values represented by the electrical signals by weight values, a holding unit that holds a binary state, and a switch unit that outputs, on the basis of the held binary state, the charges generated by the weight unit to one of the pair of output lines.

The accumulation unit accumulates the charges output to the pair of output lines by the plurality of multiplication units.

The output unit outputs, on the basis of the accumulated charges, a multiply-accumulate signal representing a sum of the multiplication values.

A multiply-accumulate operation system according to an embodiment of the present technology includes: a plurality of input lines; a plurality of analog circuits; and a network circuit.

Electrical signals are input to the plurality of input lines.

The plurality of analog circuits includes a pair of output lines, a plurality of multiplication units including a weight unit that generates, on the basis of the electrical signals input to the plurality of input lines, charges corresponding to multiplication values obtained by multiplying signal values represented by the electrical signals by weight values, a holding unit that holds a binary state, and a switch unit that outputs, on the basis of the held binary state, the charges generated by the weight unit to one of the pair of output lines, an accumulation unit that accumulates the charges output to the pair of output lines by the plurality of multiplication units, and an output unit that outputs, on the basis of the accumulated charges, a multiply-accumulate signal representing a sum of the multiplication values.

The network circuit is configured by connecting the plurality of analog circuits.

Advantageous Effects of Invention

As described above, in accordance with the present technology, it is possible to easily integrate the circuit of the analog system performing a multiply-accumulate operation. It should be noted that the effects described here are not necessarily limitative, and any of the effects described in the present disclosure may be provided.

MODE(S) FOR CARRYING OUT THE INVENTION

First Embodiment

[Configuration of Arithmetic Logic Unit]

Figure 1:
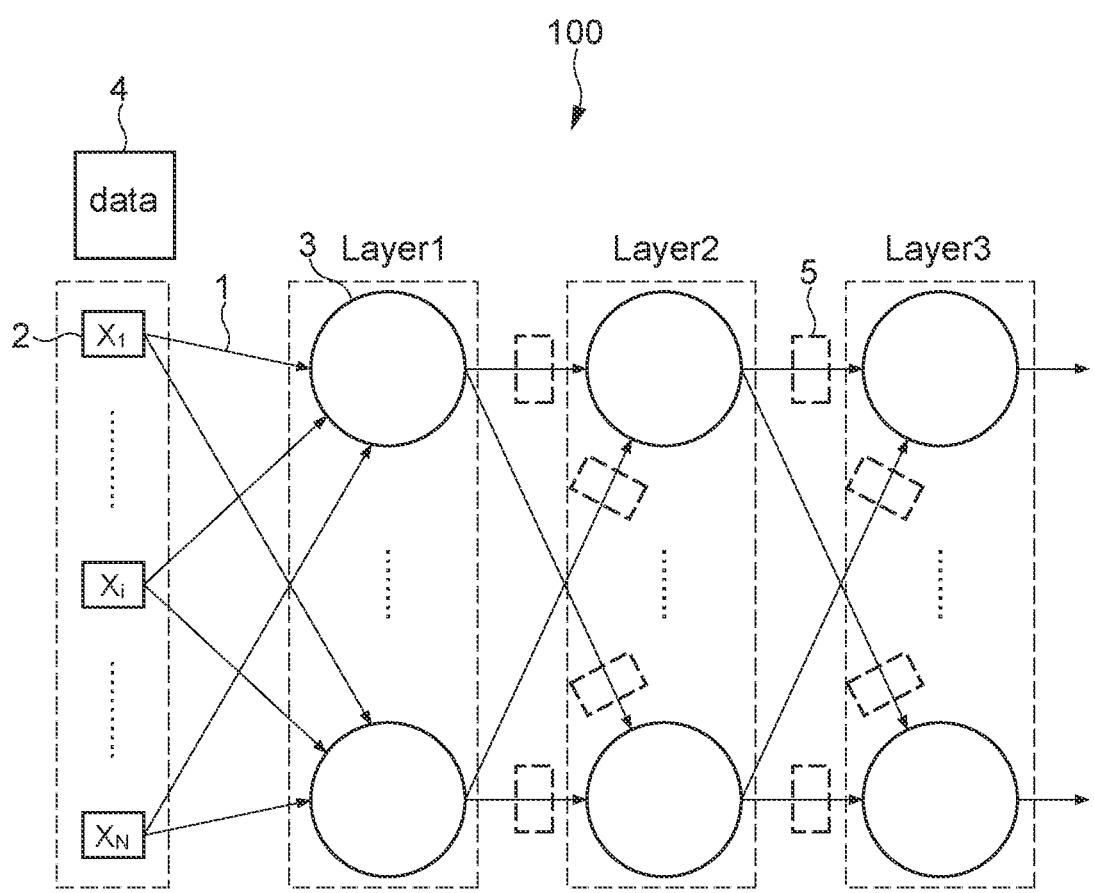
FIG. 1 is a schematic diagram showing a configuration example of an arithmetic logic unit according to a first embodiment of the present technology.

FIG. 1 is a schematic diagram showing a configuration example of an arithmetic logic unit according to a first embodiment of the present technology. An arithmetic logic unit 100 is an arithmetic logic unit using an analog system, which executes predetermined arithmetic processing including a multiply-accumulate operation. By using the arithmetic logic unit 100, for example, it is possible to execute arithmetic processing according to a mathematical model such as a neural network.

The arithmetic logic unit 100 includes a plurality of signal lines 1, a plurality of input units 2, and a plurality of analog circuits 3. Each of the signal lines 1 is a line that transmits an electrical signal of a predetermined method. As the electrical signal, for example, an analog signal representing a signal value using an analog amount such as the timing and width of the pulse is used. The method of the electrical signal will be described in detail below. The directions in which electrical signals are transmitted are schematically illustrated in FIG. 1 by means of arrows. In this embodiment, the analog circuit 3 corresponds to the multiply-accumulate operation device.

For example, the plurality of signal lines 1 is connected to one analog circuit 3. The signal line 1 that transmits an electrical signal to the analog circuit 3 is an input signal line to which an electrical signal is input for the analog circuit 3 to which the signal line 1 is connected. Further, the signal line 1 that transmits an electrical signal output from the analog circuit 3 is an output signal line from which an electrical signal is output for the analog circuit 3 to which the signal line 1 is connected. In this embodiment, the input signal line corresponds to the input line.

Each of the plurality of input units 2 generates a plurality of electrical signals corresponding to input data 4. The input data 4 is, for example, data to be processed using a neural network or the like implemented by the arithmetic logic unit 100. Therefore, it can also be said that the respective signal values of the plurality of electrical signals according to the input data 4 are input values to the arithmetic logic unit 100.

As the input data 4, for example, arbitrary data such as image data, audio data, and statistical data to be processed by the arithmetic logic unit 100 is used. For example, in the case where image data is used as the input data 4, an electrical signal having a signal value corresponding to the pixel value (RGB value, luminance value, etc.) of each of the pixels of the image data is generated. In addition, an electrical signal corresponding to the input data 4 may be appropriately generated in accordance with the type of the input data 4 and the content of the processing by the arithmetic logic unit 100.

The analog circuit 3 is a circuit using an analog system, which performs a multiply-accumulate operation on the basis of the input electrical signal. The multiply-accumulate operation is, for example, an operation of adding a plurality of multiplication values obtained by multiplying a plurality of input values by weight values corresponding to the input values. Therefore, it can also be said that the multiply-accumulate operation is processing of calculating the sum (hereinafter, referred to as the multiply-accumulate result) of the respective multiplication values.

As shown in FIG. 1, a plurality of input signal lines is connected to one analog circuit 3, and a plurality of electrical signals is provided thereto. The plurality of input signal lines and the analog circuit constitute the multiply-accumulate operation circuit according to this embodiment. Further, a plurality of electrical signals is input from each of the input signal lines, and thus, the multiply-accumulate operation method according to this embodiment is executed by the multiply-accumulate operation circuit (the analog circuit 3).

In the following, assumption is made that the total number of electrical signals input to one analog circuit 3 is N. Note that the number N of the electrical signals to be input to each of the analog circuits 3 is appropriately set for each of the circuits in accordance with, for example, the model, accuracy, and the like of arithmetic processing.

In the analog circuit 3, for example, $w_i \cdot x_i$, which is a multiplication value obtained by multiplying a signal value $x_i$ represented by the electrical signal input from the i-th input signal line and a weight value $w_i$ corresponding to the signal value $x_i$ is calculated. Here, i is a natural number equal to or less than N (i=1, 2, . . . , N). The operation of the multiplication value is executed for each electrical signal (input signal line) and N multiplication values are calculated. The sum of the N multiplication values is calculated as a multiply-accumulate result (sum of the N multiplication values). Therefore, the multiply-accumulate result calculated by one analog circuit 3 is expressed by the following formula.

$$\sum_{i=1}^{N} w_i \cdot x_i \qquad \text{[Math. 1]}$$

The weight value $w_i$ is set in the range of, for example, $-\alpha \leq w_i \leq +\alpha$. Here, $\alpha$ represents an arbitrary real value. Therefore, the weight value $w_i$ includes a positive weight value $w_i$, a negative weight value $w_i$, the weight value $w_i$ that is zero, or the like. As described above, by setting the weight value $w_i$ to be within a predetermined range, it is possible to avoid the situation in which the multiply-accumulate result is divergent.

Further, for example, the range in which the weight value $w_i$ is set may be normalized. In this case, the weight value $w_i$ is set within the range of $-1 \leq w_i \leq 1$. As a result, for example, the maximum value, the minimum value, and the like of the multiply-accumulate result can be adjusted, and a multiply-accumulate operation can be executed with desired accuracy.

In a neural network or the like, a method called binary connection, which sets the weight value $w_i$ to either $+\alpha$ or $-\alpha$, can be used. The binary connection is used in various fields, such as image recognition using a deep neural network (multi-layer neural network). It is possible to simplify the setting of the weight value $w_i$ without deteriorating the recognition accuracy or the like by using the binary connection.

As described above, in the binary connection, the weight value $w_i$ is binarized to binary values ($\pm\alpha$). Therefore, for example, by switching the positive and negative of the weight value $w_i$, it is possible to easily set a desired weight value $w_i$. Further, the binarized weight value $w_i$ may be normalized to set the weight value $w_i$ to $\pm 1$. In addition, the setting range, value, and the like of the weight value $w_i$ are not limited, and may be appropriately set so that, for example, desired processing accuracy is realized.

The signal value $x_i$ is, for example, an electrical signal output from the input unit 2 or a multiply-accumulate result output from the analog circuit 3. Thus, it can be said that the input unit 2 and the analog circuit 3 function as a signal source that outputs the signal value $x_i$.

In the example shown in FIG. 1, a single electrical signal (single signal value $x_i$) is output from one signal source (the input unit 2, the analog circuit 3). Therefore, the same electrical signal is input to the plurality of signal lines 1 connected to the output side of the one signal source. Further, one signal source and the analog circuit 3 to which the electrical signal output from the signal source is input are connected to each other by a single input signal line.

Therefore, for example, M input signal lines are connected to the analog circuit 3 connected to M signal sources in the arithmetic logic unit 100 shown in FIG. 1. In this case, the total number N of the electrical signals input to the analog circuits 3 is M. Note that a pair of positive and negative electrical signals (a pair of signal values $x_i^+$ and $x_i^-$) may be output from one signal source (see FIG. 12 and the like).

As shown in FIG. 1, the arithmetic logic unit 100 has a hierarchical structure in which the plurality of analog circuits 3 is provided in each of a plurality of layers. By configuring the layer structure of the analog circuits 3, for example, a multi-layer perceptron type neural network or the like is constructed. The number of the analog circuits provided in each layer, the number of layers, and the like are appropriately designed so that, for example, desired processing can be executed. In the following, the number of the analog circuits 3 provided in the layer of the j-th stage will be referred to as $N_j$ in some cases.

For example, N electrical signals generated by N input units 2 are input to each of the analog circuits 3 provided in the layer of the first stage (the lowest layer). Each of the analog circuits 3 in the first stage calculates the multiply-accumulate result relating to the signal value $x_i$ of the input data, and the calculated multiply-accumulate result is subjected to non-linear transformation processing and then output to the analog circuits 3 provided in the next layer (second stage).

$N_1$ electrical signals representing the multiply-accumulate results calculated in the first stage are input to the respective analog circuits 3 provided in the second layer (upper layer). Therefore, the non-linear transformation processing result of each of the multiply-accumulate results calculated in the first stage when viewed from each of the analog circuits 3 in the second stage is the signal value $x_i$ of the electrical signal. The multiply-accumulate result relating to the signal value $x_i$ output from the first stage is calculated by the analog circuit 3 in the second stage, and output to the analog circuit 3 in the upper layer.

In this way, in the arithmetic logic unit 100, the multiply-accumulate result of the analog circuit 3 in the upper layer is calculated on the basis of the multiply-accumulate result calculated by the analog circuit 3 in the lower layer. Such processing is executed a plurality of times, and the processing result is output from the analog circuit 3 included in the top layer (the layer of the third stage in FIG. 1). As a result, for example, processing such as image recognition of determining that the object is a cat on the basis of image data (the input data 4) obtained by imaging the cat can be performed.

As described above, a desired network circuit can be formed by appropriately connecting the plurality of analog circuits 3. The network circuit functions as a data flow processing system for performing arithmetic processing by, for example, passing a signal. In the network circuit, various processing functions can be realized by appropriately setting, for example, a weight value (synaptic connection). With this network circuit, the multiply-accumulate operation system according to this embodiment is constructed.

Note that the method of connecting the analog circuits 3 to each other, and the like are not limited, and, for example, the plurality of analog circuits 3 may be appropriately connected to each other so that desired processing can be performed. For example, the present technology is applicable even in the case where the analog circuits 3 are connected to each other so as to constitute another structure different from the hierarchical structure.

In the above description, the configuration in which a multiply-accumulate result calculated in the lower layer is input to the upper layer as it is has been described. The present invention is not limited thereto. For example, conversion processing or the like may be performed on the multiply-accumulate result. For example, in the neural network model, processing such as performing non-linear conversion on the multiply-accumulate result of each of the analog circuits 3 using an activation function, and inputting the conversion result to the upper layer is performed.

In the arithmetic logic unit 100, for example, a function circuit 5 that performs non-linear transformation by an activation function on the electrical signal is used. The function circuit 5 is, for example, a circuit that is provided between a lower layer and an upper layer, appropriately converts a signal value of an electrical signal to be input, and outputs an electrical signal according to a result of the conversion. The function circuit 5 is provided for each of the signal lines 1, for example. The number, arrangement, and the like of the function circuits 5 are appropriately set in accordance with, for example, the mathematical model implemented in the arithmetic logic unit 100.

As the activation function, for example, a ReLU function (ramp function) or the like is used. In the ReLU function, the signal value $x_i$ is output as it is in the case where, for example, the signal value $x_i$ is 0 or more, and 0 is output in other cases. For example, the function circuit 5 that implements a ReLU function is connected to each of the signal lines 1 as appropriate. As a result, it is possible to realize the processing of the arithmetic logic unit 100.

Figure 2:
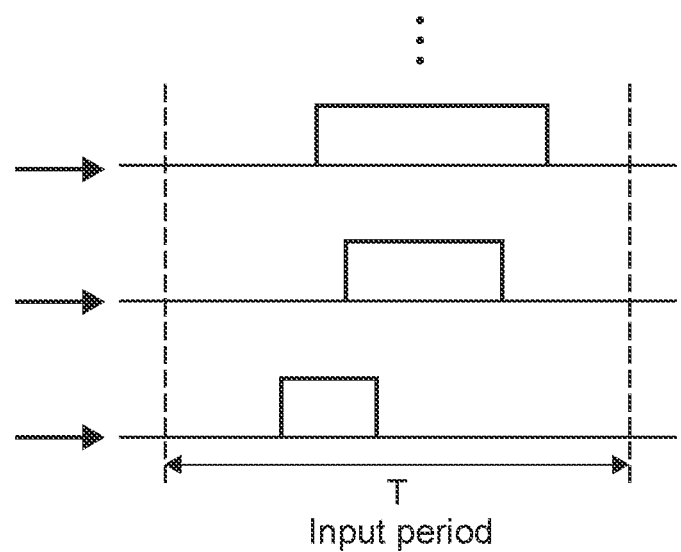
FIG. 2 is a schematic diagram showing an example of an electrical signal input to an analog circuit.

FIG. 2 is a schematic diagram showing an example of the electrical signal input to the analog circuit 3. FIG. 2 schematically illustrates a graph representing waveforms of a plurality of electrical signals input to one analog circuit 3. The horizontal axis of the graph represents the time axis, and the vertical axis represents the voltage of the electrical signal. Note that the time axis of each graph is common.

In this embodiment, an electrical signal using a pulse width modulation (PWM) system is used. The PWM system is, for example, a method of representing the signal value $x_i$ using a pulse width $\tau_i$ of a pulse waveform. That is, in the PWM system, the pulse width $\tau_i$ of the electrical signal is a length corresponding to the signal value $x_i$. Typically, the longer pulse width $\tau_i$ represents the larger signal value $x_i$.

Further, the electrical signal is input to the analog circuit 3 during a predetermined input period T. More specifically, the respective electrical signals are input to the analog circuits 3 so that the pulse waveforms of the electrical signals fall within the input period T. Therefore, the maximum value of the pulse width of the electrical signal is similar to the input period T. Note that the timing at which the respective pulse waveforms (electrical signals) are input, and the like are not limited as long as the pulse waveforms fall within the input period T.

In the PWM system, for example, a duty ratio $R_i$ ($=\tau_i/T$) of the pulse width $\tau_i$ to the input period T can be used to normalize the signal value $x_i$. That is, the normalized signal value $x_i$ is represented as the signal value $x_i=R_i$. Note that the method of associating the pulse width $\tau_i$ and the signal value $x_i$ with each other is not limited. For example, the pulse width $\tau_i$ representing the signal value $x_i$ may be appropriately set so that arithmetic processing or the like can be performed with desired accuracy. In the following, description will be made assuming that the signal value $x_i$ represented by each electrical signal is a variable of 0 or more and 1 or less.

Figure 3:
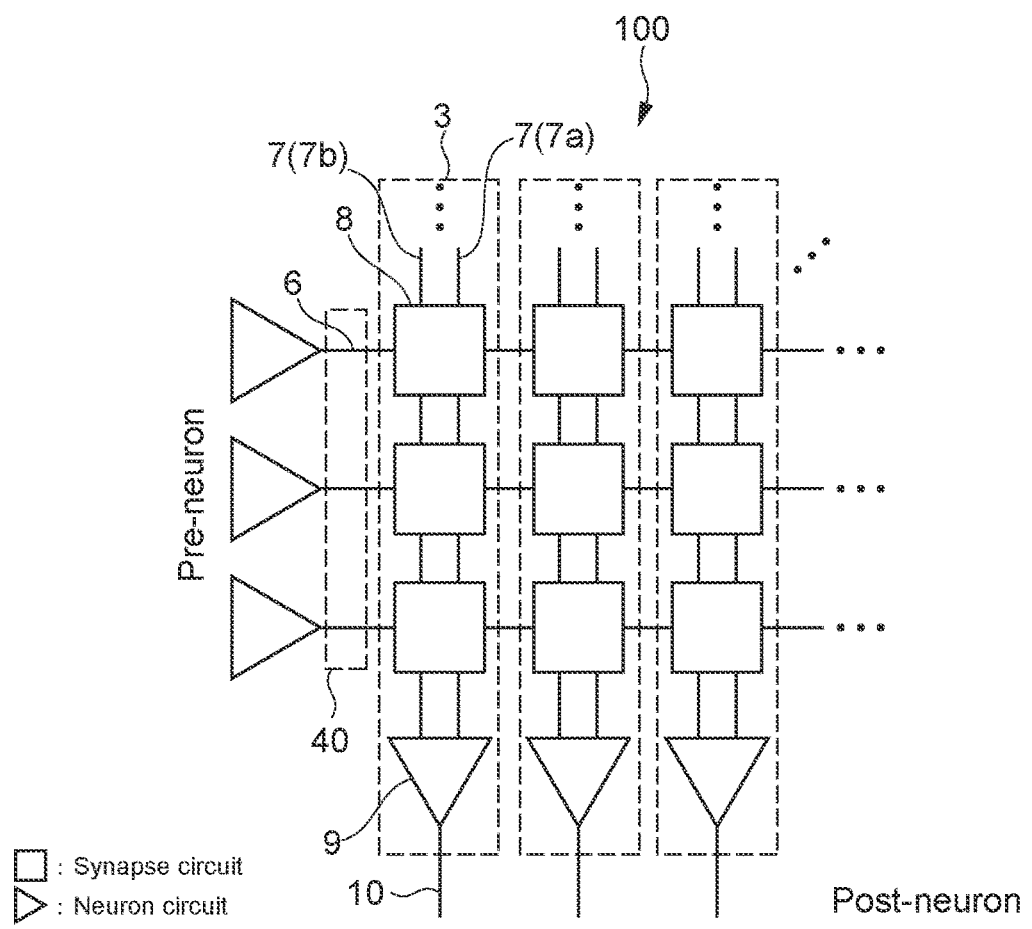
FIG. 3 is a schematic diagram showing a specific configuration example of an arithmetic logic unit.

FIG. 3 is a schematic diagram showing a specific configuration example of the arithmetic logic unit 100. FIG. 3 is an arrangement example of circuits for realizing the arithmetic logic unit 100 shown in FIG. 1, for example, and schematically illustrates the plurality of analog circuits 3 provided in one layer of the arithmetic logic unit 100.

The analog circuits 3 each include a pair of output lines 7, a plurality of synapse circuits 8, and a neuron circuit 9. As shown in FIG. 3, one analog circuit 3 is configured to extend in a predetermined direction (longitudinal direction in the figure). The analog circuits 3 extending in the longitudinal direction are arranged side by side in the lateral direction, thereby forming one layer. Hereinafter, the analog circuit 3 disposed on the leftmost side in the figure will be referred to as the first analog circuit 3. Further, the direction in which the analog circuits 3 extend is referred to as the extension direction in some cases.

The pair of output lines 7 are spaced apart from each other along the extension direction. The pair of output lines 7 include a positive output line 7a and a negative output line 7b. Each of the output lines 7a and 7b is connected to the neuron circuit 9 via the plurality of synapse circuits 8. The positive output line 7a corresponds to the first output line, and the negative output line 7b corresponds to the second output line.

The synapse circuit 8 calculates the multiplication value ($w_i \cdot x_i$) of the signal value $x_i$ represented by the electrical signal and the weight value $w_i$. Specifically, charges (current) corresponding to the multiplication value are output to either the output line 7a or 7b.

As will be described below, either a positive weight value $w_i^+$ or a negative weight value $w_i^-$ is set for the synapse circuit 8. For example, charges corresponding to the multiplication value with the positive weight value $w_i^+$ are output to the positive output line 7a. Further, charges corresponding to the multiplication value with the negative weight value $w_i^-$ are output to the negative output line 7a. Note that in the synapse circuit 8, charges of the same sign (e.g., positive charges) are output regardless of the positive and negative of the weight value $w_i$ as charges corresponding to the multiplication value.

As described above, the synapse circuit 8 is configured to output the multiplication result (charges) to the different output line 7 in accordance with the sign of the weight value $w_i$. A specific configuration of the synapse circuit 8 will be described below in detail. In this embodiment, the synapse circuit 8 corresponds to the multiplication unit.

In this embodiment, a single input signal line 6 and the pair of output lines 7 are connected to one synapse circuit 8. That is, a single electrical signal is input to one synapse circuit 8, and charges corresponding to the multiplication value calculated on the basis of the input electrical signal are output to one of the output lines 7. Thus, the synapse circuit 8 is a one-input two-output circuit connected to the single input signal line 6 and the pair of output lines 7a and 7b.

In one analog circuit 3, the plurality of synapse circuits 8 is arranged along the pair of output lines 7. Each of the synapse circuits 8 is connected in parallel to the output line 7a (the output line 7b). Hereinafter, the synapse circuit 8 disposed on the most downstream side of the output line 7 (the side connected to the neuron circuit 9) will be referred to as the first synapse circuit.

As shown in FIG. 3, the plurality of input signal lines 6 is arranged so as to cross the plurality of pairs of the output lines 7 of the plurality of analog circuits 3. Typically, the input signal line 6 is disposed perpendicular to the respective output lines 7. That is, the arithmetic logic unit 100 has a crossbar configuration in which the input signal line 6 and the output line 7 cross each other. By using the crossbar configuration, for example, the analog circuits 3 or the like can be integrated at high density.

Further, in the arithmetic logic unit 100, the j-th synapse circuit 8 included in each of the analog circuits 3 is connected in parallel to the j-th input signal line 6. Therefore, similar electrical signals are input to the synapse circuits 8 connected to the same input signal line 6. As a result, a configuration in which one signal source included in the lower layer is connected to the plurality of analog circuits 3 included in the upper layer can be implemented (see FIG. 1).

Note that in the example shown in FIG. 3, the analog circuits 3 (pre-neuron) included in the lower layer are schematically illustrated as a signal source that inputs an electrical signal to each of the input signal lines 6. The present technology is not limited thereto, and, for example, a crossbar configuration can be used even in the case where the input unit 2 is used as the signal source.

As described above, in the arithmetic logic unit 100, the plurality of analog circuits 3 is connected in parallel to each of the plurality of input signal lines 6. As a result, for example, it is possible to input an electrical signal in parallel to each of the analog circuits 3 (each of the synapse circuits 8), and speed up the arithmetic processing. As a result, it is possible to exhibit excellent operation performance.

The neuron circuit 9 calculates the multiply-accumulate result shown in the formula (Math. 1) on the basis of the multiplication value calculated by each of the synapse circuits 8. Specifically, an electrical signal (multiply-accumulate signal) representing the multiply-accumulate result is output on the basis of charges input via the pair of output lines 7.

Figure 4:
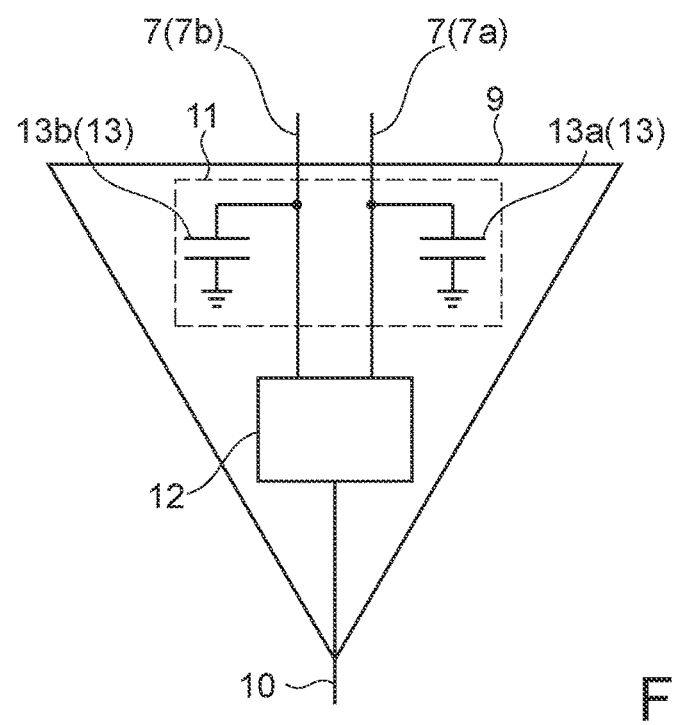
FIG. 4 is a schematic diagram showing a configuration example of a neuron circuit.

FIG. 4 is a schematic diagram showing a configuration example of the neuron circuit 9. The neuron circuit 9 includes an accumulation unit 11 and an output unit 12. FIG. 4 shows the two-input one-output neuron circuit 9 connected to the pair of output lines 7 and a single output signal line 10. Note that a two-input two-output circuit or the like can be used as the neuron circuit 9 in some cases (see FIG. 15).

The accumulation unit 11 accumulates the charges output to the pair of output lines 7 by the plurality of synapse circuits 8. The accumulation unit 11 includes two capacitors 13a and 13b. The capacitor 13a is connected between the positive output line 7a and a GND. Further, the capacitor 13b is connected between the negative output line 7b and a GND. Therefore, charges flowing in from the output lines 7a and 7b are respectively accumulated in the capacitors 13a and 13b.

For example, when the input period T of the electrical signal has elapsed, charges accumulated in the capacitor 13a are the total sum $\sigma^+$ of charges corresponding to multiplication values with the positive weight value $w_i^+$. Further, similarly, charges accumulated in the capacitor 13b are the total sum $\sigma^-$ of charges corresponding to multiplication values with the negative weight value $w_i^-$.

For example, when charges are accumulated in the capacitor 13a, the potential of the positive output line 7a with reference to the GND increases. Therefore, the potential of the positive output line 7a has a value corresponding to the total sum $\sigma^+$ of charges corresponding to multiplication values with the positive weight value $w_i^+$. Similarly, the potential of the negative output line 7b has a value corresponding to the total sum $\sigma^-$ of charges corresponding to multiplication values with the negative weight value $w_i^-$.

The output unit 12 outputs a multiply-accumulate signal representing the sum of the multiplication value ($w_i \cdot x_i$) on the basis of charges accumulated in the accumulation unit 11. The multiply-accumulate signal is, for example, a signal representing the entire multiply-accumulate result, which is the sum of multiplication values of all the positive and negative weight values $w_i$ and the signal value $x_i$. For example, the multiply-accumulate result represented by (Math. 1) can be written as follows.

$$\sum_{i=1}^{N} w_i x_i = \sum_{i=1}^{N^+} w_i^+ x_i - \sum_{i=1}^{N^-} |w_i^-| x_i \qquad [\text{Math. 2}]$$

Here, $N^+$ and $N^-$ are respectively the total number of the positive weight values $w_i^+$ and the total number of the negative weight values $w_i^-$. As shown in (Math. 2), the entire multiply-accumulate result can be expressed as the difference between the positive multiply-accumulate result, which is the total sum of multiplication values $(w_i^+ \cdot x_i)$ with the positive weight value $w_i^+$, and the negative multiply-accumulate result, which is the total sum of multiplication values $(|w_i^-| \cdot x_i)$ with the negative weight value $w_i^-$.

In the example shown in FIG. 4, the output unit 12 generates, for example, one signal representing the entire multiply-accumulate result as a multiply-accumulate signal. Specifically, by referring to charges accumulated in the accumulation unit 11 (the capacitors 13*a* and 13*b*) as appropriate, a positive multiply-accumulate result and a negative multiply-accumulate result are calculated, and the entire multiply-accumulate result is calculated from the difference therebetween. Further, for example, two signals of a positive multiply-accumulate signal and a negative multiply-accumulate signal respectively representing the positive and negative multiply-accumulate results may be generated as the multiply-accumulate signal.

The method of referring to the charges accumulated in the accumulation unit 11 is not limited. As an example, a method of detecting charges accumulated in one capacitor 13 will be described. In the case where a PWM electrical signal is used, charges corresponding to the multiplication value is accumulated in the capacitor 13 during the input period T. That is, before and after the input period T, the accumulation of charges corresponding to the multiplication value does not occur.

For example, the capacitor 13 is charged at a predetermined charging speed after the input period T. At this time, a comparator or the like is used to detect the timing when the potential of the output line 7 to which the capacitor 13 is connected reaches a predetermined threshold potential. For example, the more charges at the time of starting charging, the earlier the timing when the potential reaches the threshold potential. The charges (multiply-accumulate results) accumulated during the input period T can be represented on the basis of the timing.

As described above, by charging the accumulation unit 11 (the capacitors 13*a* and 13*b*) after the input period T, the timing representing the multiply-accumulate result is detected. The positive multiply-accumulate signal, the negative multiply-accumulate signal, or the entire multiply-accumulate signal is appropriately generated on the basis of the detection result. In addition, for example, the potential of the capacitor 13 can be directly read to calculate the multiply-accumulate results after the input period T.

Figure 5:
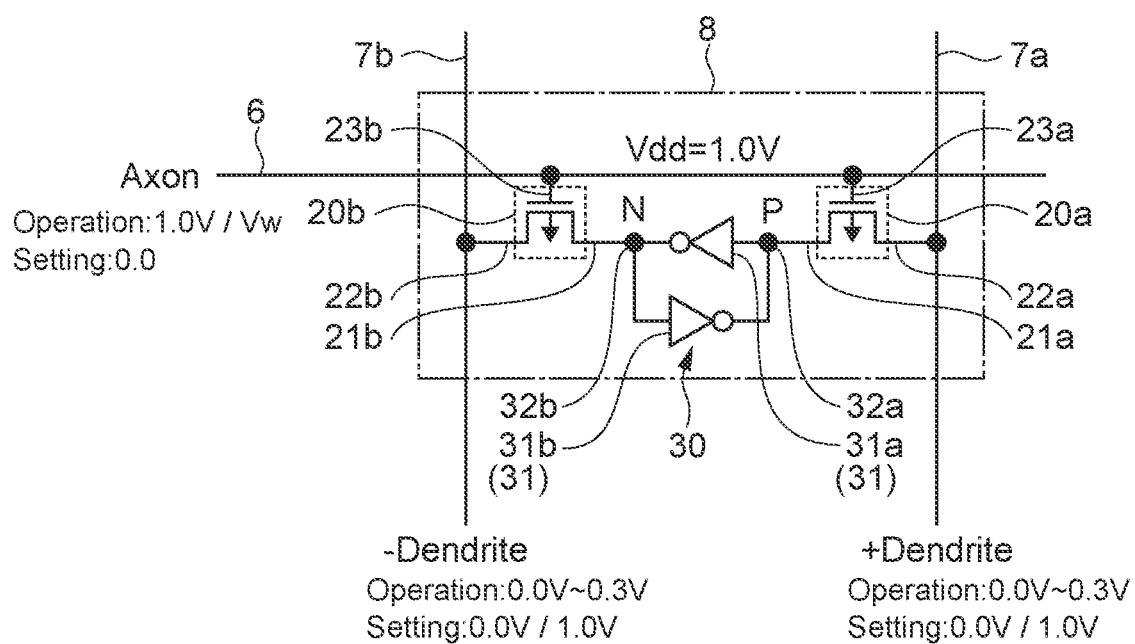
FIG. 5 is a circuit diagram showing a configuration example of a synapse circuit.

FIG. 5 is a circuit diagram showing a configuration example of the synapse circuit 8. Hereinafter, in the crossbar configuration shown in FIG. 3, using the terminology of neuroscience, the input signal line 6 to which an electrical signal is applied from a circuit of the preceding stage will be referred to as the Axon line 6 by using the same reference symbol, and the output line 7 that outputs charges to a circuit of the subsequent stage will be referred to as the Dendrite line 7 using the same reference symbol. Note that the positive output line 7*a* will be referred to as the +Dendrite line 7*a*, and the negative output line 7*b* will be referred to as the −Dendrite line 7*b*.

The synapse circuit 8 includes a first MOS transistor 20*a*, a second MOS transistor 20*b*, and a flip-flop circuit 30. Further, the Axon line 6, the +Dendrite line 7*a*, and the −Dendrite line 7*b* are connected to the synapse circuit 8.

The first MOS transistor 20*a* is a P-type MOS (Metal Oxide Semiconductor) transistor, and includes an input terminal 21*a*, an output terminal 22*a*, and a gate terminal 23*a*. The input terminal 21*a* is connected to a first terminal 32*a* of the flip-flop circuit 30 described below. The output terminal 22*a* is connected to the +Dendrite line 7*a*. The gate terminal 23*a* is connected to the Axon line 6.

The gate terminal 23*a* is a terminal for controlling conduction between the input terminal 21*a* and the output terminal 22*a*. For example, by controlling the voltage applied to the gate terminal 23*a*, the presence or absence of conduction (connection/disconnection, etc.) between the input terminal 21*a* and the output terminal 22*a*, and the resistance value can be controlled.

The second MOS transistor 20*b* is a P-type MOS transistor, and includes an input terminal 21*b*, an output terminal 22*b*, and a gate terminal 23*b*. The input terminal 21*b* is connected to a second terminal 32*b* of the flip-flop circuit 30 described below. The output terminal 22*b* is connected to the −Dendrite line 7*b*. The gate terminal 23*b* is connected to the Axon line 6.

As the first MOS transistor 20*a* and the second MOS transistor 20*b*, for example, similar p-MOS transistors prepared on the basis of the same design parameters (gate width, gate length, etc.) are used. In this embodiment, the first MOS transistor 20*a* and the second MOS transistor 20*b* correspond to the weight unit.

In this embodiment, the first MOS transistor 20*a* and the second MOS transistor 20*b* are each a p-MOS transistor that operates in a subthreshold region. That is, each of the MOS transistors 20*a* and 20*b* is used while a gate voltage lower than or equal to a threshold voltage Vth is applied to the gate terminal. By setting the gate voltage to be equal to or lower than the threshold voltage Vth, for example, a resistance R between the input terminal and the output terminal can be set sufficiently high. Further, the rectifying function by the MOS transistor can also be realized. As a result, for example, it is possible to reduce the current flowing from the input terminal to the output terminal, and significantly reduce the power consumption.

The flip-flop circuit 30 is a circuit that holds the binary state. Here, the binary state is, for example, a state represented by two values that differ from each other. Typically, either a 0 state or a 1 state is held. Further, the held state can be rewritten from 0 to 1 or from 1 to 0. In this embodiment, the flip-flop circuit 30 corresponds to the holding unit.

The flip-flop circuit 30 includes a first inverter 31*a*, a second inverter 31*b*, the first terminal 32*a*, and the second terminal 32*b*.

One inverter 31 is, for example, a circuit configured by using a p-MOS and an n-MOS, and is an element that inverses the input and outputs the inversed input. As shown in FIG. 5, the output of the first inverter 31*a* is input to the second inverter 31*b*. Further, the output of the second inverter 31*b* is input to the first inverter 31*a*. A power supply voltage line to which a power supply voltage Vdd (e.g., 1.0 V) is applied and a GND are connected to the respective inverters 31 (both are not shown). Note that the power supply voltage line is provided for each of the inverters 31.

The first terminal 32a is a terminal connected to the input side of the first inverter 31a (the output side of the second inverter 31b). The second terminal 32b is a terminal connected to the output side of the first inverter 31a (the input side of the second inverter 31b).

In the flip-flop circuit 30, for example, a state (1 state) in which a voltage P of the first terminal 32a is Vdd and a voltage N of the second terminal 32b is 0 is held. Further, a state (0 state) in which the voltage P of the first terminal 32a is 0 and the voltage N of the second terminal 32b is Vdd is held. That is, (P, N)=(Vdd, 0) in the 1 state, and (P, N)=(0, Vdd) in the 0 state.

As described above, the first terminal 32a and the second terminal 32b switch and output, on the basis of the binary state held in the flip-flop circuit 30, the two types of voltages so that the voltages differ from each other. The voltage of the first terminal 32a is applied to the input terminal 21a of the first MOS transistor 20a, and the voltage of the second terminal 32b is applied to the input terminal 21b of the second MOS transistor 20b.

The synapse circuit 8 shown in FIG. 5 is configured by using six MOS transistors including a p-MOS and an n-MOS. Further, five wires (the Axon line 6, the ±Dendrite lines 7a and 7b, and two power supply voltage lines) are connected to the synapse circuit 8. With such a circuit configuration, it is possible to sufficiently reduce the parasitic capacitance of the Axon line 6 and the ±Dendrite lines 7a and 7b, and the like. As a result, it is possible to suppress the capacity to be charged and discharged in one operation, and significantly suppress the power consumption.

Note that in the circuit diagram shown in FIG. 5, for the Axon line 6 and the ±Dendrite lines 7a and 7b, an example of the voltage applied at the weight setting for each line (referred to as Setting in the figure), and an example of the voltage applied at the time of a multiply-accumulate operation (referred to as Operation in the figure) are shown. The present technology is not limited thereto. The voltage applied to each line may be appropriately set depending on the configuration of the circuit so that the weight setting and the multiply-accumulate operation can be appropriately executed.

Figure 6:
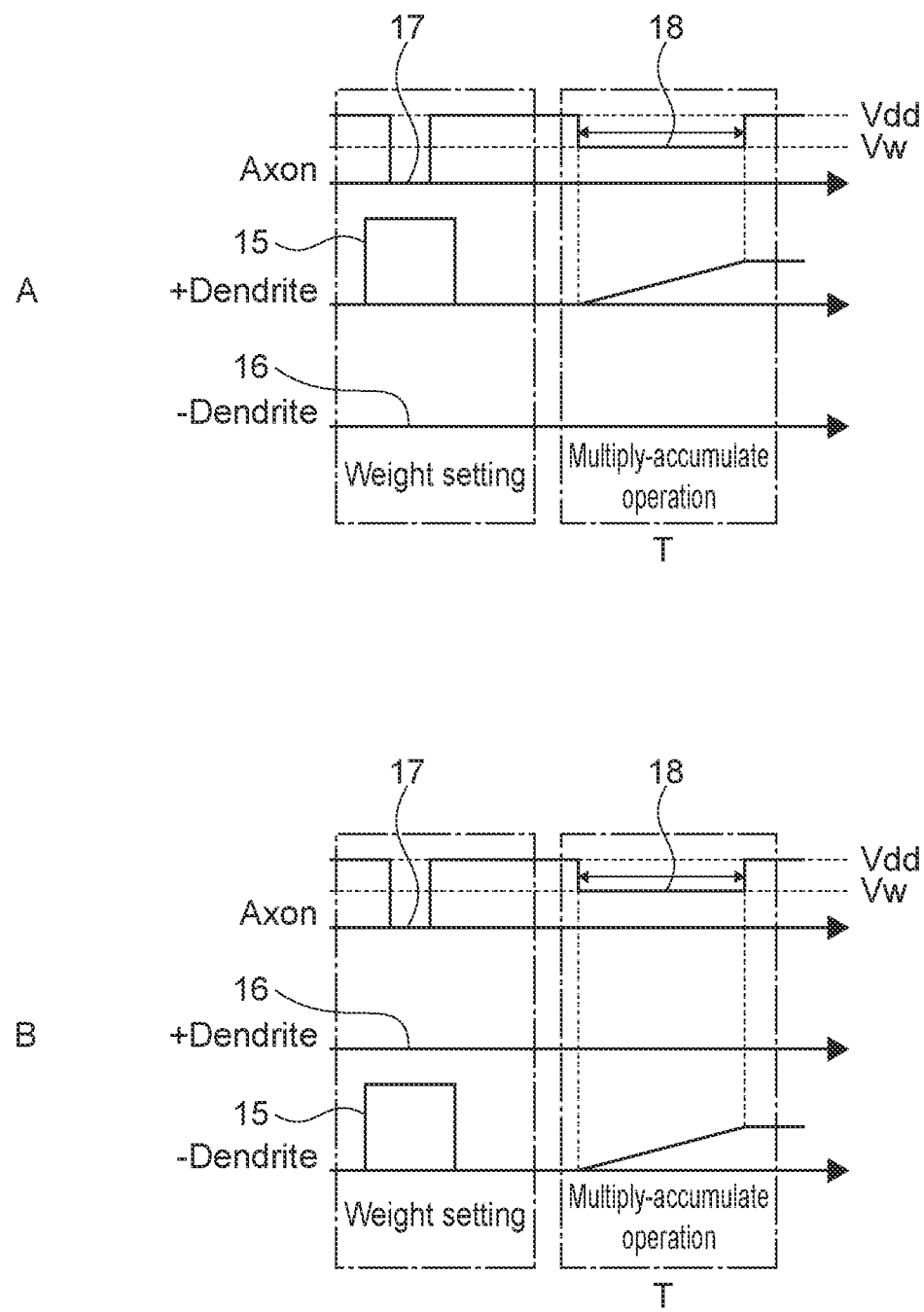
FIG. 6 is a timing chart showing an example of an operation of the synapse circuit.

FIG. 6 is a timing chart showing an example of an operation of the synapse circuit 8. Part A of FIG. 6 is a timing chart in the case where the positive weight value $w_i^+$ is set. Part B of FIG. 6 is a timing chart in the case where the negative weight value $w_i^-$ is set. Part A of FIG. 6 and Part B of FIG. 6 schematically show waveforms of signals applied to the Axon line 6, the +Dendrite line 7a, and the −Dendrite line 7b in order from the top.

In this embodiment, for one synapse circuit 8, either +α or −α is set as the weight value $w_i$. Here, a is a positive real number. Further, the weight value $w_i$ is set for another synapse circuit 8, similarly. That is, in the plurality of synapse circuits 8, the weight value $w_i$ is set to either the first value (+α) and the second value (−α) having equal absolute values and different signs.

Note that in the plurality of analog circuits 3 included in one layer, weight values ±α are set for each of the synapse circuits 8. In this case, each of the analog circuits 3 is capable of outputting a signal (multiply-accumulate signal) representing a multiply-accumulate result on a common scale. Here, the scale of the signal is, for example, a ratio of a pulse width or the like when representing the signal value.

As a result, it is possible to easily realize the transmission of data (multiply-accumulate result) to the next layer or the like.

Thus, by binarizing the weight value $w_i$ to ±α and setting the binarized weight values ±α, a multiply-accumulate operation of the binary connection method is realized. As a result, it is possible to simplify the circuit configuration and the like, and easily integrate the arithmetic logic unit 100.

Further, in this embodiment, the flip-flop circuit 30 holds the binary state corresponding to the sign of the weight value $w_i$. That is, the binary state (the 1 state and the 0 state) of the flip-flop circuit 30 represents the positive and negative of the weight value $w_i$. In this embodiment, the 1 state (state in which P is Vdd) corresponds to the positive weight value $w_i$, and the 0 state (state in which P is Vdd) corresponds to the negative weight value $w_i$.

Therefore, in the case where +α is set for one synapse circuit 8, the flip-flop circuit 30 is set to the 1 state. Further, in the case where −α is set, the flip-flop circuit 30 is set to the 0 state. The weight values ±α are set in advance for the analog circuit 3 (each of the synapse circuits 8) before a multiply-accumulate operation is performed, for example.

The weight value set for each of the synapse circuits 8 is calculated by simulating processing implemented in the arithmetic logic unit 100, for example. For example, a neural network model of a binary connection method including nodes (the analog circuits 3) and synapses (the synapse circuits 8) used in the arithmetic logic unit 100 is virtually constructed. In accordance with this virtual model, the weight value set for each of the synapse circuits 8 is calculated. In addition, the method of calculating the weight value is not limited.

In the case where the positive weight value $w_i^+=+α$ is set as shown in Part A of FIG. 6, a signal (High signal 15) having a voltage similar to the power supply voltage Vdd is applied to the +Dendrite line 7a. At this time, a signal (Low signal 16) having a voltage of 0 is applied to the −Dendrite line 7b. The High signal 15 and the Low signal 16 are each a control signal for controlling the binary state.

Further, an ON signal 17 is input to the Axon line 6. The ON signal 17 is a signal that generates a gate voltage causing the first and second MOS transistors 20a and 20b to be in the ON state. In the ON state, the conductive state is made between the input terminal and the output terminal, enabling a signal to flow between the terminals. Note that since the first and second MOS transistors 20a and 20b are each a p-MOS transistor, they are turned ON in the case where the gate voltage is 0, and turned OFF in the case where the gate voltage is a predetermined positive voltage (Vdd in Part a of FIG. 6).

When the ON signal 17 is input, the +Dendrite line 7a and the first terminal 32a of the flip-flop circuit 30 are conducted, the High signal 15 is applied to the first terminal 32a. Further, the −Dendrite line 7b and the second terminal 32b of the flip-flop circuit 30 are conducted, and the Low signal 16 is applied to the second terminal 32b.

As a result, while the ON signal 17 is input, the voltages of the first and second terminals 32a and 32b satisfy the relationship of (P, N)=(Vdd, 0). When the inputting of the ON signal 17 is completed, the conduction between each of Dendrite lines 7 and the flip-flop circuit 30 is cut off. In the flip-flop circuit 30, the state where (P, N)=(Vdd, 0), i.e., the 1 state, is held even after the cutting off. As a result, the positive weight value +α is set for the synapse circuit 8.

Further, in the case where the negative weight value $w_i^-=-α$ is set as shown in Part B of FIG. 6, the High signal 15 is added to the −Dendrite line 7b and the Low signal 16 is added to the +Dendrite line 7a. Further, the ON signal 17 is input to the Axon line 6. As a result, the voltages of the first and second terminals 32a and 32b satisfy the relationship of (P, N)=(0, Vdd) while the ON signal 17 is input, and the flip-flop circuit 30 is in the 0 state. As a result, the negative weight value −α is set for the synapse circuit 8.

As described above, the first and second MOS transistors 20a and 20b output control signals that control the binary state of the flip-flop circuit 30 from the input terminals 21a and 21b. In another aspect, it can be said that the first and second MOS transistors 20a and 20b function as a gate element that controls the application of a voltage for setting the binary state.

When the weight value +α/−α is set, a multiply-accumulate operation is executed. Part A of FIG. 6 and Part B of FIG. 6 show time charts in an input period T where an electrical signal 18 used for a multiply-accumulate operation is input. An electrical signal is input to the Axon line 6 in the input period T. Further, the ±Dendrite lines 7a and 7b are configured to have a voltage (e.g., 0.0 to 0.3 V) sufficiently lower than Vdd.

The electrical signal 18 is represented by, for example, the operation voltage Vw set so that the first and second MOS transistors 20a and 20b operate in a subthreshold region. Note that in a p-MOS transistor, for example, a voltage that is higher than the threshold voltage Vth (e.g., 0 V) and lower than the positive voltage (Vdd) where the transistor is turned OFF is set as the operation voltage Vw. Therefore, in the example shown in Part A of FIG. 6 and Part B of FIG. 6, the range where the voltage is reduced to Vw lower than Vdd corresponds to the electrical signal 18 (pulse).

As shown in FIG. 5, the first and second MOS transistors 20a and 20b are connected to the same Axon line 6, and the respective gate terminals 23a and 23b are controlled by the single electrical signal 18. For example, when the electrical signal 18 is input, the conductive state is made between the input terminal 21a and the output terminal 22a of the first MOS transistor 20a. Similarly, the conductive state is made between the input terminal 21b and the output terminal 22b of the second MOS transistor 20b.

Note that the resistance R between the input terminal 21a and the output terminal 22a (the input terminal 21b and the output terminal 22b), which has been in the conductive state, has a resistance value corresponding to the value of the operation voltage Vw. Further, since the operation voltage Vw is a gate voltage set in the subthreshold region, the resistance R has a high resistance, and the first and second MOS transistors 20a and 20b function as a high-resistance element. Hereinafter, the resistance R will be referred to as the conduction resistance R.

The first and second MOS transistors 20a and 20b, which have been in the conductive state, make it possible to flow a current. Part A of FIG. 6 and Part B of FIG. 6 show the states of the potentials of the ±Dendrite lines 7a and 7b due to the current flowing through one synapse circuit 8.

For example, in the case where the positive weight value +α is set, the voltage of the input terminal 21a is higher than the voltage of the output terminal 22a in the first MOS transistor 20a. As a result, a current (positive charges) flows from the input terminal 21a (source) to the output terminal 22a (drain) and is output to the +Dendrite line 7a. At this time, the current amount is proportional to, for example, the inverse of the conduction resistance R.

As shown in Part A of FIG. 6, in the synapse circuit 8 for which the positive weight value +α is set, charges output to the +Dendrite line 7a are accumulated in the capacitor 13a of the accumulation unit 11, and the potential of the +Dendrite line 7a increases. This increase in potential continues only while the operation voltage Vw (electrical signal) is applied. That is, the capacitor 13a is charged for the period similar to the pulse width (signal value $x_i$).

Further, in the case where the positive weight value +α is set, in the second MOS transistor 20b, the voltage of the input terminal 21b is substantially the same as the voltage of the output terminal 22b, and the current hardly flows. Therefore, as shown in Part A of FIG. 6, the potential of the −Dendrite line 7b hardly changes.

Meanwhile, in the case where the negative weight value −α is set, in the second MOS transistor 20b, the voltage of the input terminal 21b is higher than the voltage of the output terminal 22b. As a result, a current (positive charges) flows from the input terminal 21b (source) to the output terminal 22b (drain) and is output to the −Dendrite line 7a. As a result, as shown in Part B of FIG. 6, the potential of the −Dendrite line 7b increases for the period similar to the pulse width in the synapse circuit 8 for which the negative weight value −α is set. In this case, the potential of the +Dendrite line 7a hardly changes.

As described above, in the synapse circuit 8, charges are output at a fixed ratio through the conduction resistance R of each of the MOS transistors 20a and 20b only during the period corresponding to the signal value $x_i$. Here, the ratio of outputting charges is a parameter representing, for example, the amount of current output from the output terminals 22a and 22b, the slope of the potential increase of the ±Dendrite lines 7a and 7b, or the like. The ratio of outputting charges can be set by the conduction resistance R.

For example, when the ratio of outputting charges is the weight value $w_i$, a multiplication value $w_i \cdot x_i$ of the signal value $x_i$ and the weight value $w_i$ is represented by the total amount of charges output on the basis of the electrical signal. Therefore, in the synapse circuit 8, the multiplication result of the weight value $w_i$ set by the conduction resistance R and the signal value $x_i$ represented by the electrical signal 18 is output as charges.

As described above, in this embodiment, the first MOS transistor 20a and the second MOS transistor 20b generate, on the basis of the electrical signal 18 input to the plurality of Axon lines 6 (the input signal lines 6), charges corresponding to the multiplication value $w_i \cdot x_i$ obtained by multiplying the signal value $x_i$ represented by the electrical signal 18 by the weight value $w_i$.

As described above, each of the MOS transistors 20a and 20b generates charges of the same sign (positive charges in the synapse circuit shown in FIG. 5) regardless of the sign of the weight value $w_i$ (±α). Therefore, it can be said that each of the MOS transistors 20a and 20b generates charges corresponding to a multiplication value $|w_i| \cdot x_i$ obtained by multiplying the signal value $x_i$ by the absolute value of the weight value $w_i$. As a result, circuits for calculating a positive multiply-accumulate result, a negative multiply-accumulate result, and the like, which are arranged in the subsequent stages, for example, can have similar configurations, and it is possible to easily configure the analog circuit 3.

For example, in the case where the positive weight value +α is set, the first MOS transistor 20a outputs charges to the +Dendrite line 7a. In the case where the negative weight value −α is set, the second MOS transistor 20b outputs charges to the −Dendrite line 7b. That is, in the synapse circuit 8, calculating the multiplication value with the positive weight value +α corresponds to outputting charges corresponding to the absolute value α of the weight value +α to the +Dendrite line 7a. Further, calculating the multiplication value with the negative weight value $-\alpha$ corresponds to outputting charges corresponding to the absolute value $\alpha$ of the weight value $-\alpha$ to the −Dendrite line 7b.

As described above, in this embodiment, the generated charges are output to either the +Dendrite line 7a or the −Dendrite line 7b on the basis of the binary state held in the flip-flop circuit 30 by the first MOS transistor 20a and the second MOS transistor 20b. That is, it can be said that each of the MOS transistors 20a and 20b realizes the processing of switching the output according to the binary state. In this embodiment, the first MOS transistor 20a and the second MOS transistor 20b constitute the switch unit.

Figure 7:
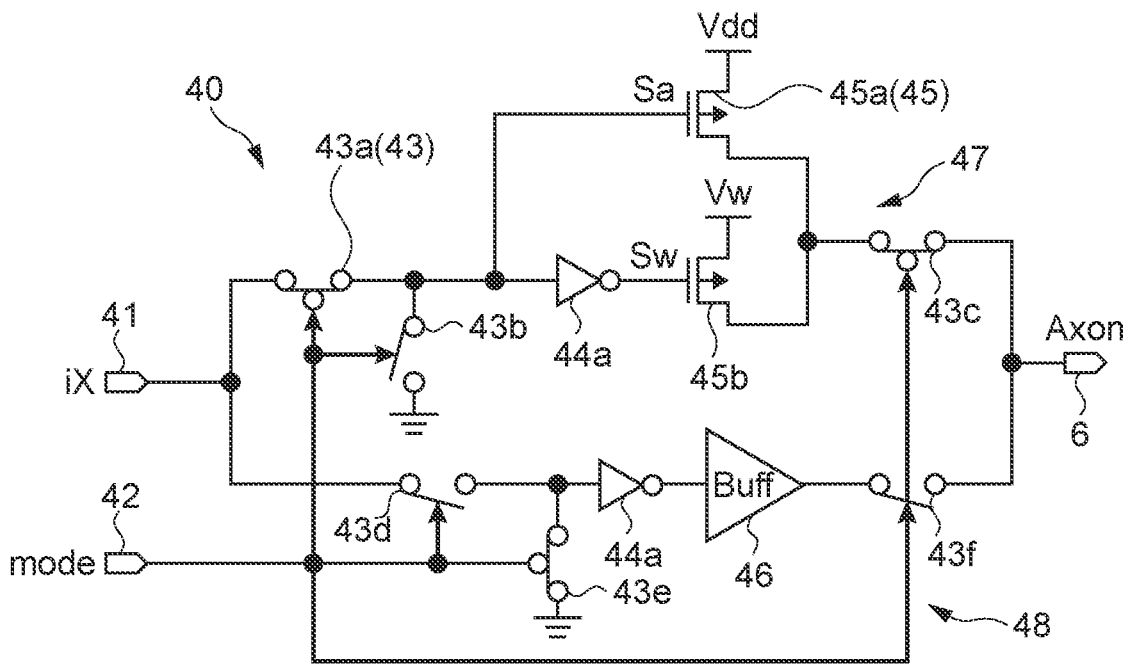
FIG. 7 is a circuit diagram showing an example of an input circuit that inputs an electrical signal to an Axon line.

FIG. 7 is a circuit diagram showing an example of the input circuit that inputs an electrical signal to the Axon line 6. An input circuit 40 functions as a charging/discharging circuit for charging the Axon line 6 and appropriately outputting an electrical signal. For example, as shown in FIG. 3, the input circuit 40 is provided between the lower layer and the upper layer corresponding to each of the plurality of Axon lines 6 (the input signal lines 6).

The input circuit 40 includes a signal input terminal 41, a mode input terminal 42, first to sixth switches 43a to 43f, first and second inverters 44a and 44b, first and second p-MOSs 45a and 45b, and a buffer circuit 46. These elements constitute an input signal circuit 47 and a weight setting circuit 48.

The p-MOSs 45 each include three terminals including a gate terminal. In the following, the other two terminals different from the gate terminal of the p-MOS 45 will be referred to as one terminal and the other terminal in some cases. Further, the switch 43 includes three terminals including a control terminal. In the following, the other two terminals different from the control terminal of the switch 43 will be referred to as simply one side and the other side in some cases.

The signal input terminal 41 is connected to the gate terminal of the first p-MOS 45a via the first switch 43a, and to the second inverter 44b connected to the gate terminal of the second p-MOS 45b. One side of the second switch 43b is connected to a GND, and the other side thereof is connected to the side of the first switch 43a opposite to the signal input terminal 41.

One terminal of the first p-MOS 45a is connected to a power supply voltage line (Vdd), and the other terminal thereof is connected to the third switch 43c. One terminal of the second p-MOS 45b is connected to an operating voltage line (Vw), and the other terminal thereof is connected to the same side as the first p-MOS 45a of the third switch 43c. The side of the third switch 43c opposite to the side to which the respective p-MOSs are connected is connected to the Axon line 6. The circuit (the circuit on the upper side of FIG. 7) including the first and second p-MOSs 45a and 45b functions as the input signal circuit 47.

Further, the signal input terminal 41 is connected to the input side of the buffer circuit 46 via the fourth switch 43d and the second inverter 44. One side of the fifth switch 43e is connected to a GND, and the other side thereof is connected between the fourth switch 43 and the second inverter 44. The output side of the buffer circuit 46 is connected to the Axon line 6 via the sixth switch 43f. The circuit (the lower circuit of FIG. 7) including this buffer circuit 46 functions as the weight setting circuit 48.

The mode input terminal 42 is connected to control terminals of the first to sixth switches 43a to 43f. Logical signals corresponding to a multiply-accumulate mode and a weight setting mode are input to the mode input terminal 42. As shown in FIG. 7, in the multiply-accumulate operation mode, the first switch 43a, the third switch 43c, and the fifth switch 43e are in the ON state, and the second switch 43b, the fourth switch 43d, and the sixth switch 43f are in the OFF state. In the case where the weight setting mode is selected, the ON state and the OFF state of these switches are switched.

Figure 8:
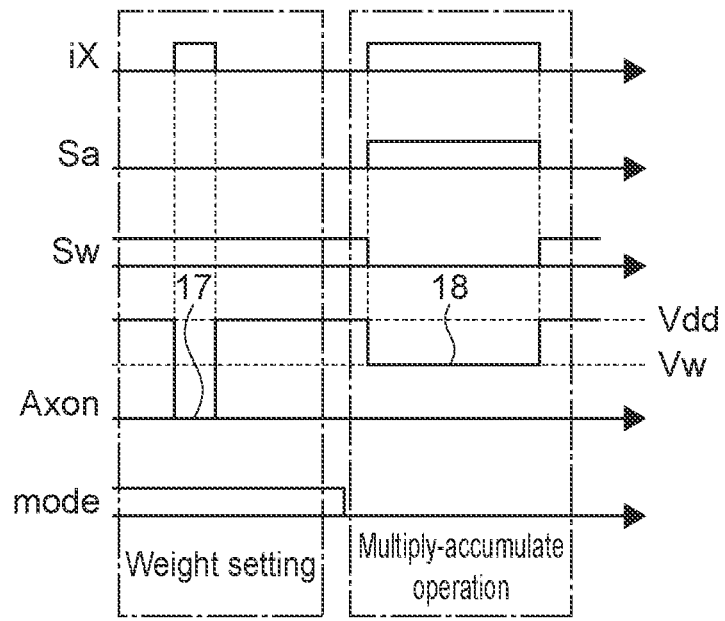
FIG. 8 is a timing chart showing an example of an operation of the input circuit.

FIG. 8 is a timing chart showing an example of an operation of the input circuit 40. In the following, the voltages (gate voltages) applied to the gate terminal of the first p-MOS 45a and the second p-MOS 45b will be respectively referred to as Sa and Sw.

In the weight setting mode, for example, Vdd is output by the buffer circuit 46, and the voltage of the Axon line 6 is set to Vdd. At this time, a positive-voltage control pulse is input to the signal input terminal 41, and the inverting output of the control pulse generated by the second inverter 44b is input to the buffer circuit 46. The ON signal 17 having the pulse width similar to the control pulse is generated by the buffer circuit 46, and input to the Axon line 6.

As a result, for example, the first and second MOS transistors 20a and 20b shown in FIG. 5 can be made in the ON state, i.e., the conductive state. Note that in the weight setting mode, the gate voltage Sa is low (0) and the first p-MOS 45a is made in the ON state. The gate voltage Sw is High (e.g., Vdd), and the second p-MOS 45a is made in the OFF state. As a result, Vdd is applied to the third switch 43. However, since the third switch 43c is in the OFF state, the output (Vdd) of the input signal circuit 47 is not output to the Axon line 6.

In the multiply-accumulate operation mode, the first, third, and fifth switches 43a, 43c, and 43e are in the ON state, and the voltage Vdd output by the first p-MOS 45a is applied to the Axon line 6. That is, the voltage level of the Axon line 6 is High. In this case, the first and second MOS transistors 20a and 20b shown in FIG. 5 enter the OFF state.

In this state, a positive-voltage signal pulse (electrical signal representing the signal value $x_i$ generated by the circuit in the preceding stage) is input to the signal input terminal 41. During the period in which the signal pulse is input, the gate voltage Sa is High and the first p-MOS 45a is in the OFF state. Meanwhile, the gate voltage Sw is Low, and the second p-MOS 45b is in the ON state. As a result, the voltage Vw output by the second p-MOS 45b is applied to the Axon line 6.

The voltage Vw is the voltage that causes the first and second MOS transistors 20a and 20b to operate in the threshold region. As a result, only during the period similar to the pulse width of the signal pulse, the first and second MOS transistors 20a and 20b are in the ON state, and multiplication processing or the like described with reference to FIG. 6 is executed. As described above, by generating the electrical signal (signal pulse) output in the lower layer again, it is possible to suppress the weight applied to the lower layer, and stably execute the multiply-accumulate operation and weight setting.

Figure 9:
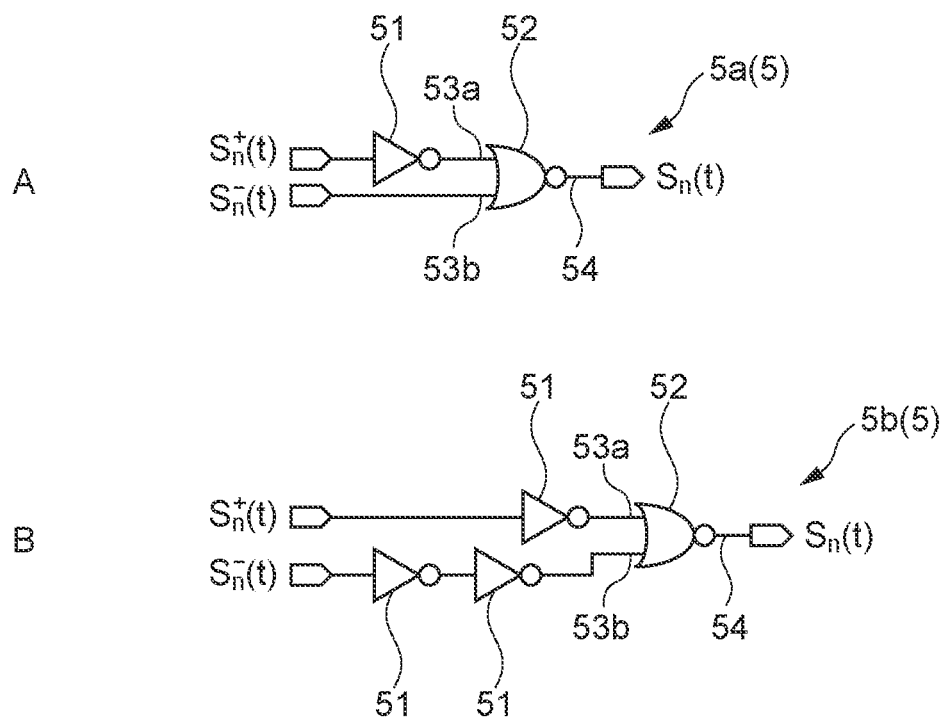
FIG. 9 is a circuit diagram showing an example of a function circuit that implements a ReLU function.
Figure 10:
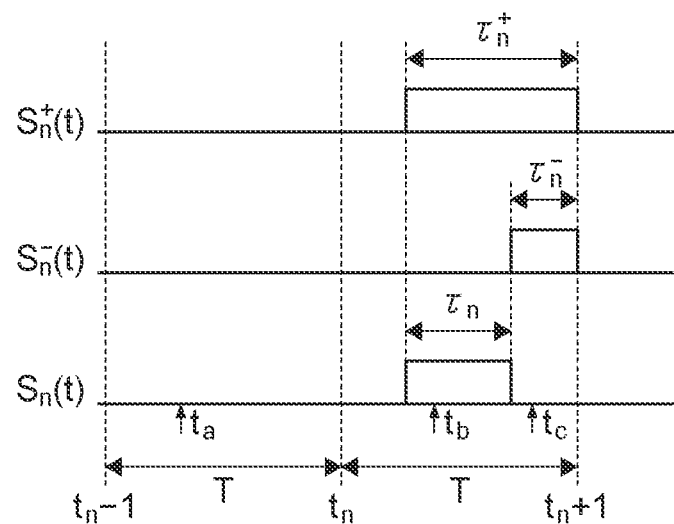
FIG. 10 is a timing chart showing an example of an operation of the function circuit.

FIG. 9 is a circuit diagram showing an example of the function circuit 5 that implements a ReLU function. FIG. 10 is a timing chart showing an example of an operation of the function circuit 5. In each of Part A of FIG. 9 and Part B of FIG. 9, a circuit diagram of the function circuits 5a and 5b for realizing a ReLu function corresponding to the electrical signal of the PWM system is shown. Each of the function circuits 5a and 5b operates in accordance with the timing chart shown in FIG. 10.

As shown in Part A of FIG. 9 and Part B of FIG. 9, the function circuits 5a and 5b are each a two-input one-output circuit. As the two inputs, a multiply-accumulate signal $S_n^+(t)$ representing a positive multiply-accumulate result, and a multiply-accumulate signal $S_n^-(t)$ representing a negative multiply-accumulate result are used. Note that each of the multiply-accumulate signals is a signal representing a signal value (each multiply-accumulate result) by the rising timing of the pulse in a predetermined output period T.

For example, as described with reference to FIG. 4, the positive and negative multiply-accumulate results are calculated by charging the capacitors 13a and 13b and detecting the timing when the voltages of the capacitors 13a and 13b exceed a predetermined threshold value. For example, by outputting a High voltage until the output period T is completed after the timing exceeding the threshold value, a multiply-accumulate signal representing the signal value by the rising timing can be generated. For example, in FIG. 10, the pulse of $S_n^+(t)$ rises faster as compared with that of $S_n^-(t)$. In this case, the positive multiply-accumulate result has a value greater than that of the negative multiply-accumulate result.

As shown in Part A of FIG. 9, the function circuit 5a includes an inverter 51 and a NOR circuit 52. The NOR circuit 52 is a logical gate of NOR, and includes input terminals 53a and 53b and an output terminal 54. The NOR circuit outputs the negation of OR to the output terminal 54 for logical values A and B input to the input terminals 53a and 53b. Therefore, for example, 1 is output in the case where (A, B)=(0, 0), and otherwise, 0 is output.

In the function circuit 5a, the positive multiply-accumulate signal $S_n^+(t)$ is input to the input terminal 53a of the NOR circuit 52 via the inverter 51. Further, the negative multiply-accumulate signal $S_n^-(t)$ is input to the input terminal 53b of the NOR circuit 52 as it is. In the following, the output of the function circuit 5a (ReLU function) will be referred to as $S_n(t)$.

As shown in Part B of FIG. 9, the function circuit 5b includes three inverters 51 and the NOR circuit 52. In the function circuit 5b, the positive multiply-accumulate signal $S_n^+(t)$ is input to the input terminal 53a of the NOR circuit 52 via one inverter 51. Further, the negative multiply-accumulate signal $S_n^-(t)$ is input to the input terminal 53b of the NOR circuit 52 via two inverters 51. The function circuit 5b is a circuit that performs substantially the same operation as that of the function circuit 5a.

For example, as in the function circuit 5b, by inputting the negative multiply-accumulate signal $S_n^-(t)$ via two inverters 51 (additional inverters), it is possible to adjust the delay time of the input timing of $S_n^-(t)$. As a result, when resetting the circuit (e.g., the timing of $t=t_n+1$ in FIG. 10), it is possible to avoid generation of glitch noise or the like. In the following, the function circuits 5a and 5b will be referred to simply as the function circuit 5.

For example, as shown in FIG. 10, at a time $t_a$ in the input period T, $(S_n^+(t_a), S_n^-(t_a))=(0, 0)$, and the inputs of the NOR circuit satisfy the relationship of (A, B)=(1, 0). As a result, the output $S_n(t_a)$ of the NOR circuit is 0.

Further, for example, at a time $t_b$ where the positive multiply-accumulate signal is 1 and the negative multiply-accumulate signal is 0, $(S_n^+(t_b), S_n^-(t_b))=(1, 0)$, and the inputs of the NOR circuit satisfy the relationship of (A, B)=(0, 0). As a result, $S_n(t_b)$ is 1. Further, at a time $t_c$ where both positive and negative multiply-accumulate signals are 1, $(S_n^+(t_c), S_n^-(t_c))=(1, 1)$, and the inputs of the NOR circuit satisfy the relationship of (A, B)=(0, 1). As a result, $S_n(t_c)$ is 0.

Thus, a signal having a pulse width $\tau_n$ obtained by subtracting a pulse width $\tau_n^-$ of the negative multiply-accumulate signal $S_n^-(t)$ from a pulse width $\tau_n^+$ of the positive multiply-accumulate signal $S_n^+(t)$ is output from the function circuit 5. This pulse width $\tau_n$ is a difference between the positive and negative multiply-accumulate results shown in (Math. 2), and represents the entire multiply-accumulate result. That is, $S_n(t)$ is a PWM electrical signal using the entire multiply-accumulate result as a signal value. Thus, the function circuit 5 is a circuit that calculates the entire multiply-accumulate result in the case where the positive multiply-accumulate result is greater than the negative multiply-accumulate result.

Further, in the case where the positive multiply-accumulate result is less than the negative multiply-accumulate result, the pulse of $S_n^+(t)$ rises after $S_n^-(t)$. In this case, there is no situation where $S_n^+(t)=1$ and $S_n^-(t)=0$ in the output period T. Therefore, in the case where a positive multiply-accumulate result is less than a negative multiply-accumulate result, then $S_n(t)$ is 0. This corresponds to the case where the difference between the positive and negative multiply-accumulate results shown in (Math. 2) is negative, i.e., the case where the entire multiply-accumulate result is negative. Thus, in the function circuit 5a that implements a ReLU function, 0 is output in the case where the entire multiply-accumulate result is negative.

The function circuit 5 may be configured as, for example, the output unit 12 shown in FIG. 4. Alternatively, the output unit 12 that outputs positive and negative multiply-accumulate signals $S_n^+(t)$ and $S_n^-(t)$ may be configured, and the function circuit 5 may be provided in the subsequent stage thereof. Further, the function circuit 5 may be provided for all the analog circuits 3 or may be provided for only a part of the analog circuits 3.

Figure 11:
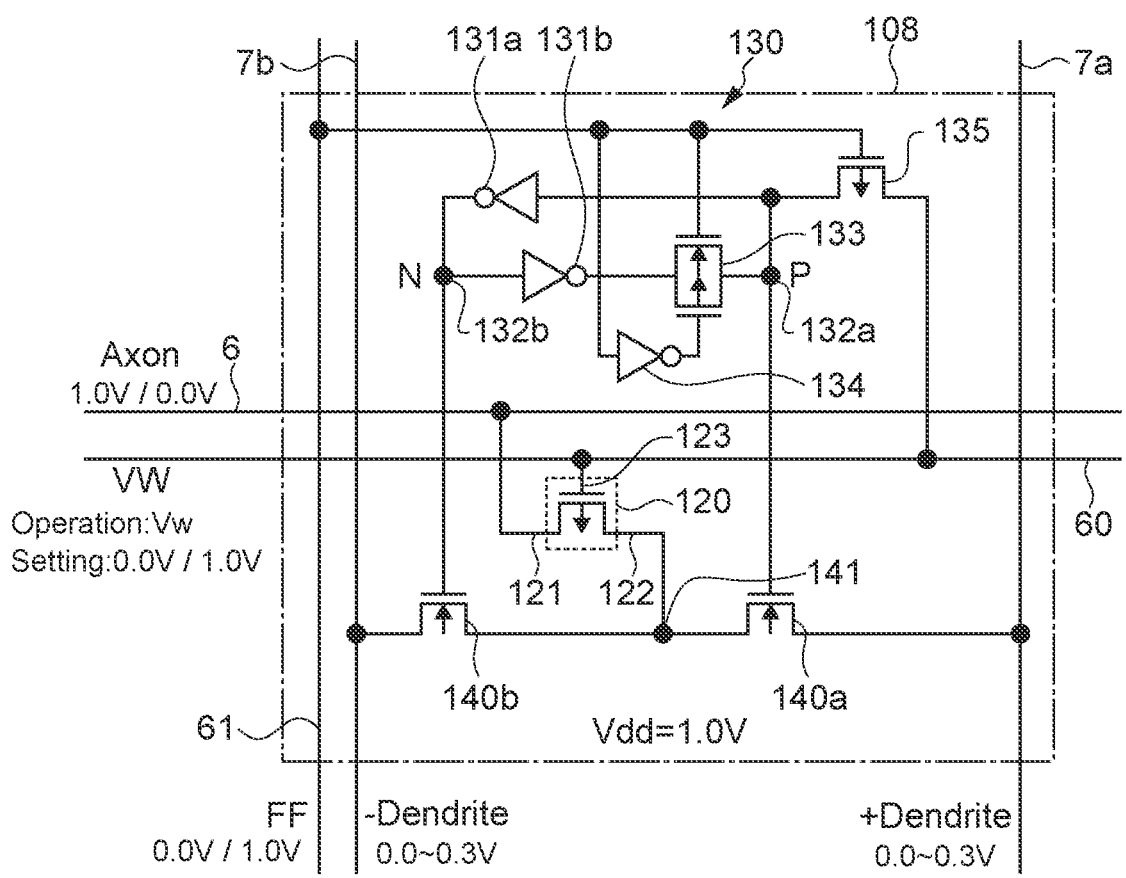
FIG. 11 is a circuit diagram showing another configuration example of the synapse circuit.

FIG. 11 is a circuit diagram showing another configuration example of the synapse circuit. A synapse circuit 108 includes a MOS transistor 120, a first gate 140a, a second gate 140b, and a flip-flop circuit 130. Further, the Axon line 6, the +Dendrite line 7a, the −Dendrite line 7b, an operating voltage line 60 (referred to as VW in the figure), and a control line 61 (referred to as FF in the figure) are connected to the synapse circuit 108.

The MOS transistor 120 is a P-type MOS transistor that operates in a subthreshold region, and includes an input terminal 121, an output terminal 122, and a gate terminal 123. The input terminal 121 is connected to the Axon line 6. The output terminal 122 is connected to a connection point 141 between a first gate 140a and a second gate 140b described below. The gate terminal 123 is connected to the operating voltage line 60. In this embodiment, the operating voltage line 60 corresponds to the predetermined gate voltage source.

The first gate 140a and the second gate 140b are each an n-type MOS transistor (n-MOS), and include an input terminal, an output terminal, and a gate terminal. The input terminals of the gates 140a and 140b are connected to each other via the connection point 141. The output terminal 122 of the MOS transistor 120 is connected to this connection point.

The output terminal and the gate terminal of the first gate 140a are respectively connected to the +Dendrite line 7a and a first terminal 132a of the flip-flop circuit 130. The output terminal and the gate terminal of the second gate 140b are respectively connected to the −Dendrite line 7b and a second terminal 132b of the flip-flop circuit 130.

In the synapse circuit 108, the output terminal 122 of the MOS transistor 120 and the +Dendrite line 7a are connected to each other by the first gate 140a. Further, the output terminal 122 of the MOS transistor 120 and the −Dendrite line 7b are connected to each other by the second gate 140b.

In the synapse circuit 108, the first gate 140a corresponds to the first switch element, and the second gate 140b corresponds to the second switch element.

The flip-flop circuit 130 includes a first inverter 131a, a second inverter 132b, the first terminal 132a, and the second terminal 132b. Further, the flip-flop circuit 130 includes a setting gate 133, a setting inverter 134, and an inputting gate 135.

The output of the first inverter 131a is input to the second inverter 131b. Further, the output of the second inverter 131b is input to the first inverter 131a via the signal line of the setting gate 133. The first terminal 132a is a terminal connected to the input side of the first inverter 131a. The second terminal 132b is a terminal connected to the output side of the first inverter 131a.

The setting gate 133 is a transmission gate (bi-directional switch) configured by using an n-MOS and a p-MOS. In the setting gate 133, the MOSs are connected in parallel so that the input terminal and the output terminal are shared. Hereinafter, a line from the input terminal to the output terminal will be referred to as the signal line. Note that in the signal line, the terminal connected to the output side of the second inverter 131 is an input terminal.

The input side of the setting inverter 134 is connected to the control line 61, and the output side thereof is connected to the gate terminal of the p-MOS of the setting gate 133. Further, the gate terminal of the n-MOS of the setting inverter 134 is connected to the control line.

The inputting gate 135 is a p-MOS, and includes an input terminal, an output terminal, and a gate terminal. In the inputting gate 135, the input terminal is connected to the operating voltage line 60, and the output terminal is connected to the first terminal (the input side of the first inverter 131a). Further, the gate terminal is connected to the control line 61. The setting gate 133, the setting inverter 134, and the inputting gate 135 are the circuit for setting the binary state held by the first inverter 131a and the second inverter 131b.

In the multiply-accumulate operation mode, the operation voltage Vw is applied to the operating voltage line 60, and the MOS transistor 120 enters the ON state and operates in the subthreshold region. The electrical signal input to the Axon line 6 is input to the input terminal 121 of the MOS transistor 120. The MOS transistor 120 generates charges corresponding to the multiplication value obtained by multiplying the signal value $x_i$ represented by the electrical signal by the weight value $w_i$, and the generated charges are output from the output terminal 122.

Further, the positive and negative weight values ±α are set for the synapse circuit 108, and the flip-flop circuit 130 holds a state corresponding to the positive weight value +α and a state corresponding to the negative weight value −α. In the case where the positive weight value +α is set, the voltages P and N of the first and second terminals 132a and 132b satisfy the relationship of (P, N)=(Vdd, 0). Further, in the case where the negative weight value +α is set, (P, N)=(0, Vdd).

For example, in the case where the positive weight value +α is set, P=Vdd is applied as the gate voltage to the first gate 140a that is an n-MOS, and the first gate 140a enters the ON state. Further, 0 is applied to the second gate 140b that is an n-MOS as a gate-voltage, and the second gate 140b enters the OFF state. In this case, the charges generated by the MOS transistor 120 are output to the +Dendrite line 7a via the first gate 140a. Similarly, in the case where the negative weight value −α is set, the second gate 140b enters the ON state and the first gate 140a enters the OFF state. In this case, charges generated by the MOS transistor 120 are output to the −Dendrite line 7b via the second gate 140b.

As described above, in the synapse circuit 108, charges generated by the MOS transistor 120 are output to either the +Dendrite line 7a or the −Dendrite line 7b on the basis of the binary state held in the flip-flop circuit 130 by the first and second gates 140a and 140b. In the synapse circuit 108, the MOS transistor 120 functions as the weight unit, and the first and second gates 140a and 140b function as the switch unit.

In the weight setting mode, a voltage similar to the power supply voltage Vdd (e.g., 1.0 V) is applied to the control line 61. As a result, the setting gate 133 and the inputting gate 135 connected to the control line 61 enter the ON state. In this state, a control signal (ON signal and OFF signal) for setting the binary state is input to the operating voltage line 60.

For example, in the case where the positive weight value +α is set, a voltage similar to the power supply voltage Vdd is applied to the operating voltage line 60. As a result, (P, N)=(Vdd, 0), and a state corresponding to the positive weight value +α is realized. Further, in the case where the negative weight value −α is set, a voltage of 0 is applied to the operating voltage line 60. As a result, (P, N)=(0, Vdd), and a state corresponding to the negative weight value −α is realized.

When the weight values ±α are set, the voltage of the control line 61 is set to 0. As a result, the setting gate 133 and the inputting gate 135 enter the OFF state. Note that the first and second inverters 131a and 131b hold the states corresponding to the weight values ±α.

The synapse circuit 108 shown in FIG. 11 is configured by using 12 MOS transistors. Further, seven wires (the Axon line 6, the ±Dendrite lines 7a and 7b, the two power supply voltage lines, the control line 61, and the operating voltage line 60) are connected to the synapse circuit 108. In this configuration, the binary state held in the flip-flop circuit 130 is set by using the operating voltage line 60, for example. As a result, it is possible to reduce the number of wires, and improve the integration rate of the circuit, and the like. For example, such a configuration may be adopted.

As described above, in the arithmetic logic unit 100 according to this embodiment, electrical signals are input to the plurality of input signal lines 6 (the Axon lines 6). The plurality of synapse circuits in the analog circuits 3 generate charges corresponding to the multiplication value $w_i \cdot x_i$ of the signal value $x_i$ of the electrical signal and the weight value $w_i$. The generated charges are output to one the pair of output lines 7a and 7b (the ±Dendrite lines 7a and 7b) on the basis of the state of the flip-flop circuit holding the binary state. The charges output from the respective synapse circuits are accumulated, and a multiply-accumulate signal is output on the basis of the accumulated charges. Such a configuration of the synapse circuit can be integrated using a technology for producing integrated circuits and the like, and it is possible to easily integrate the circuit of the analog system performing a multiply-accumulate operation.

In the case where a neural network or the like is formed using an analog circuit, for example, a large number of circuits that perform processing of multiplying a weight value by a signal value, i.e., processing corresponding to the synaptic connection, are necessary. In the analog circuit, such circuits need to be appropriately connected and integrated with high integration efficiency.

In this embodiment, the respective units (the synapse circuits 8 and 108, the neuron circuit 9, the input circuit 40, the function circuit 5, and the like) constituting the analog circuit 3 can be configured by using a p-MOS transistor and a n-MOS transistor. That is, the analog circuit 3 can be easily integrated by using a technology for producing CMOS (Complementary Metal Oxide Semiconductor) integrated circuits, for example. This makes it possible to integrate, for example, a highly-reliable analog circuit on a large scale.

As described with reference to FIG. 3 or the like, in this embodiment, the analog circuits 3 included in the respective layers can be realized by using the crossbar configuration. This makes it possible to easily implement, for example, a deep neural network with a large number of layers.

As described with reference to FIG. 5 and FIG. 11, in the synapse circuits 8 and 108, respectively, the states stored in the flip-flop circuits 30 and 130 are used to execute processing of multiplying with the positive and negative weight values ±α. Such a configuration can be easily realized by using a technology for producing a SRAM (Static Random Access Memory), for example. This makes it possible to integrate a large number of the synapse circuits 8 and 108 at high density, and provide, for example, small integrated circuits specialized for image recognition, speech recognition, and the like.

For example, in order to achieve an operation with low-energy-consumption, it is desirable that the capacitance of the ±Dendrite lines 7a and 7b, including the input capacitance of the circuits in the subsequent stage, is low. That is, the power consumption can be suppressed by reducing charges input to the respective Dendrite lines 7.

As described above, in the synapse circuits 8 and 108, the MOS transistor that operates in the subthreshold region is connected to the ±Dendrite lines 7a and 7b. Thus, the high conduction resistance R is disposed between the ±Dendrite lines 7a and 7b and the circuits in the subsequent stage, and charges flowing into the ±Dendrite lines 7a and 7b can be reduced. As a result, it is possible to obtain a sufficient processing time and improve the operation accuracy.

Further, by reducing charges, it is possible to reduce the capacitance of the capacitor 13 necessary for accumulating charges, and use the capacitor 13 or the like having a size suitable for integration. Alternatively, it is possible to reduce charges in accordance with the capacitance of the capacitor 13, or the like. This makes it possible to ensure enough time to charge charges, or the like, and detect a multiply-accumulate result with high resolution. In this way, by using a MOS transistor that operates in the subthreshold region, for example, it is possible to realize the arithmetic logic unit 100 or the like that is capable of performing a high-precision arithmetic operation while consuming low power and being small in size.

Second Embodiment

An arithmetic logic unit according to a second embodiment of the present technology will be described. In the following description, description of the configurations and effects similar to those in the arithmetic logic unit 100 described in the above-mentioned embodiment will be omitted or simplified.

Figure 12:
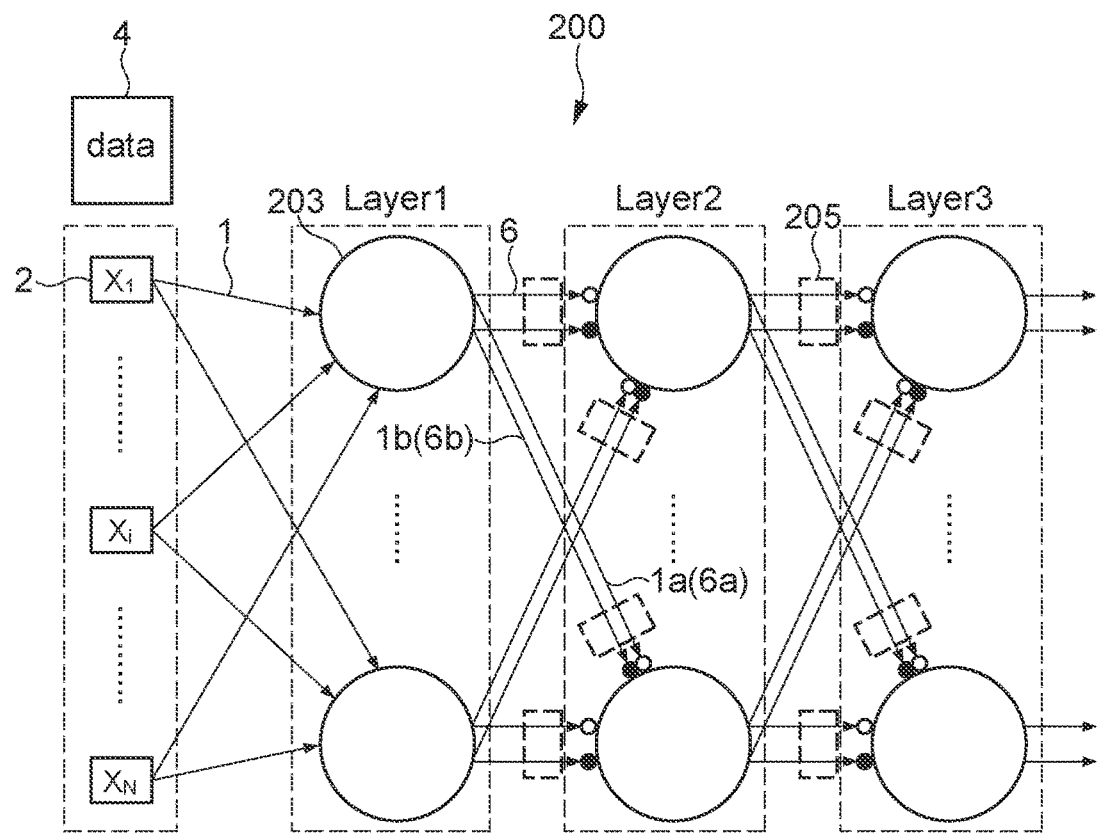
FIG. 12 is a schematic diagram showing a configuration example of an arithmetic logic unit according to a second embodiment.

FIG. 12 is a schematic diagram showing a configuration example of the arithmetic logic unit according to the second embodiment. In an arithmetic logic unit 200 shown in FIG. 12, a pair of electrical signals are output from one analog circuit 203 (signal source). Therefore, for example, 2×M input signal lines 6 (the signal lines 1) are connected to the analog circuits 203 in the upper layer connected to M analog circuits 203. In this case, the total number N of electrical signals input to the analog circuits 203 in the upper layer satisfies the relationship of N=2×M.

A pair of electrical signals include, for example, a positive electrical signal representing the positive signal value $x_i^+$ and a negative electrical signal representing the negative signal value $x_i^-$. For example, the positive signal value $x_i^+$ and the negative signal value $x_i^+$ are each a real number of 0 or more, and a difference value $(x_i^+ - x_i^-)$ obtained by subtracting the negative signal value $x_i^-$ from the positive signal value $x_i^+$ is the signal value $x_i$.

For example, a plurality of positive signal lines 1a that transmits a positive electrical signal and a plurality of negative signal lines 1b that transmits a negative electrical signal are connected to the output side of one signal source. The same positive electrical signal is input to the plurality of positive signal lines 1a. Further, the same negative electrical signal is input to the plurality of negative signal lines 1b. In FIG. 12, the positive signal line 1a (the positive input signal line 6a) is connected to the connection point of the analog circuit 203, which is indicated by a white circle. Further, the negative signal line 1b (the positive input signal line 6b) is connected to the connection point of the analog circuit 203, which is indicated by a black circle.

As described above, in this embodiment, the plurality of input signal lines 6 is configured as a plurality of pairs of the input signal lines 6, each of the pairs including the positive input signal line 6a and the negative input signal line 6b. In this embodiment, the positive input signal line 6a corresponds to the first input line, and the negative input signal line 6b corresponds to the second input line.

For example, the analog circuit 203 outputs, as a positive electrical signal, an electrical signal (positive multiply-accumulate signal $S_n^+(t)$) representing a positive multiply-accumulate result that is the total sum of positive multiplication values, and outputs, as a negative electrical signal, an electrical signal (negative multiply-accumulate signal $S_n^-(t)$) representing a negative multiply-accumulate result that is the total sum of negative multiplication values.

Note that a configuration in which a pair of electrical signals are output from the respective input units 2 (signal source) may be used. For example, the input unit 2 outputs, as a positive electrical signal, an electrical signal representing a signal value corresponding to the input data 4, and outputs, as a negative electrical signal, an electrical signal having a signal value of zero. For example, the input unit 2 can be configured in this manner.

As shown in FIG. 12, the arithmetic logic unit 200 has a hierarchical structure in which a plurality of the analog circuits 203 is provided in each of a plurality of layers. For example, N pairs of electrical signals generated by N input units 2 are input to each of the analog circuits 203 provided in the layer of the first layer. Further, $N_1$ pairs of electrical signals calculated in the first stage are input to each of the analog circuits 203 provided in the layer of the second stage.

As described above, in the arithmetic logic unit 200, a pair of electrical signals (positive and negative multiply-accumulate results) are generated on the basis of the pairs of the plurality of electrical signals by each of the analog circuits 203, and output to the analog circuit 203 in the upper layer. Such processing is executed a plurality of times, and the processing result is output from the analog circuit 203 included in the uppermost layer (the layer of the third stage in FIG. 12).

Further, an activation function can be applied to the pair of electrical signals. In the example shown in FIG. 12, for example, a two-input two-output function circuit 205 is appropriately disposed between the lower layer and the upper layer. For example, in the function circuit 205 that implements a ReLU function, whether the signal value $x_i=(x_i^+ - x_i^-)$, which is the entire multiply-accumulate result, is positive or negative is determined from the input pair of electrical signals (positive and negative multiply-accumulate results).

For example, the pair of electrical signals input from the two outputs are output as they are in the case where the signal value $x_i$ is 0 or more, and otherwise, electrical signals representing 0 are output from the two outputs. Thus, even in the case where a pair of electrical signals are used, it is possible to realize the arithmetic logic unit 200 in which an activation function such as a ReLU function has been introduced.

Figure 13:
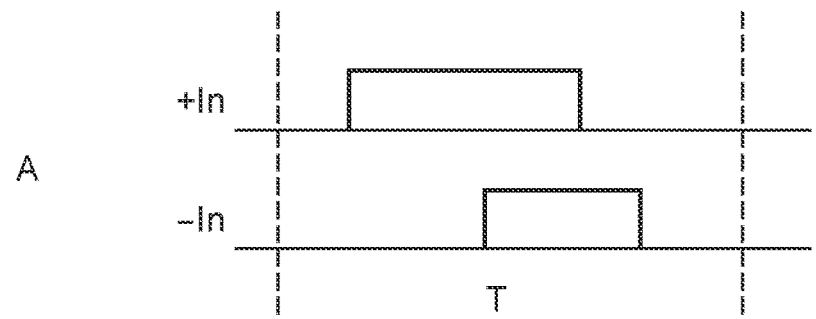
FIG. 13 is a schematic diagram showing an example of an electrical signal input to the analog circuit.
Figure 13:
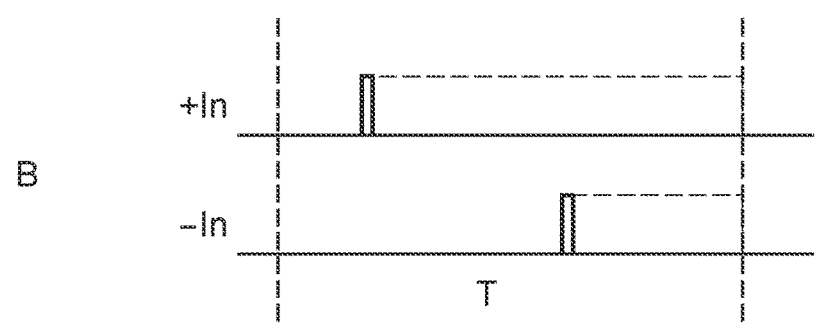

FIG. 13 is a schematic diagram showing an example of an electrical signal input to the analog circuit 203. In Part A of FIG. 13 and Part B of FIG. 13, graphs representing waveforms of a pair of electrical signals are schematically illustrated. The horizontal axis of the graph represents the time axis, and the vertical axis represents the voltage of the electrical signal. Note that the time axis of each graph is common. Note that the system of the electrical signal differs between Part A of FIG. 13 and Part B of FIG. 13.

Part A of FIG. 13 is a graph representing an example of waveforms of a PWM electrical signal. In the PWM system, the signal value $x_i$ is represented by the pulse width, as described with reference to FIG. 2. Signals of such pulse waveforms are input to the positive and negative input signal lines 6a and 6b.

Part B of FIG. 13 is a graph representing an example of waveforms of an electrical signal of the spike timing system (hereinafter, referred to as the TACT system). The TACT system is a system using the timing when the pulse has been input to represent the signal value $x_i$. For example, with reference to predetermined timing, the earlier the timing when the pulse is input, the larger the signal value $x_i$ represented by the pulse.

This pulse is input, for example, during the predetermined input period T. The signal value $x_i$ is represented by the input timing of the pulse in this input period T. Therefore, for example, the pulse input at the same time as the beginning of the input period T represents the largest signal value $x_i$.

Note that Part B of FIG. 13 illustrates rectangular pulses having a predetermined pulse width as electrical signals. The present technology is not limited thereto, and, for example, a continuous pulse that rises at certain timing and maintains the ON-level until a multiply-accumulate result is obtained may be used as an electrical signal. This can be said to be the same pulse as the positive and negative multiply-accumulate signals $S_i^+(t)$ and $S_i^-(t)$ described with reference to FIG. 10, for example.

Figure 14:
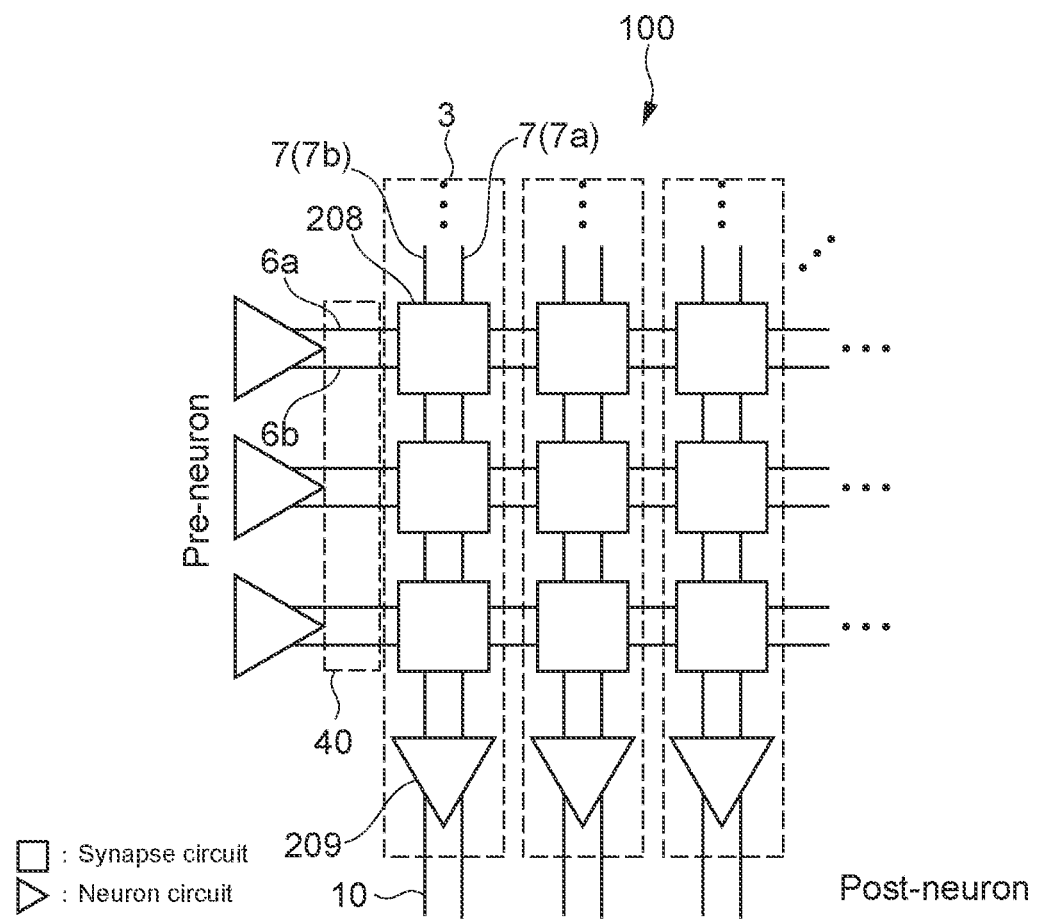
FIG. 14 is a schematic diagram showing a specific configuration example of the arithmetic logic unit.

FIG. 14 is a schematic diagram showing a specific configuration example of the arithmetic logic unit 200. FIG. 14 shows an arrangement example of circuits for realizing the arithmetic logic unit 200 shown in FIG. 12, for example, and a plurality of analog circuits 203 provided in one layer of the arithmetic logic unit 200 is schematically illustrated.

The analog circuits 203 each include the pair of output lines 7, a plurality of synapse circuits 208, and a neuron circuit 209. As shown in FIG. 14, the arithmetic logic unit 200 is a circuit having a crossbar configuration (see FIG. 3) in which the input signal lines 6 and the respective output lines 7 are arranged perpendicular to each other. Further, in the arithmetic logic unit 200, the positive input signal line 6a and the negative input signal line 6b are connected to each of the synapse circuits 208.

The synapse circuit 208 calculates the multiplication value $(w_i \cdot x_i)$ of the signal value $x_i$ represented by the electrical signal and the weight value $w_i$. Specifically, charges corresponding to the multiplication value of the signal value $x_i^+$ and the weight value $w_i$ input from the positive input signal line 6a are output to either the positive output line 7a or the negative output line 7b on the basis of the sign of the weight value $w_i$. Further, charges corresponding to the multiplication value of the signal value $x_i^-$ and the weight value $w_i$ input from the negative input signal line 6b are output to the output line 7, of the output lines 7a and 7b, which differs from the output line 7 to which charges corresponding to the multiplication value with the signal value $x_i^+$ are output.

Therefore, it can be said that the synapse circuit 208 functions as a circuit that switches the connection between the pair of input signal lines 6a and 6b and the pair of output lines 7a and 7b. Further, the signal value $x_i^+$ and the signal value $x_i^-$ input from the pair of input signal lines 6a and 6b are multiplied by the same signal value $w_i$. Thus, the synapse circuit 208 is a two-input two-output circuit connected to the pair of input signal lines 6a and 6b and the pair of output lines 7a and 7b. The specific configuration of the synapse circuit 208 will be described below in detail. In this embodiment, the synapse circuit 208 corresponds to the multiplication unit.

Figure 15:
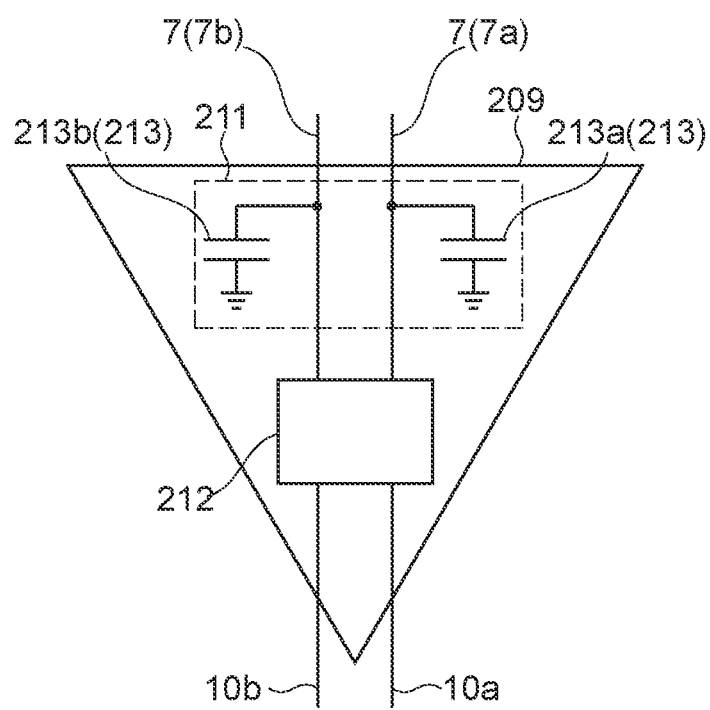
FIG. 15 is a schematic diagram showing a configuration example of the neuron circuit.

FIG. 15 is a schematic diagram showing a configuration example of the neuron circuit 209. The neuron circuit 209 includes an accumulation unit 211 and an output unit 212. FIG. 15 shows the two-input two-output neuron circuit 209 connected to the pair of output lines 7 and a pair of output signal lines 10.

The accumulation unit 211 is configured, for example, in the same manner as the accumulation unit 11 described with reference to FIG. 4. The accumulation unit 211 is provided with capacitors 213a and 213b input from the positive and negative output lines 7a and 7b. A switch for discharging the accumulated charges, a charging circuit for performing additional charging, and the like are appropriately connected to the capacitors 213a and 213b.

The output unit 212 outputs a multiply-accumulate signal representing the sum of multiplication values $(w_i \cdot x_i)$ on the basis of the charges accumulated in the accumulation unit 211. Specifically, the charges accumulated in the respective capacitors 213a and 213b are referred to as appropriate, and the positive and negative multiply-accumulate signals $S_n^+(t)$ and $S_n^-(t)$ are output, respectively.

For example, in the case where a PWM electrical signal is used, charges corresponding to the multiplication value are accumulated in the capacitor 213 during the input period T, as described with reference to FIG. 4. In this case, the capacitor 213 is charged after the input period T, and the potential thereof is detected using a threshold value, thereby detecting the timing representing the multiply-accumulate result. Using this timing, for example, the positive and negative multiply-accumulate signals $S_n^+(t)$ and $S_n^-(t)$ as shown in FIG. 10 are generated.

Further, for example, in the case where a TACT electrical signal is used, charges are continuously accumulated at a constant rate from the input timing of the pulse. In a TACT system, the signal value $x_i$ is determined by the input timing, so that there is no need to detect the pulse width or the timing when the pulse falls. Therefore, the timing for finishing the accumulation of charges can be arbitrarily set. Therefore, even if charges are continuously accumulated even after the input period T, for example, the final multiply-accumulate result can be appropriately calculated.

For example, a configuration in which charges are continuously accumulated until the potential of the capacitor where charges are accumulated exceeds a predetermined threshold value can be used. In this case, the positive and negative multiply-accumulate signals $S_n^+(t)$ and $S_n^-(t)$ are generated by detecting the timing when the accumulated chars exceed the predetermined threshold value. Thus, for example, a circuit or the like for recharging the capacitor as used in the PWM system is unnecessary, thereby simplifying the device configuration.

Thus, in the TACT system, charges are output at a rate (slope) corresponding to the respective weight values $w_i$, and the capacitor is charged until the charges exceed the threshold value. In this case, the entire multiply-accumulate result can be calculated using the following formula, for example, as shown in Patent Literature 1.

$$\sum_{i=1}^{N} w_i \cdot x_i = \frac{\theta^+ - \theta^- + \beta T_{in} - (\beta^+ t_v^+ - \beta^- t_v^-)}{T_{in}} \quad \text{[Math. 3]}$$

Here, $\theta^+$ and $\theta^-$ respectively represent threshold values for detecting the potentials of the capacitors 213a and 213b. Further, $\beta$ is the total sum of the weight value $w_i$ set for the respective synapse circuits 208. $\beta^+$ and $\beta^-$ respectively represent the total sum of the positive weight values $w_i^+$ and the total sum of the negative weight values $|w_i^-|$, and $\beta=\beta^+-\beta^-$. Further, $T_{in}$ represents the input period T, and $t_v^+$ and $t_v^-$ respectively represent the timing when the potentials of the capacitors 213a and 213b exceed the respective threshold values.

In general, $\beta^+$, which is the total sum of the positive weight values $w_i^+$, and $\beta^-$, which is the total sum of the negative weight values Nil have different values. However, as shown in FIG. 12 and FIG. 14, the relationship of $\beta^+=\beta^-=\beta_0$ can be satisfied by providing the pair of positive and negative input signal lines 6a and 6b and multiplying the signal value $x_i^+$ and the signal value $x_i^-$ by a common weight value $w_i$. In this case, the total sum $\beta$ of the entire weight value $w_i$ satisfies the relationship of $\beta=\beta^+-\beta^-=0$.

For example, the threshold values $\theta^+$ and $\theta^-$ for the respective capacitors 213a and 213b are set to the same value in order to make the scale of the multiply-accumulate result to be output equal to each other. As a result, (Math. 3), which is the multiply-accumulate result calculated by the analog circuit 203, is modified as follows.

$$\sum_{i=1}^{N} w_i \cdot x_i = \frac{\beta_o (t_v^- - t_v^+)}{T_{in}} \quad \text{[Math. 4]}$$

As shown in (Math. 4), the entire multiply-accumulate result can be calculated as the difference obtained by subtracting the timing $t_v^+$ when the potential of the capacitor 213b exceeds the threshold value from the timing $t_v^-$ when the potential of the capacitor 213b exceeds the threshold value. Such an operation can be easily executed using a logical circuit or the like on the basis of the positive multiply-accumulate signal $S_n^+(t)$ representing the timing $t_v^+$ and the positive multiply-accumulate signal $S_n^-(t)$ representing the timing $t_v^-$.

As described above, in the case where a TACT electrical signal is used, it is possible to easily execute calculation of the multiply-accumulate result by providing the positive and negative input signal lines 6a and 6b to configure a two-input two-output synapse circuit 208. As a result, for example, it is possible to simplify the configuration of the output unit 212, and reduce the element size, for example.

Further, for example, even in the case where the weight value $w_i$ is changed, it is possible to execute appropriate multiply-accumulate operation processing without changing the configuration of the output unit 212, or the like. As a result, it is possible to realize a highly versatile arithmetic logic unit 200.

Note that in the PWM system, as described above, the capacitors 213a and 213b are appropriately charged after the input period T. This additional charging serves to, for example, compensate for the difference between $\beta^+$ and $\beta^-$ in (Math. 3). Therefore, the PWM electrical signal can be easily applied to both the case of using a one-input two-output synapse circuit (see FIG. 1 and FIG. 3, etc.) and the case of using a two-input two-output synapse circuit.

Figure 16:
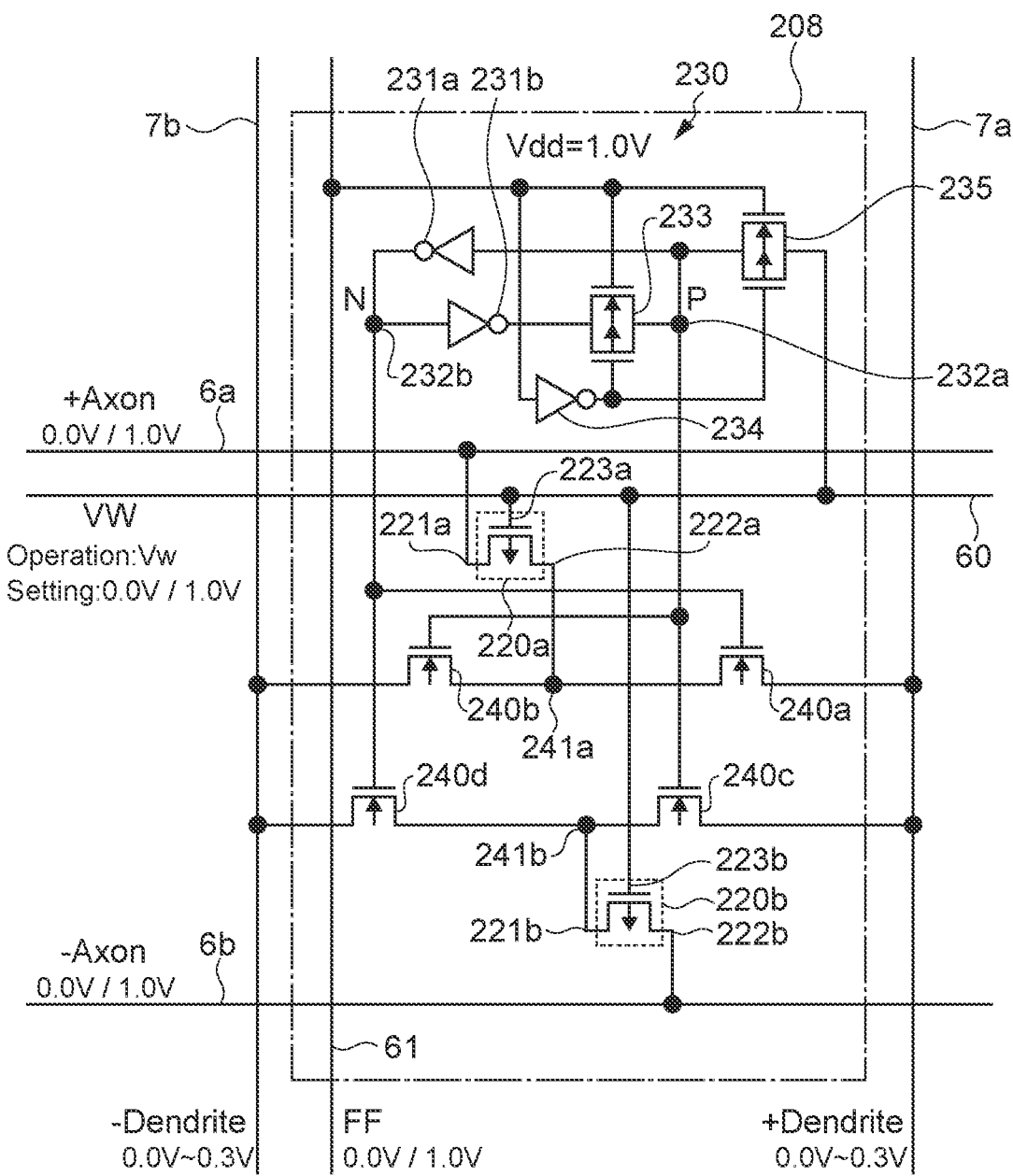
FIG. 16 is a circuit diagram showing a configuration example of the synapse circuit.

FIG. 16 is a circuit diagram showing a configuration example of the synapse circuit 208. In the following, the positive input signal line 6a will be referred to as the +Axon line 6a, and the negative input signal line 6b will be referred to as the −Axon line 6b. Further, the positive output line 7a will be referred to as the +Dendrite line 7a, and the negative output line 7b will be referred to as the −Dendrite line 7b.

The synapse circuits 208 each include a first MOS transistor 220a, a second MOS transistor 220b, first to fourth gates 240a to 240d, and a flip-flop circuit 230. Further, the ±Axon lines 6a and 6b, the ±Dendrite lines 7a and 7b, the operating voltage line 60, and the control line 61 are connected to the synapse circuit 208.

The first MOS transistor 220a and the second MOS transistor 220b are each a p-MOS that operates in the subthreshold region. As the MOS transistors 220a and 220b, for example, similar p-MOS transistors prepared on the basis of the same design parameters (gate width, gate length, etc.) are used.

The first MOS transistor 220a includes an input terminal 221a, an output terminal 222a, and a gate terminal 223a. The input terminal 221a is connected to the +Axon line 6a. The output terminal 222a is connected to a connection point 241a between a first gate 240a and a second gate 240b described below. The gate terminal 223b is connected to the operating voltage line 60. In this embodiment, the first MOS transistor 220a corresponds to the first weight unit connected to the first input line of the pair of input lines.

The second MOS transistor 220b includes an input terminal 221b, an output terminal 222b, and a gate terminal 223b. The input terminal 221b is connected to the Axon line 6. The output terminal 222b is connected to a connection point 241b between a third gate 240c and a fourth gate 240d described below. The gate terminal 223b is connected to the operating voltage line 60. In this embodiment, the second MOS transistor 220b corresponds to the second weight unit connected to the second input line of the pair of input lines.

The first to fourth gates 240a to 240d are each an n-MOS, and include an input terminal, an output terminal, and a gate terminal. For example, the gates 240a to 240d, which are n-MOSs, enter the ON state when a positive gate voltage is applied, and enter the OFF state in the case where the gate voltage is 0.

The input terminals of the first and second gates 240a and 240b are connected to each other via the connection point 241a. The output terminal 222a of the first MOS transistor 220a is connected to this connection point 241a. The output terminal and the gate terminal of the first gate 240a are respectively connected to the +Dendrite line 7a and a second terminal 232b of the flip-flop circuit 230. The output terminal and the gate terminal of the second gate 240b are respectively connected to the −Dendrite line 7b and a first terminal 232a of the flip-flop circuit 230.

The input terminals of the third and fourth gates 240c and 240d are connected to each other via the connection point 241b. The output terminal 222b of the second MOS transistor 220b is connected to this connection point 241b. The output terminal and the gate terminal of the third gate 240c are respectively connected to the +Dendrite line 7a and the first terminal 232a of the flip-flop circuit 230. The output terminal and the gate terminal of the fourth gate 240d are respectively connected to the −Dendrite line 7b and the second terminal 232b of the flip-flop circuit 230.

The flip-flop circuit 230 includes a first inverter 231a, a second inverter 231b, the first terminal 232a, and the second terminal 232b. Further, the flip-flop circuit 230 includes a setting gate 233, a setting inverter 234, and an inputting gate 235. The flip-flop circuit 230 is configured substantially similarly to the flip-flop circuit 230 described with reference to FIG. 11, for example.

Note that in the example shown in FIG. 16, a transmission gate configured using an n-MOS and a p-MOS is used as the inputting gate 235 instead of a p-MOS. The output of the setting inverter 234 is connected to the gate terminal of the p-MOS constituting the inputting gate 235, and the control line 61 is connected to the gate terminal of the n-MOS. Further, the first terminal 232a (the input side of the first inverter 231a) and the operating voltage line 60 are connected to each other via the signal line of the inputting gate 235.

The synapse circuit 208 shown in FIG. 16 is configured by using 16 MOS transistors. Further, eight wires (the ±Axon lines 6a and 6b, the ±Dendrite lines 7a and 7b, two power supply voltage lines, the operating voltage line 60, and the control line 61) are connected to the synapse circuit 208. In this configuration, the independent operating voltage line 60 and the independent control line 61 are used. This makes it possible to stably realize weight setting, a multiply-accumulate operation, and other processing, and realize a highly reliable arithmetic logic unit 200.

Figure 17:
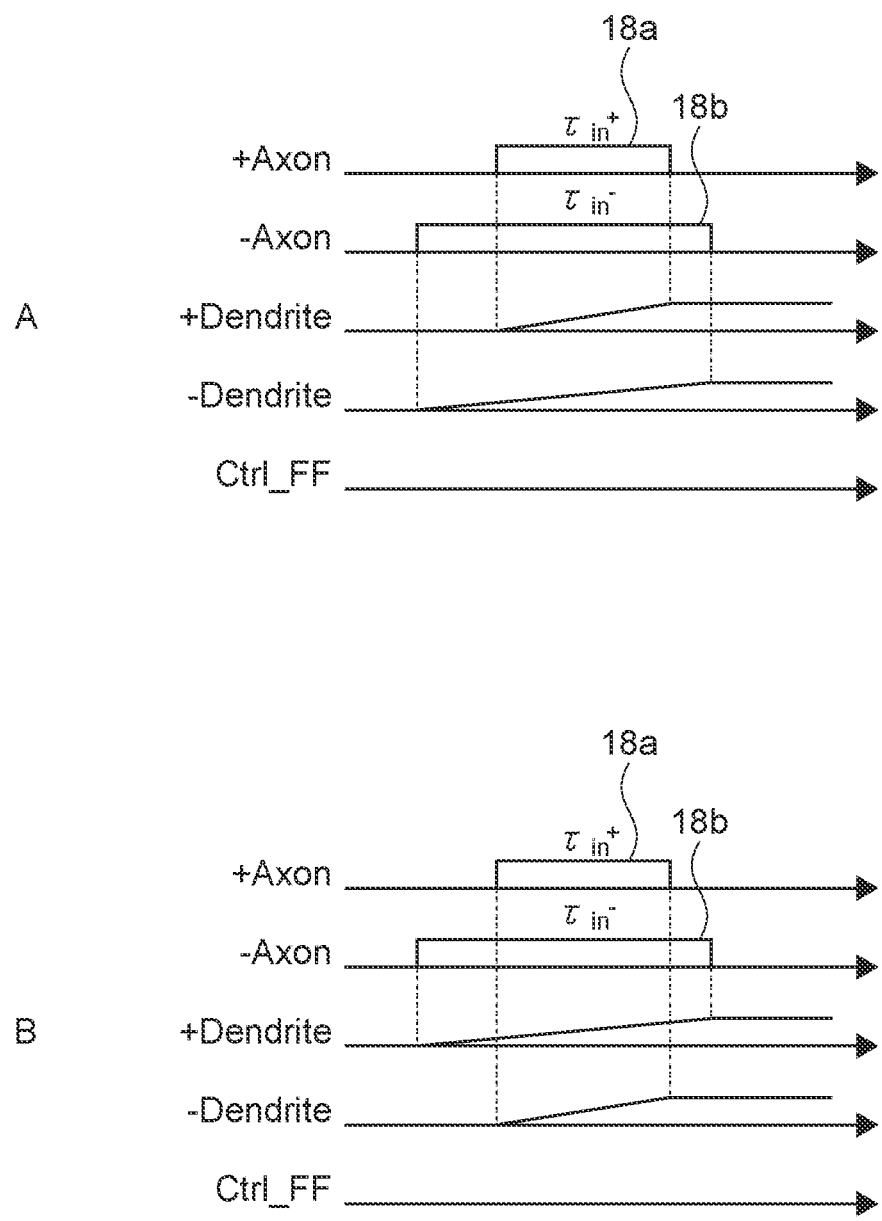
FIG. 17 is a timing chart showing an example of an operation of the synapse circuit.

FIG. 17 is a timing chart showing an example of an operation of the synapse circuits 208. Part A of FIG. 17 is a timing chart in the case where the positive weight value $w_i^+$ is set. Part B of FIG. 17 is a timing chart in the case where the negative weight value $w_i^-$ is set. In Part A of FIG. 17 and Part B of FIG. 17, waveforms of signals appearing in the +Axon line 6a, the −Axon line 6b, the +Dendrite line 7a, and the −Dendrite line 7b are schematically illustrated in order from the top.

In FIG. 17, the timing chart in the case where the PWM electrical signal is used is schematically shown. For example, the content described below can be applied to the case where a TACT electrical signal is used.

In this embodiment, either +α or −α is set as the weight value $w_i$ for one synapse circuit 208. That is, the state corresponding to ±α is set for the flip-flop circuit 230, and the state is held. The method of setting the state corresponding to ±α for the flip-flop circuit 230 is similar to the method described with reference to FIG. 11, for example. That is, a state (0/Vdd) set as the voltage P of the first terminal 232a is applied to the operating voltage line 60 in a state where a voltage of the same level as the power supply voltage Vdd is applied to the control line 61.

In the synapse circuit 208 shown in FIG. 16, for example, the voltage P of the first terminal 232a and the voltage N of the second terminal 232a are set to satisfy the relationship of (P, N)=(0, Vdd) as the state corresponding to the positive weight value +α. Further, as the state corresponding to the negative weight value −α, the voltage N and the voltage P are set to satisfy the relationship of (P, N)=(Vdd, 0).

For example, in the case where the positive weight value +α is set, the first gate 240a and the fourth gate 240d enter the ON state, and the second gate 240b and the third gate 240c enter the OFF state. Further, for example, in the case where the negative weight value −α is set, the second gate 240b and the third gate 240c enter the ON state, and the first gate 240a and the fourth gate 240d enter the OFF state.

When a multiply-accumulate operation is performed, a gate voltage Vw for operating the first and second MOS transistors 220a and 240b in the subthreshold region is applied to the operating voltage line 60. Further, the ±Dendrite lines 7a and 7b are configured to be sufficiently lower than a power supply voltage Vth, for example.

As shown in Part A of FIG. 17, assumption is made that an electrical signal 18a of a pulse width $\tau_{in}^+$ is input to the +Axon line 6a in the synapse circuit 208 for which the positive weight value +α is set. The electrical signal 18a is input to the first MOS transistor 220a, and charges (current) corresponding to a weight value α are generated by the first MOS transistor 220a. The generated charges are input to the connection point 241a and output to the +Dendrite line 7a from the first gate 240a, which has been in the ON state. As a result, the potential of the +Dendrite line 7a increases over the period similar to the pulse width $\tau_{in}^+$.

Further, assumption is made that an electrical signal 18b of a pulse width $\tau_{in}^-$ to the −Axon line 6b. The electrical signal 18b is input to the second MOS transistor 220b, and charges (current) corresponding to the weight value α are generated by the second MOS transistor 220b. The generated charges are input to the connection point 241b, and output to the −Dendrite line 7b from the fourth gate 240b, which has been in the ON state. As a result, the potential of the −Dendrite line 7b increases over the period similar to the pulse width $\tau_{in}^-$.

Meanwhile, in the case where the negative weight value −α is set, charges input from the first MOS transistor 220a to the connection point 241a are output to the −Dendrite line 7b from the second gate 240b, which has been in the ON state. Similarly, charges input from the second MOS transistor 220b to the connection point 241b are output to the +Dendrite line 7b from the third gate 240c, which has been in the ON state.

As a result, as shown in Part B of FIG. 17, in the synapse circuit 208 for which the negative weight value −α is set, the potential of the −Dendrite line 7b increases over the period similar to the pulse width $\tau_{in}^+$, and the potential of the +Dendrite line 7a increases over the period similar to the pulse width $\tau_{in}^-$.

Therefore, in the synapse circuit 208, the connection destination of the ±Axon lines 6a and 6b is switched in accordance with the sign of the weight value ±α. That is, in the case where the positive weight value +α is set, the +Axon line 6a and the +Dendrite line 7a are connected to each other, and the −Axon line 6a and the −Dendrite line 7a are connected to each other. Further, in the case where the negative weight value −α is set, the +Axon line 6a and the −Dendrite line 7b are connected to each other, and the −Axon line 6a and the +Dendrite line 7a are connected to each other.

Thus, the first and second gates 240a and 240b output, on the basis of the binary state, charges generated by the first MOS transistor 220a to one of the ±Dendrite lines 7a and 7b. Further, the second and third gates 240a and 240b output, on the basis of the binary state, charges generated by the second MOS transistor 220b to the other of the ±Dendrite lines 7a and 7b. In the synapse circuits 208, the first and second gates

240a and 240b correspond to the first switch unit, and the third and fourth gates 240c and 240d correspond to the second switch unit.

Figure 18:
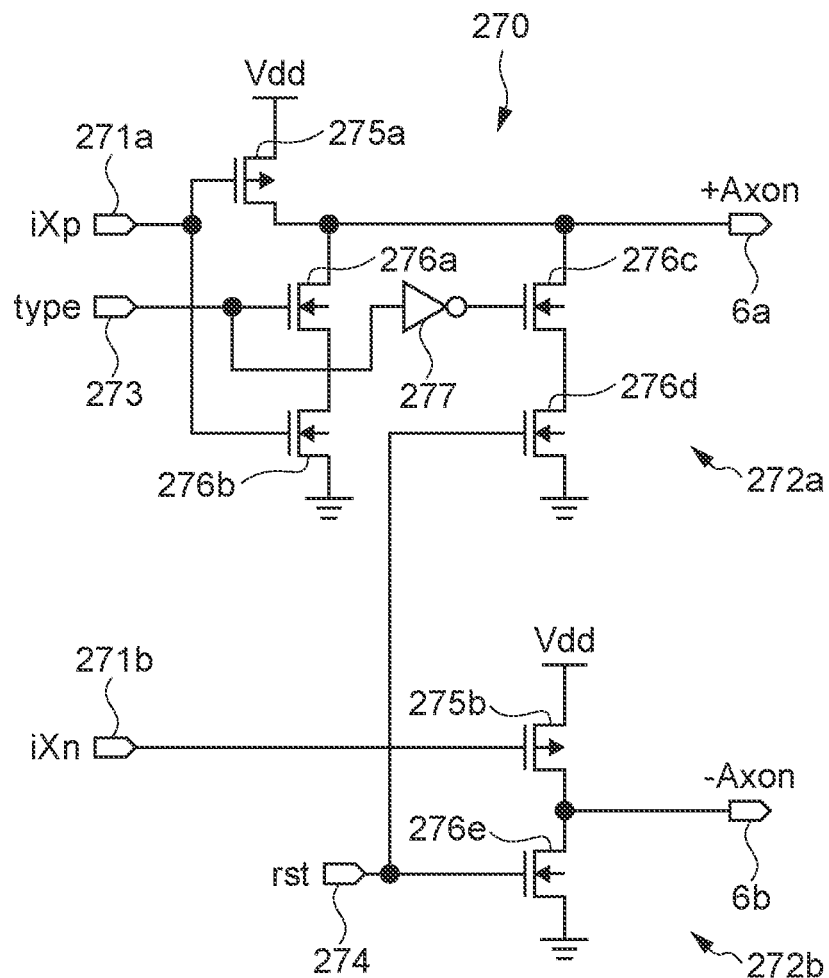
FIG. 18 is a circuit diagram showing an example of an input circuit that inputs an electrical signal to ±Axon lines.

FIG. 18 is a circuit diagram showing an example of an input circuit that inputs an electrical signal to the ±Axon lines 6a and 6b. An input circuit 270 includes a positive input signal terminal 271a, a negative input signal terminal 271b, a positive input signal circuit 272a, a negative input signal circuit 272b, a type input terminal 273, and a reset terminal 274.

A positive input signal iXp representing the positive signal value $x_i^+$ output from the circuit in the preceding stage, and a negative input signal iXn representing the negative signal value $x_i^-$ are respectively input to the positive and negative input signal terminals 271a and 271b. As will be described below, in the input circuit 270, either the TACT system or the PWM system is used as the system of the input signal (electrical signal) (see FIG. 19).

The positive input signal circuit 272a includes a first p-MOS 275a, first to fourth n-MOSs 276a to 276d, and an inverter 277. The gate terminal of the first p-MOS 275a is connected to the positive input signal terminal 271a. Further, one terminal of the first p-MOS 275a is connected to a power source voltage, and the other terminal is connected to the +Axon line 6a.

The gate terminal, one terminal, and the other terminal of the first n-MOS 276a are respectively connected to the type input terminal 273, the +Axon line 6a, and one terminal of the second n-MOS 276b. The gate terminal and the other terminal of the second n-MOS 276b are respectively connected to the positive input signal terminal 271a and a GND. Therefore, the first and second n-MOSs 276a and 276b are connected in series between the +Axon line 6a and the GND in the stated order.

The gate terminal, one terminal, and the other terminal of the third n-MOS 276c are respectively connected to the output side of the inverter 277, the +Axon line 6a, and one terminal of the fourth n-MOS 276d. Further, the type input terminal 273 is connected to the input side of the inverter 277. The gate terminal and the other terminal of the fourth n-MOS 276b are respectively connected to the reset terminal 274 and a GND. Therefore, the third and fourth n-MOSs 276c and 276d are connected in series between the +Axon line 6a and the GND in the stated order.

The negative input signal circuit 272b includes a second p-MOS 275b and a fifth n-MOS 276e. The gate terminal of the second p-MOS 275b is connected to the negative input signal terminal 271b. Further, one terminal and the other terminal of the second p-MOS 275b are respectively connected to a power supply voltage and the −Axon line 6b. The gate terminal, one terminal, and the other terminal of the fifth n-MOS 276e are respectively connected to the reset terminal 274, the −Axon line 6b, and a GND.

Figure 19:
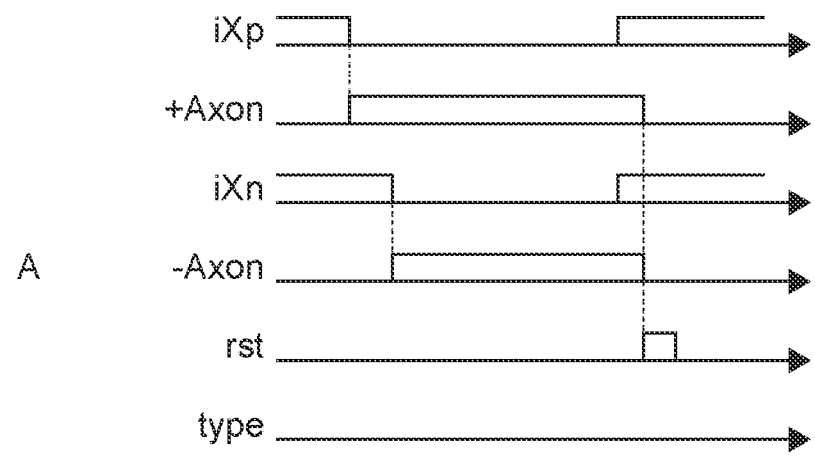
FIG. 19 is a timing chart showing an example of an operation of the input circuit.
Figure 19:
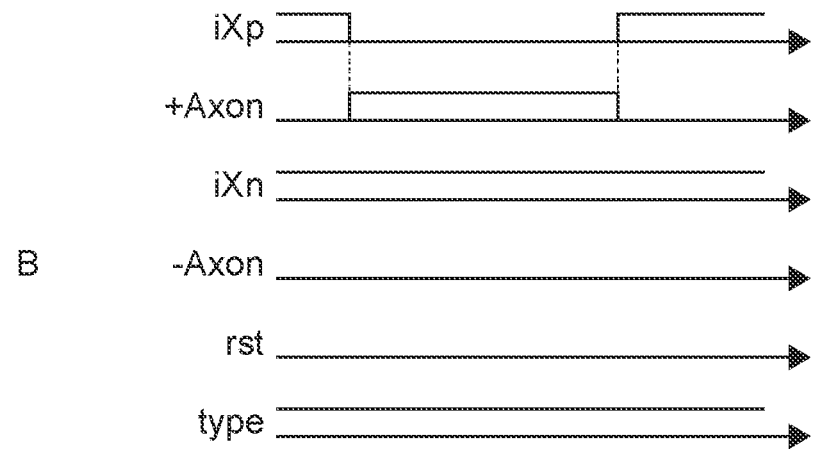

FIG. 19 is a timing chart showing an example of an operation of the input circuit 270. In Part A of FIG. 19 and Part B of FIG. 19, the timing charts in the case where a TACT electrical signal and a PWM electrical signal are used, respectively, are shown. Further, in the example shown in FIG. 19, in the positive and negative input signals iXp and iXn, the signal value $x_i$ is represented by a period of a low voltage (e.g., zero voltage). That is, each input signal is input as a low-voltage pulse.

As shown in Part A of FIG. 19, in the TACT system, the voltage of the type input terminal 273 is set to 0 (Type=0). In this case, the third n-MOS 276c of the positive input signal circuit 272a maintains the ON state. Note that in the positive input signal circuit 272a, the second n-MOS 276b enters the ON state in the case where a low-voltage pulse is not input, i.e., the positive input signal terminal 271a is at a high voltage.

When a low-voltage pulse is input to the positive input signal terminal 271a, the first p-MOS 275a enters the ON state, and the +Axon line 6a has a positive voltage according to the power supply voltage Vdd. At this time, the input capacitance of the first p-MOS 275a, the parasitic capacitance of the +Axon line 6a, and the like are charged. Note that the +Axon line 6a is not connected to the GND while a low-voltage pulse is input because the first, second, and fourth n-MOSs 276a, 276b, and 276d are in the OFF state.

Further, when a low-voltage pulse is input to the negative input signal terminal 271b, the second p-MOS 275b enters the ON state, and the −Axon line 6a has a positive voltage corresponding to the power supply voltage Vdd. At this time, the input capacitance of the second p-MOS 275b, the parasitic capacitance of the −Axon line 6b, and the like are charged. Note that the fifth n-MOS 276e is in the OFF state, and the −Axon line 6b is not connected to the GND.

Thus, in the case where Type=0 is set, the input capacitances of the first and second p-MOS 275a and 275b, and the like are charged when a low-voltage pulse is input. Therefore, even after each of the input signal terminals 271a and 271b has had a positive voltage, a positive voltage corresponding to the power supply voltage Vdd is applied to the ±Axon lines 6a and 6b. As a result, after the timing of inputting the low-voltage pulse, it is possible to generate a TACT electrical signal that continuously maintains a high-voltage state.

When a predetermined positive voltage pulse (reset signal) is input to the reset terminal 274, the fourth n-MOS 276d and the fifth n-MOS 276e enter the ON state. In this case, for example, in the positive input signal circuit 272a, a path connecting the third n-MOS 276c and the fourth n-MOS 276d to each other is conducted, and the +Axon line 6a is connected to the GND. As a result, the input capacitance of the first p-MOS 275a, the parasitic capacitance of the +Axon line 6a, and the like are discharged, and the voltage of the +Axon line 6a is 0.

Similarly, in the negative input signal circuit 272b, the −Axon line 6a is connected to the GND via the fifth n-MOS 276e. As a result, the input capacitance of the second p-MOS 275b, the parasitic capacitance of the −Axon line 6b, and the like are discharged, and the voltage of the −Axon line 6b is 0.

The reset signal is input, for example, before the timing when the next input signal is input. The timing when the reset signal is input is not limited. For example, the reset signal may be input as appropriate, for example, in accordance with the timing when one multiply-accumulate operation processing has been finished, the timing when the subsequent multiply-accumulate operation processing is started, or the like.

As shown in Part B of FIG. 19, in the PWM system, the voltage of the type input terminal 273 is set to 1 (positive voltage) (Type=1). Note that in the example shown in Part B of FIG. 19, the positive input signal terminal 271b (positive input signal iXn), the −Axon line 6b, and the reset terminal 274 are not used.

When Type=1 is set, the first n-MOS 276a of the positive input signal circuit 272a is kept to be in the ON state. Further, in the case where a low-voltage pulse is not input, the second n-MOS 276b enters the ON state. In this case, the +Axon line 6a is connected to the GND.

When a low-voltage pulse is input to the positive input signal terminal 271a, the first p-MOS 275a enters the ON state and the second n-MOS 276b enters the OFF state. Therefore, the +Axon line 6a is disconnected from the GND and has a positive voltage corresponding to the power supply voltage Vdd. The state of the positive voltage of the +Axon line 6a continues for a period similar to the pulse width of the low voltage pulse.

When the input of the low-voltage pulse is finished and the voltage of the positive input signal terminal 271a increases, the first p-MOS 275a enters the OFF state and the second n-MOS 276b enters the ON state. As a result, the +Axon line 6a is re-connected to the GND, and the voltage thereof is 0. Thus, by setting Type=1, it is possible to generate a PWM electrical signal having the pulse width similar to the low-voltage pulse.

As described above, the input circuit 270 is capable of switching and generating a TACT electrical signal and a PWM electrical signal. Note that as the input circuit 270, for example, a circuit for generating either a TACT electrical signal or a PWM electrical signal may be used. In addition, the specific configuration of the input circuit 270 is not limited, and may be appropriately configured so that a desired electrical signal can be output depending on, for example, the system of the electrical signal to be used.

Figure 20:
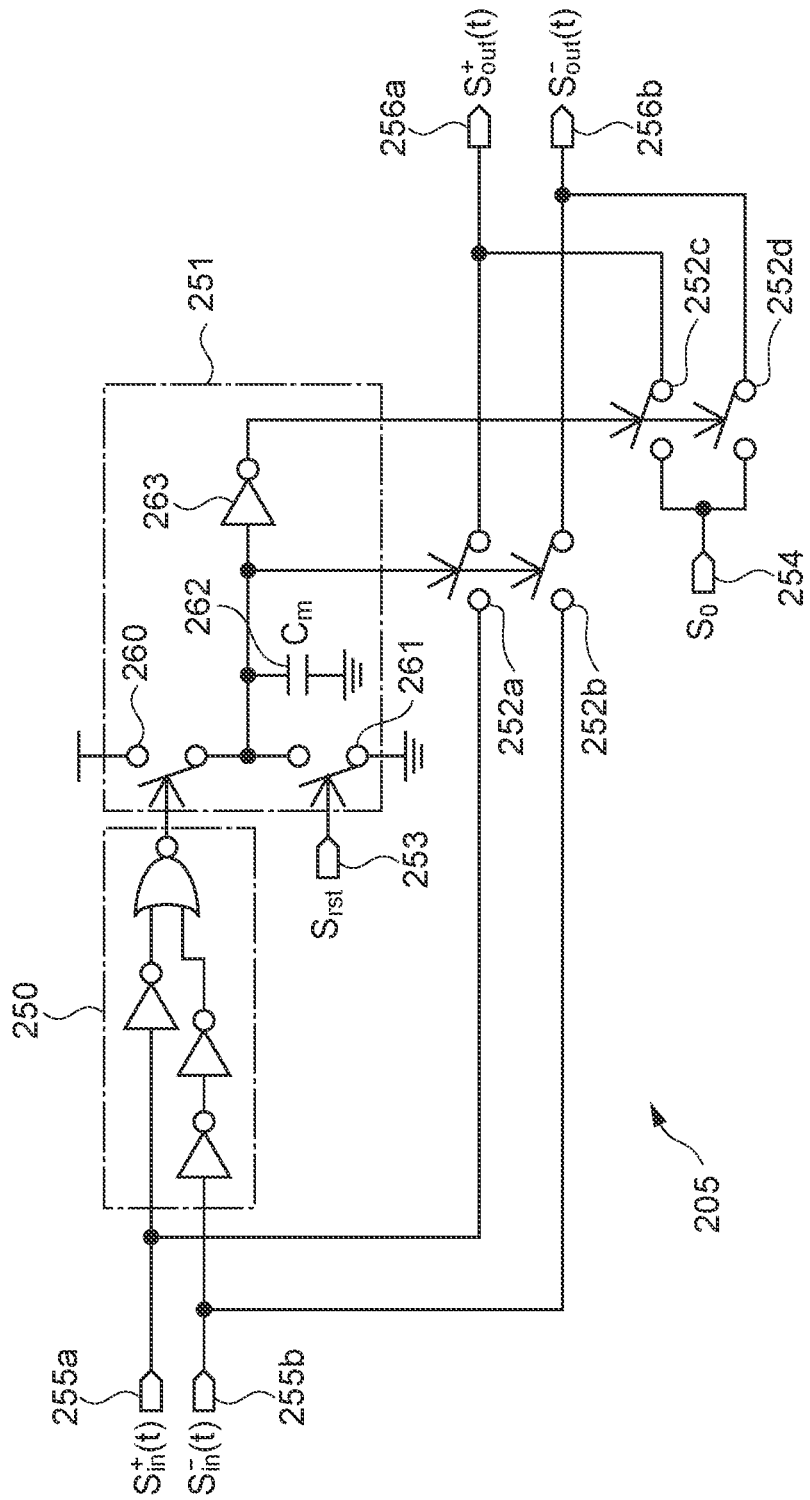
FIG. 20 is a circuit diagram showing an example of the function circuit that implements the ReLU function.

FIG. 20 is a circuit diagram showing an example of the function circuit 205 that implements a ReLU function. FIG. 20 shows the two-input two-output function circuit 205 for realizing the ReLU function corresponding to the TACT electrical signal. The function circuit 205 is applied to, for example, the arithmetic logic unit 200 shown in FIG. 12 and FIG. 14.

The function circuit 205 includes a ReLU circuit 250, a switch control circuit 251, first to fourth switches 252a to 252d, a reset terminal 253, and a zero input terminal 254. Further, the function circuit 205 includes positive and negative input terminals 255a and 255b and positive and negative output terminals 256a and 256b.

The ReLU circuit 250 is configured in the same manner as the function circuits 5a and 5b shown in Part A of FIG. 9 and Part B of FIG. 9, for example, and is connected to the positive and negative input terminals 255a and 255b. The positive multiply-accumulate signal $S_{in}^+(t)$ and the negative multiply-accumulate signal $S_{in}^-(t)$ are respectively input from the positive and negative input terminals 255a and 255b to the ReLU circuit 250. In the ReLU circuit 250, a positive voltage is output in the case where, for example, $S_{in}^+(t)$ is input at the timing earlier than $S_{in}^-(t)$ (in the case where the entire multiply-accumulate result is greater than 0) (see FIG. 10).

The switch control circuit 251 includes a charging switch 260, a discharging switch 261, a capacitive element 262, and an inverter 263. One side, the other side, and the control terminal of the charging switch 260 are respectively connected to a power supply voltage line, one side of the discharging switch 261, and the output side of the ReLU circuit 250. The other side and the control terminal of the discharging switch 261 are connected to a GND and the reset terminal 253.

Further, the connection point between the charging switch 260 and the discharging switch 261 is connected to the input side of the inverter 263. The capacitive element 262 is a capacitor that operates as a digital memory, for example, and is connected between the input side of the inverter 263 and the GND.

The first switch 252a is connected between a positive input terminal 255a and a positive output terminal 256a. The second switch 252b is connected between a negative input terminal 255b and a negative output terminal 256b. Further, the control terminal of each of the first and second switches 252a and 252b is connected to the input side of the inverter 263.

The third switch 252c is connected between the zero input terminal 254 and the positive output terminal 256a. The fourth switch 252d is connected between the zero input terminal 254 and the negative output terminal 256b. Further, the control terminal of each of the third and fourth switches 252c and 252d is connected to the output side of the inverter 263.

When the positive multiply-accumulate signal $S_{in}^-(t)$ and the negative multiply-accumulate signal $S_{in}^-(t)$ are input, the ReLU circuit 250 outputs the signal corresponding to the sign of the entire multiply-accumulate result. For example, in the case where the entire multiply-accumulate result is larger than 0, a positive voltage is output from the ReLU circuit 250. As a result, the charging switch 260 enters the ON state, and predetermined charges are accumulated in the capacitive element 262.

When charges are accumulated in the capacitive element 262, the potential of the input side of the inverter 263 increases. As a result, the first and second switches 252a and 252b enter the ON state. Thus, in the case where the entire multiply-accumulate result is greater than or equal to 0, the positive and negative input terminals 255a and 255b and the positive and negative output terminals 256a and 256b are connected to each other. Note that the third and fourth switches 252c and 252d connected to the output side of the inverter 263 enter the OFF state.

The input side of the inverter 263 is maintained at a high potential while charges are accumulated in the capacitive element 262. Therefore, for example, even in the case where the output of the ReLU circuit 250 is 0, the first and second switches 252a and 252b are maintained in the ON state. As a result, a positive multiply-accumulate signal $S_{out}^+(t)=S_{in}^+(t)$ and a negative multiply-accumulate signal $S_{out}^-(t)=S_{in}^-(t)$ are output directly from the positive and negative output terminals 256a and 256b.

Note that the capacitive element 262 is reset to the Low level every time the operation is performed. For example, the discharging switch 261 is switched to the ON state by the reset signal input to the reset terminal 253. As a result, charges accumulated in the capacitive element 262 can be discharged to the GND. The timing when the reset signal is input, and the like are not limited, and the reset signal may be input as appropriate, for example, so that the multiply-accumulate operation can be appropriately executed.

Further, in the case where the entire multiply-accumulate result is 0 or less, the output of the ReLU circuit 250 is 0. In this case, charging or the like to the capacitive element 262 is not performed, and the input side of the inverter 263 has a low potential. Therefore, the first and second switches 252a and 252b are maintained in the OFF state. Meanwhile, the output-side of the inverter 263 has a high potential, and the third and fourth switches 252c and 252d enter the ON state.

As a result, the positive and negative output terminals 256a and 256b are connected to the zero input terminal 254. From the zero input terminal 254, for example, a signal $S_0$ representing the timing of zero is output. As a result, the positive multiply-accumulate signal $S_{out}^+(t)=S_0$ and the negative multiply-accumulate signal $S_{out}^-(t)=S_0$ are respectively output from the positive and negative output terminals 256a and 256b.

Thus, the function circuit 205 is a circuit that implements a ReLU function for the two inputs. Note that the specific configuration of the function circuit 205 is not limited. For example, an arbitrary circuit that is capable operating as a ReLU function for the positive and negative multiply-accumulate signals $S_{in}^+(t)$ and $S_{in}^-(t)$ may be used. Further, for example, a circuit that implements an activation function other than the ReLU function may be used.

Figure 21:
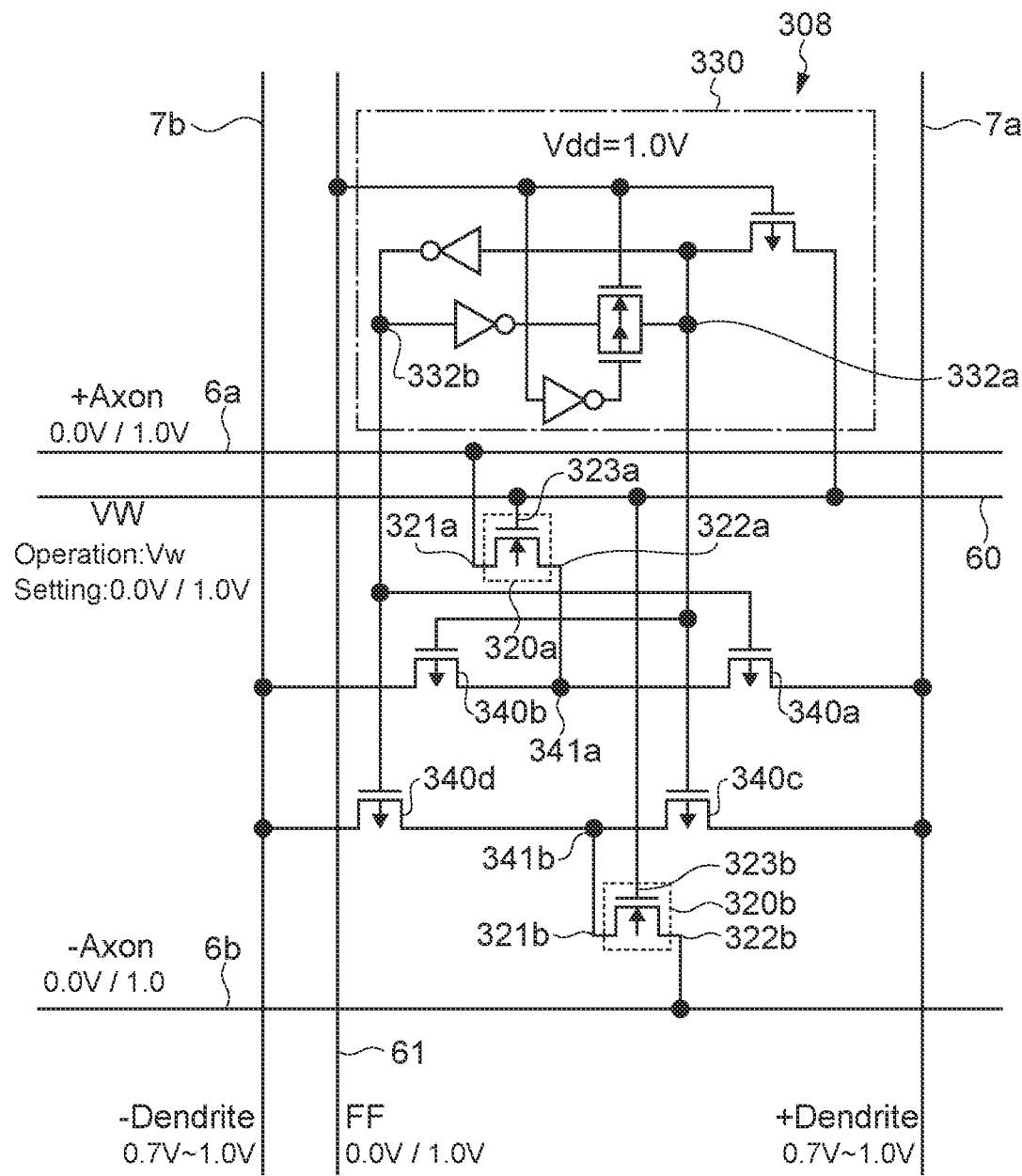
FIG. 21 is a circuit diagram showing another configuration example of the synapse circuit.

FIG. 21 is a circuit diagram showing another configuration example of the synapse circuit. A synapse circuit 308 includes a first MOS transistor 320a, a second MOS transistor 320b, first to fourth gates 340a to 340d, and a flip-flop circuit 330. The flip-flop circuit 330 is configured similarly to the flip-flop circuit 130 described with reference to FIG. 11, for example.

The synapse circuit 308 is different from the synapse circuit 208 described with reference to FIG. 16 in the type of MOS used as the first and second MOS transistors 320a and 320b and the type of MOS used as the first to fourth gates 340a to 340d. Specifically, in the synapse circuit 308 shown in FIG. 21, an n-MOS that operates in a subthreshold region is used as the first and second MOS transistors 320a and 320b. Further, a p-MOS is used as the first to fourth gates 340a to 340d.

In the synapse circuit 308, for example, the voltage P of a first terminal 332a and the voltage N of a second terminal 332b are set to satisfy the relationship of (P, N)=(Vdd, 0) as the state corresponding to the positive weight value $+\alpha$. Further, the voltage P and the voltage N are set to satisfy the relationship of (P, N)=(0, Vdd) as the state corresponding to the negative weight value $-\alpha$. Note that in the example shown in FIG. 21, the power supply voltage Vdd is set to 1.0 V.

For example, in the case where the positive weight value $+\alpha$ is set, a gate voltage=0 is applied to the first gate 340a and the fourth gate 340d, and the gates enter the ON state. At this time, a gate voltage=Vdd is applied to the second gate 340b and the third gate 340c, and the gates enter the OFF state. Further, for example, in the case where the negative weight value $-\alpha$ is set, the second gate 340b and the third gate 340c enter the ON state and the first gate 340a and the fourth gate 340d enter the OFF state.

When performing a multiply-accumulate operation, the operation voltage Vw (0.0 to 1.0 V) for causing the first and second MOS transistors 320a and 320b to operate in the subthreshold region is applied to the operating voltage line 60. Further, the ±Dendrite lines 7a and 7b are configured to be in a high-voltage state (e.g., 0.7 to 1.0 V) with the upper limit of the power supply voltage Vth, for example. Further, the electrical signal represented by the voltage of 0.0 V or 1.0 V is input to the ±Axon lines 6a and 6b.

In the state where either the positive weight value $+\alpha$ or the negative weight $-\alpha$ is set, for example, an output terminal 322a of the first MOS transistor 320a is connected to either the +Dendrite line 7a or the −Dendrite line 7b. Therefore, the voltage of the output terminal 322a (drain) is higher than that of an input terminal 321b (source). For example, in the case where the voltage of an input terminal 321a is 0 V, the voltage between a gate terminal 323a and the input terminal 321a, i.e., a gate voltage $V_{gs}$, is Vw, and enters the ON state in the subthreshold region. Further, for example, in the case where the voltage of the input terminal 321a is Vw, the gate voltage $V_{gs}$ is 0 V and the first MOS transistor 320a enters the OFF state.

In the case where the first MOS transistor 320a enters the ON state, current flows from the output terminal 322a (drain) to the input terminal 321b (source). That is, electrons (negative charges), which are carriers of the n-MOS, are output from the input terminal 321a (source) to the output terminal 322b (drain). Note that the amount of negative charges to be output can be set by using the conduction resistance R. As a result, for example, it is possible to generate charges (negative charges) corresponding to the set weight value $+\alpha$. This also applies to the second MOS transistor 320b. In the following, the negative charges output from the first and second MOS transistors 320a and 320b will be referred to simply as charges.

Therefore, in the synapse circuit 308, an electrical signal representing the signal value $x_i$ in the state where the voltage is 0 is used. That is, low-voltage pulses (see FIG. 19) are input to the ±Axon lines 6a and 6b. The low-voltage pulses can be generated by, for example, appropriately configuring the input circuit 270.

For example, in the case where the positive weight value $+\alpha$ is set, charges input from the first MOS transistor 320a to a connection point 341a are output from the first gate 340a, which has been in the ON state, to the +Dendrite line 7a. Similarly, charges input to a connection point 341b from the second MOS transistor 320b are output from the fourth gate 340d, which has been in the ON state, to the −Dendrite line 7b.

Further, for example, in the case where the negative weight value $-\alpha$ is set, charges input from the first MOS transistor 320a to the connection point 341a are output from the second gate 340b, which has been in the ON state, to the −Dendrite line 7b. Similarly, charges input from the second MOS transistor 320b to the connection point 341b are output from the third gate 340c, which has been in the ON state, to the +Dendrite line 7b.

For example, charges (negative charges) output to the ±Dendrite line 7 by the respective synapse circuits 308 are accumulated in the capacitor or the like, and the accumulation amount is detected. Note that the method of detecting the amount of accumulated negative charges is not limited. For example, it is possible to calculate positive and negative multiply-accumulate results and the entire multiply-accumulate result on the basis of the detected accumulation amount. As described above, even in the case where an n-MOS is used as the first and second MOS transistors 320a and 320b, it is possible to appropriately execute a multiply-accumulate operation.

The synapse circuit 308 shown in FIG. 21 is configured by using 15 MOS transistors. Further, eight wires (the ±Axon lines 6a and 6b, the ±Dendrite lines 7a and 7b, the two power supply voltage lines, the operating voltage line 60, and the control line 61) are connected to the synapse circuit 308. By using the independent operating voltage line 60 and the independent control line 61, it is possible to stably realize weight setting, a multiply-accumulate operation, and other processing even in the case where an n-MOS is used as a weight.

Figure 22:
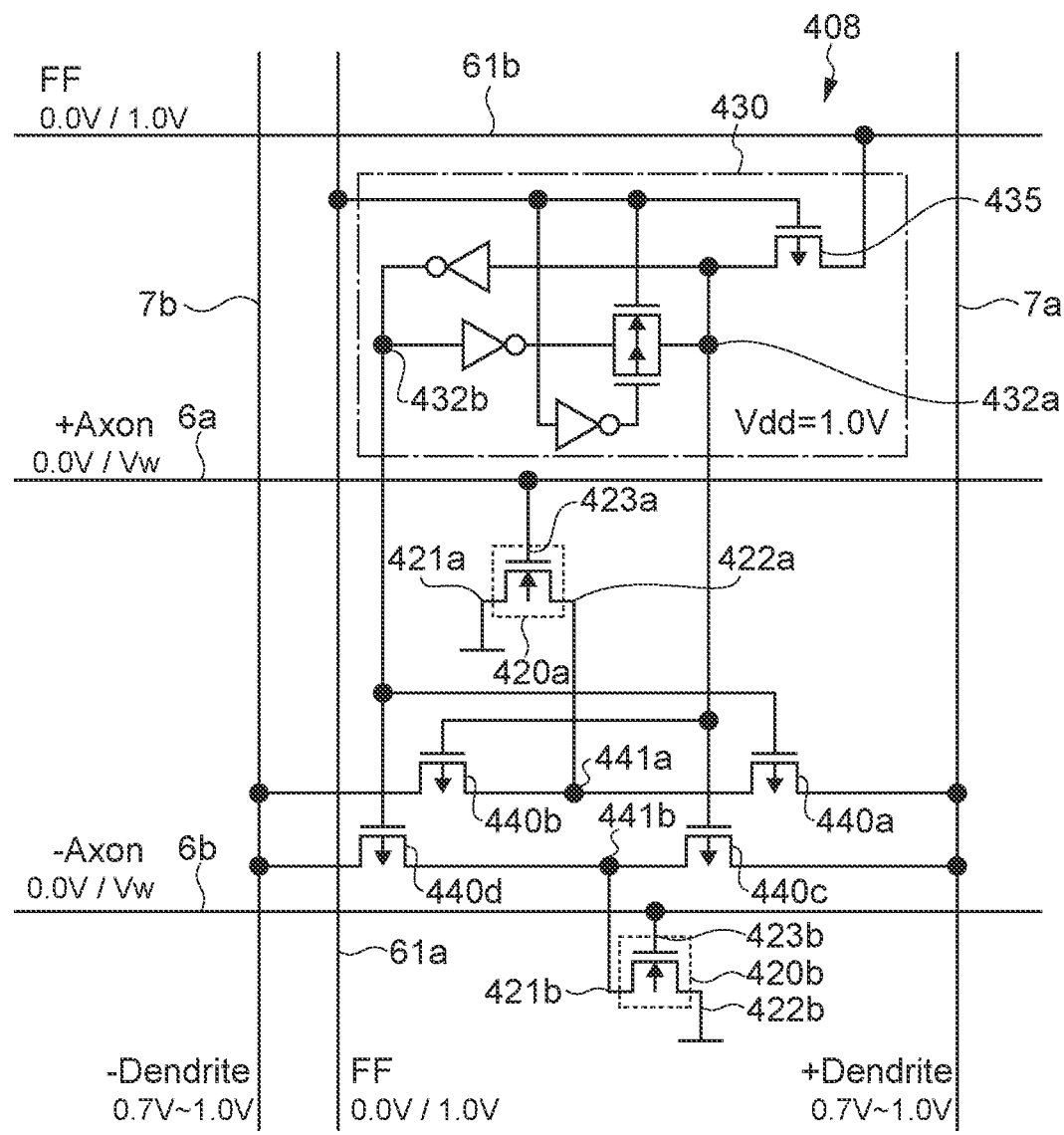
FIG. 22 is a circuit diagram showing another configuration example of the synapse circuit.

FIG. 22 is a circuit diagram showing another configuration example of the synapse circuit. A synapse circuit 408 includes a first MOS transistor 420a, a second MOS transistor 420b, first to fourth gates 440a to 440d, and a flip-flop circuit 430. Further, the ±Axon lines 6a and 6b, the ±Dendrite lines 7a and 7b, a first control line 61a, and a second control line 61b are connected to the synapse circuit 408.

The first to fourth gates 440a to 440d are configured in the same manner as those of the synapse circuit 308 described with reference to FIG. 21, for example. Further, the flip-flop circuit 430 is configured in the same manner as the flip-flop circuit 130 described with reference to FIG. 11, for example. Note that an inputting gate 435 of the flip-flop circuit 430 is connected to the second control line 61b. The first and second control lines 61a and 61b are used for setting the weight values $\pm\alpha$ and the like.

A first MOS transistor 420 is an n-MOS that operates in a subthreshold region, and includes an input terminal 421*a*, an output terminal 422*a*, and a gate terminal 423*a*. The input terminal 421*a* is connected to a GND. The output terminal 422*a* is connected to a connection point 441*a* between the first gate 440*a* and the second gate 440*b*. The gate terminal 423*a* is connected to the +Axon line 6*a*. In this embodiment, the first MOS transistor 420*a* corresponds to the first weight unit.

A second MOS transistor 420 is an n-MOS that operates in a subthreshold region, and includes an input terminal 421*b*, an output terminal 422*b*, and a gate terminal 423*b*. The input terminal 421*b* is connected to a GND. The output terminal 422*b* is connected to a connection point 422*b* between the third gate 440*c* and the fourth gate 440*d*. The gate terminal 423*b* is connected to the −Axon line 6*b*. In this embodiment, the second MOS transistor 420*b* corresponds to the second weight unit.

As described above, the input terminals 421*a* and 421*b* of the first and second MOS transistors 420*a* and 420*b* are connected to GNDs. Further, the output terminals 422*a* and 422*b* are connected to one of the ±Dendrite lines 7*a* and 7*b* via the respective gates. Thus, the input terminals 421*a* and 421*b* are the source side where the voltage is lower, and the output terminals 422*a* and 422*b* are the drain side.

Note that the present technology is not limited to the case where the input terminals 421*a* and 421*b* are connected to the GNDs. For example, the input terminals 421*a* and 421*b* may be connected to a constant voltage source or the like in which the voltage is set so that the multiplying processing can be properly executed. In this embodiment, the GND corresponds to the predetermined constant voltage source.

In the synapse circuit 408, for example, the voltage P of a first terminal 432*a* and the voltage N of a second terminal 432*b* are set to satisfy the relationship of (P, N)=(Vdd, 0) as the state corresponding to the positive weight value +α. Further, the voltage P and the voltage N are set to satisfy the relationship of (P, N)=(0, Vdd) as the state corresponding to the negative weight value −α. Note that in the case shown in FIG. 22, the power supply voltage Vdd is set to 1.0 V.

When performing a multiply-accumulate operation, the ±Dendrite lines 7*a* and 7*b* are set to a high-voltage state with the power supply voltage Vdd as the upper limit, for example. This increases the voltage of the connection points 441*a* and 441*b*, and the first and second MOS transistors 420*a* and 420*b* enter the state where the drain voltage (voltage between the output terminal and the input terminal) is applied.

In this state, the voltages of the gate terminals 423*a* and 423*b* of the first and second MOS transistors 420*a* and 420*b* are controlled by the electrical signal flowing through the ±Axon lines 6*a* and 6*b*. For example, in the case where the voltage of the +Axon line 6*a* is 0, the gate voltage $V_{gs}$ is 0 and the first MOS transistor 420*a* enters the OFF state. Further, for example, in the case where the voltage of the +Axon line 6*a* is Vw, the gate voltage $V_{gs}$ is Vw, and the first MOS transistor 420*a* enters the ON state in the subthreshold region. This also applies to the second MOS transistor 420*b*.

Therefore, in the synapse circuit 408, an electrical signal representing the signal value $x_i$ in the state where the voltage is Vw is used. This allows the first and second MOS transistors 420*a* and 420*b* to generate charges corresponding to the multiplication value of the signal value $x_i$ and the weight value α on the basis of the electrical signal.

For example, in the case where the positive weight value +α is set, charges generated by the first MOS transistor 420*a* are output from the first gate 440*a* to the +Dendrite line 7*a*. Similarly, charges generated by the second MOS transistor 420*b* are output from the fourth gate 440*d* to the −Dendrite line 7*b*.

Further, for example, in the case where the negative weight value −α is set, charges generated by the first MOS transistor 420*a* are output from the second gate 440*b* to the −Dendrite line 7*b*. Similarly, charges generated by the second MOS transistor 420*b* are output from the third gate 440*c* to the +Dendrite line 7*a*.

The synapse circuit 408 shown in FIG. 22 is configured by using 15 MOS transistors. Further, eight wires (the ±Axon lines 6*a* and 6*b*, the ±Dendrite lines 7*a* and 7*b*, the two power supply voltage line, and the first and second control lines 61*a* and 61*b*) are connected to the synapse circuit 408. In this configuration, since the source side of each of the MOS transistors 420*a* and 420*b* is wired to a GND, it is possible to configure the source-side wiring thicker and suppress the wiring resistance or the like. Further, the source and the substrate (GND side) are locally connected to each other, so that the potential on the source side can be stabilized, and, for example, a multiply-accumulate operation can be stably executed.

Figure 23:
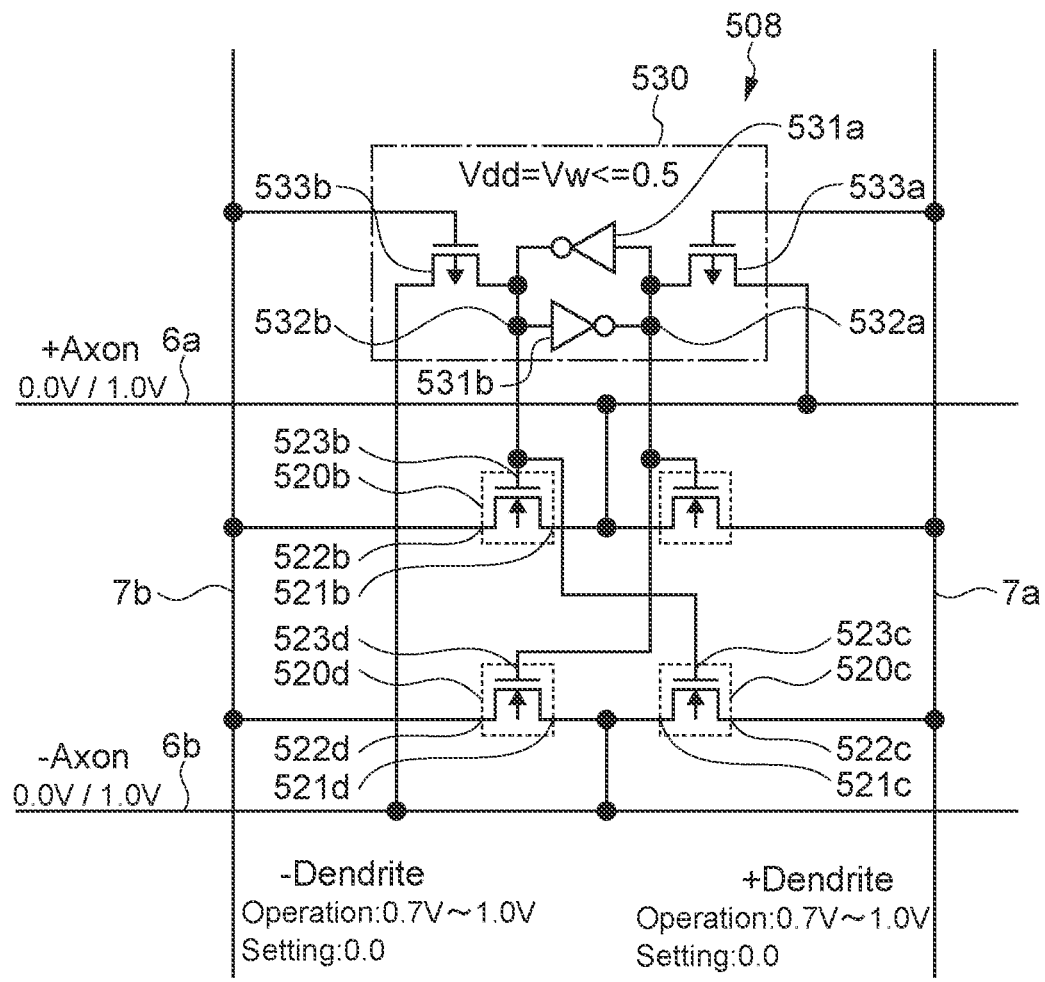
FIG. 23 is a circuit diagram showing another configuration example of the synapse circuit.

FIG. 23 is a circuit diagram showing another configuration example of the synapse circuit. A synapse circuit 508 includes first to fourth MOS transistors 520*a* to 520*d* and a flip-flop circuit 530. Further, the ±Axon lines 6*a* and 6*b* and the ±Dendrite lines 7*a* and 7*b* are connected to the synapse circuit 508.

The first to fourth MOS transistors 520*a* to 520*d* are each an n-MOS that operates in a subthreshold region, and are configured similarly to each other. The first to fourth MOS transistors 520*a* to 520*d* respectively include input terminals 521*a* to 521*d*, output terminals 522*a* to 522*d*, and gate terminals 523*a* to 523*d*.

The input terminal 521*a* of the first MOS transistor 520*a* is connected to the +Axon line 6*a*. The output terminal 522*a* is connected to the +Dendrite line 7*a*. The gate terminal 523*a* is connected to a first terminal 532*a* of the flip-flop circuit 530. The input terminal 521*b* of the second MOS transistor 520*b* is connected to the +Axon line 6*a*. The output terminal 522*b* is connected to the −Dendrite line 7*b*. The gate terminal 523*b* is connected to a second terminal 532*b* of the flip-flop circuit 530. In the synapse circuit 508, the first and second MOS transistors 520*a* and 520*b* function as the first weight unit and the first switch unit.

The input terminal 521*c* of the third MOS transistor 520*c* is connected to the −Axon line 6*b*. The output terminal 522*c* is connected to the +Dendrite line 7*a*. The gate terminal 523*c* is connected to the second terminal 532*b* of the flip-flop circuit 530. The input terminal 521*d* of the fourth MOS transistor 520*d* is connected to the −Axon line 6*b*. The output terminal 522*d* is connected to the −Dendrite line 7*b*. The gate terminal 523*d* is connected to the first terminal 532*a* of the flip-flop circuit 530. In the synapse circuit 508, the third and fourth MOS transistors 520*c* and 520*d* function as the second weight unit and the second switch unit.

The flip-flop circuit 530 includes first and second inverters 531*a* and 531*b*, the first and second terminals 532*a* and 532*b*, and first and second inputting gates 533*a* and 533*b*. The output of the first inverter 531*a* is input to the second inverter 531*b*. Further, the output of the second inverter 531*b* is input to the first inverter 531*a*.

The first terminal 532*a* is a terminal connected to the input side of the first inverter 531*a* (output side of the second inverter 531*b*). The second terminal 532*b* is a terminal connected to the output side of the first inverter 531*a* (input side of the second inverter 531*b*).

The first and second inputting gates 533a and 533b are each a p-MOS. The gate terminal, one terminal, and the other terminal of the first inputting gate 533a are respectively connected to the +Dendrite line 7a, the +Axon line 6a, and the first terminal 532a. The gate terminal, one terminal, and the other terminal of the second inputting gate 533b are respectively connected to the −Dendrite line 7a, the −Axon line 6b, and the second terminal 532b.

In the synapse circuit 508, the ±Axon lines 6a and 6b and the ±Dendrite lines 7a and 7b are used to set the binary state (the positive and negative weight values ±α) for the flip-flop circuit 530. Note that the first and second inverters 531a and 531b are driven by the power supply voltage Vdd=Vw. The power supply voltage Vdd is set to, for example, 0.5 V or less.

When setting the weight, for example, the Dendrite lines 7a and 7b are set to 0 V. As a result, the first and second inverters 531a and 531b enter the ON state. In this state, the voltage of one of the ±Axon lines 6a and 6b is set to Vw, and the other voltage is set to 0. As a result, it is possible to set the voltage P and the voltage N of the first and second terminals 532a and 532b.

In the synapse circuit 508, for example, the relationship of (P, N)=(Vw, 0) is set as the state corresponding to the positive weight value +α. Further, the relationship of (P, N)=(0, Vw) is set as the state corresponding to the negative weight value −α.

When performing a multiply-accumulate operation, the ±Dendrite lines 7a and 7b are set to a voltage higher than the power supply voltage Vdd of the flip-flop circuit 530, for example. This causes the first and second MOS transistors 520a and 520b to be in a state where a drain voltage (voltage between the output terminal and the input terminal) is applied.

For example, assumption is made that the voltage of the +Axon line 6a is 0 while the positive weight value +α is set. In this case, the voltages of the input terminals 521a and 521b are 0. For example, the first MOS transistor 520a enters the ON state because the voltage P=Vw is applied to the gate terminal 523a and the gate voltage $V_{gs}$=Vw. Meanwhile, the second MOS transistor 520b enters the OFF state because the voltage N=0 is applied to the gate terminal 523b and the gate voltage $V_{gs}$=0.

Further, for example, assumption is made that the voltage of the +Axon line 6a is 1.0 V while the positive weight value +α is set. In this case, the voltages of the input terminals 521a and 521b are 1.0 V. For example, the first MOS transistor 520a enters the OFF state in the case where the voltage P=Vw is applied to the gate terminal 523a and the gate voltage $V_{gs}$<0. Further, the second MOS transistor 520b enters the OFF state because the voltage N=0 is applied to the gate terminal 523b and the gate voltage $V_{gs}$<0.

Thus, the first and second MOS transistors 520a and 520b enter the ON state in the case where the +Axon line 6a is 0 and the voltages of the gate terminals 523a and 523b are Vw. This also applies to the third and fourth MOS transistors 520c and 520d.

Therefore, in the synapse circuit 508, an electrical signal (low-voltage pulse) representing the signal value $x_i$ in the state where the voltage is 0 is used. This allows the first to fourth MOS transistors 520a to 520d to generate charges corresponding to the multiplication value of the signal value $x_i$ and the weight value α on the basis of the electrical signal.

For example, in the case where the positive weight value +α is set, charges generated by the first MOS transistor 520a are output to the +Dendrite line 7a. Similarly, charges generated by the fourth MOS transistor 520d are output to the −Dendrite line 7b.

Further, for example, in the case where the negative weight value −α is set, charges generated by the second MOS transistor 520b are output to the −Dendrite line 7b. Similarly, charges generated by the third MOS transistor 520c are output to the +Dendrite line 7a.

The synapse circuit 508 shown in FIG. 23 is configured by using 10 MOS transistors. Further, six wires (the ±Axon lines 6a and 6b, the ±Dendrite lines 7a and 7b, and the two power supply voltage lines) are connected to the synapse circuit 508. In this configuration, it is possible to reduce the number of necessary MOS transistors and wires, and reduce the device area or the like. This makes it possible to realize miniaturization and large scaling of integrated circuits.

Figure 24:
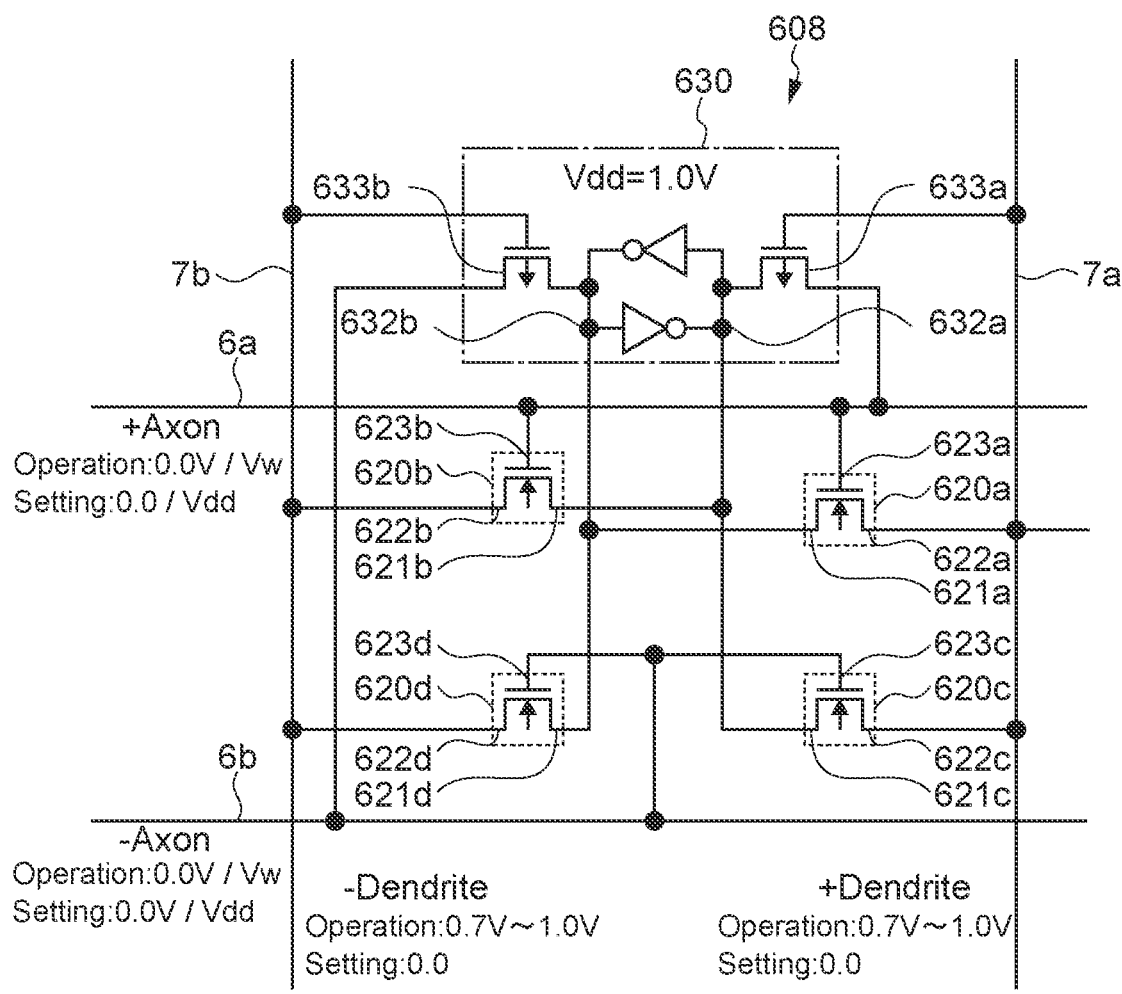
FIG. 24 is a circuit diagram showing another configuration example of the synapse circuit.

FIG. 24 is a circuit diagram showing another configuration example of the synapse circuit. A synapse circuit 608 includes first to fourth MOS transistors 620a to 620d and a flip-flop circuit 630. Further, the ±Axon lines 6a and 6b and the ±Dendrite lines 7a and 7b are connected to the synapse circuit 608. Note that the flip-flop circuit 630 is configured in the same manner as the flip-flop circuit 530 described with reference to FIG. 23, for example.

The first to fourth MOS transistors 620a to 620d are each an n-MOS that operates in the subthreshold region, and are configured similarly to each other. The first to fourth MOS transistors 620a to 620d respectively include input terminals 621a to 621d, output terminals 622a to 622d, and gate terminals 623a to 623d.

The input terminal 621a of the first MOS transistor 620a is connected to a second terminal 632b of the flip-flop circuit 630. The output terminal 622a is connected to the +Dendrite line 7a. The gate terminal 623a is connected to the +Axon line 6a. The input terminal 621b of the second MOS transistor 620b is connected to a first terminal 632a of the flip-flop circuit 630. The output terminal 622b is connected to the −Dendrite line 7b. The gate terminal 623b is connected to the +Axon line 6a. In the synapse circuit 608, the first and second MOS transistors 620a and 620b function as the first weight unit and the first switch unit.

The input terminal 621c of the third MOS transistor 620c is connected to the first terminal 632a of the flip-flop circuit 630. The output terminal 622c is connected to the +Dendrite line 7a. The gate terminal 623c is connected to the −Axon line 6b. The input terminal 621d of the fourth MOS transistor 620d is connected to the second terminal 632b of the flip-flop circuit 630. The output terminal 622d is connected to the −Dendrite line 7b. The gate terminal 623d is connected to the −Axon line 6b. In the synapse circuit 608, the third and fourth MOS transistors 620c and 620d function as the first weight unit and the first switch unit.

In the synapse circuit 608, for example, the relationship of (P, N)=(Vdd, 0) is set as the state corresponding to the positive weight value +α. Further, the relationship of (P, N)=(0, Vdd) is set as the state corresponding to the negative weight value −α. Note that the power supply voltage Vdd is set to, for example, approximately 1.0 V.

When performing a multiply-accumulate operation, the ±Dendrite lines 7a and 7b are set to a high-voltage state with the upper limit of the power supply voltage Vdd of the flip-flop circuit 630, for example. This causes the first and second MOS transistors 620a and 620b to be in a state where a drain voltage (voltage between the output terminal and the input terminal) is applied.

For example, assumption is made that the voltage of the +Axon line 6a is 0 while the positive weight value +α is set.

In this case, the voltages of the gate terminals 623a and 623b of the first and second MOS transistors 620a and 620b are 0. For example, the first MOS transistor 620a enters the OFF state because the voltage N=0 is applied to the input terminal 621a and the gate voltage $V_{gs}$=0. Further, the second MOS transistor 620b enters the OFF state because the voltage P=Vdd is applied to the input terminal 621b and the gate voltage $V_{gs}$=−Vdd.

Further, for example, assumption is made that the voltage of the +Axon line 6a is Vw while the positive weight value +α is set. In this case, the voltages of the gate terminals 623a and 623b of the first and second MOS transistors 620a and 620b are Vw. For example, the first MOS transistor 620a enters the ON state because voltage N=0 is applied to the input terminal 621a and the gate voltage $V_{gs}$=Vw. Meanwhile, the gate voltage of the second MOS transistor 620b satisfies the relationship of $V_{gs}$=Vw−Vdd because the voltage P=Vdd is applied to the input terminal 621b. That is, since the gate voltage $V_{gs}$ is lower than Vw, the second MOS transistor 620b enters the OFF state.

As described above, the first and second MOS transistors 620a and 620b enter the ON state in the case where the +Axon line 6a (the gate terminals 623a and 623b) is at Vw and the voltages of the input terminals 621a and 621b are 0. This also applies to the third and fourth MOS transistors 620c and 620d.

Therefore, in the synapse circuit 608, an electrical signal representing the signal value $x_i$ in the state where the voltage is Vw is used. This allows the first and second MOS transistors 620a and 620b to generate charges corresponding to the multiplication value of the signal value $x_i$ and the weight value α on the basis of the electrical signal.

For example, in the case where the positive weight value +α is set, charges generated by the first MOS transistor 620a are output to the +Dendrite line 7a. Similarly, charges generated by the fourth MOS transistor 620d are output to the −Dendrite line 7b.

Further, for example, in the case where the negative weight value −α is set, charges generated by the second MOS transistor 620b are output to the −Dendrite line 7b. Similarly, charges generated by the third MOS transistor 620c are output to the +Dendrite line 7a.

The synapse circuit 608 shown in FIG. 24 is configured by using 10 MOS transistors. Further, six wires (the ±Axon lines 6a and 6b, the ±Dendrite lines 7a and 7b, and the two power supply voltage lines) are connected to the synapse circuit 608. In this configuration, it is possible to reduce the number of necessary MOS transistors and wires, and reduce the device area or the like.

Further, since the source of each of the MOS transistors 620a to 620d is connected to the flip-flop circuit 630, it is possible to thicken the wiring of the source, and suppress the wiring resistance. Further, each of the sources is locally connected to a substrate (GND) via the flip-flop circuit 630. As a result, it is possible to stabilize the source-side potential, and stably execute a multiply-accumulate operation, for example.

Figure 25:
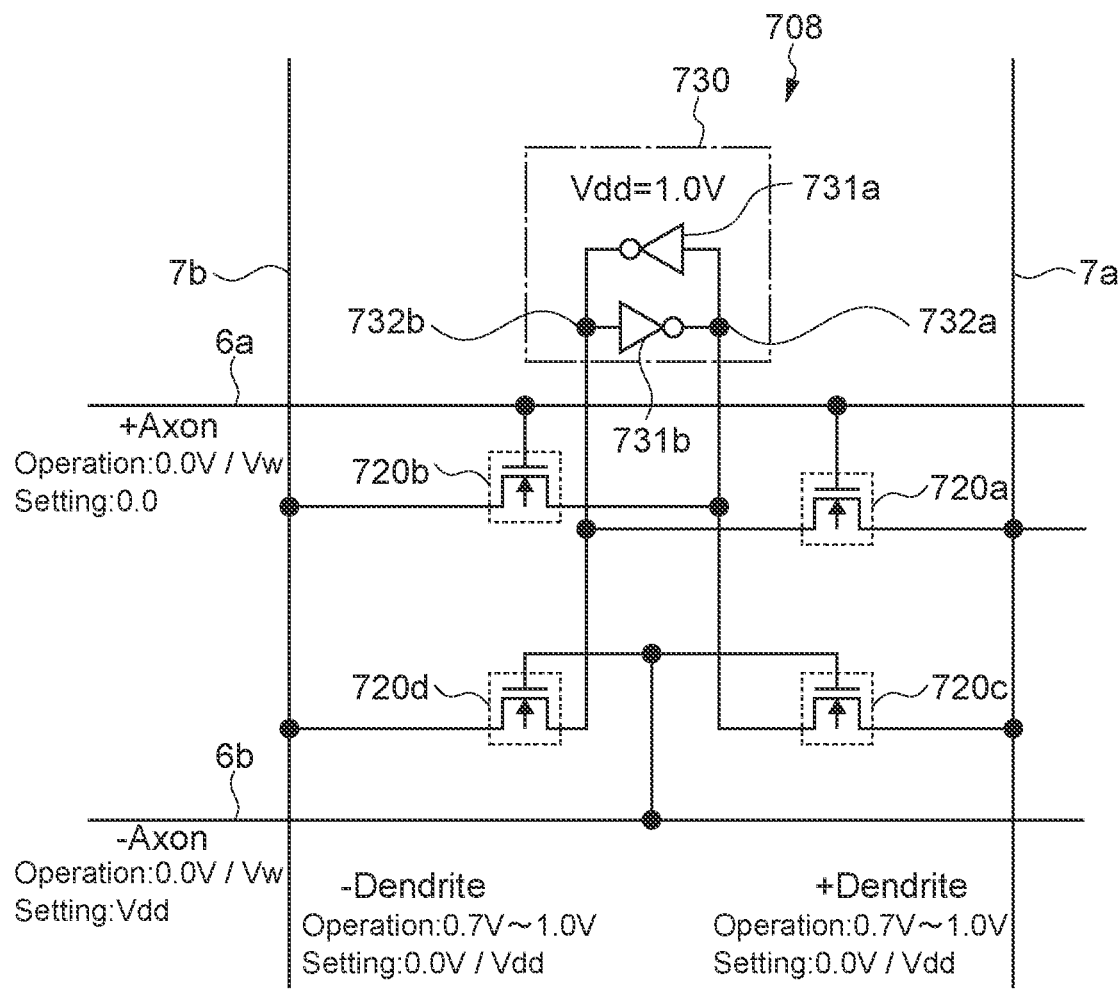
FIG. 25 is a circuit diagram showing another configuration example of the synapse circuit.

FIG. 25 is a circuit diagram showing another configuration example of the synapse circuit. A synapse circuit 708 includes first to fourth MOS transistors 720a to 720d and a flip-flop circuit 730. Further, the ±Axon lines 6a and 6b and the ±Dendrite lines 7a and 7b are connected to the synapse circuit 708.

The first to fourth MOS transistors 720a to 720d are configured in the same manner as the first to fourth MOS transistors 620a to 620d described with reference to FIG. 24, for example. Further, the flip-flop circuit 730 is configured in the same manner as the flip-flop circuit 30 described with reference to FIG. 5, for example. That is, the synapse circuit 708 has a configuration obtained by removing first and second inputting gates 633a and 633b from the synapse circuit 608 shown in FIG. 24.

In the synapse circuit 708, the −Axon line 6b and the ±Dendrite lines 7a and 7b are used to set the binary state (positive and negative weight values ±α) for the flip-flop circuit 730. Note that the power supply voltage Vdd of first and second inverters 731a and 731b are set to, for example, 2.5 V.

When setting the weight, for example, the voltage of the +Axon line 6a is set to 0, and the voltage of the −Axon line 6b is set to Vdd. As a result, the third and fourth MOS transistors 720c and 720d enter the ON state. In this state, the voltage of one of the ±Dendrite lines 7a and 7b is set to Vdd, and the other voltage is set to 0. Thus, it is possible to set the voltage P and the voltage N of first and second terminals 732a and 732b.

In the synapse circuit 708, for example, the relationship of (P, N)=(Vdd, 0) is set as the state corresponding to the positive weight value +α. Further, the relationship of (P, N)=(0, Vdd) is set as the state corresponding to the negative weight value −α. Further, in the synapse circuit 708, an electrical signal representing the signal value $x_i$ in the state where the voltage is Vw is used. The operation when an electrical signal is input while the weight values ±α are set is similar to the operation described with reference to FIG. 24.

The synapse circuit 708 shown in FIG. 25 is configured by using 8 MOS transistors. Further, six wires (the ±Axon lines 6a and 6b, the ±Dendrite lines 7a and 7b, and the two power supply voltage lines) are connected to the synapse circuit 708. In this configuration, the number of MOS transistors is small, so that it is possible to sufficiently reduce the device area or the like. This makes it possible to greatly improve the integration density of the device, and the like. Further, the number of MOS transistors connected to each input/output line or the like is small, so that the parasitic capacitance or the like of each line can be sufficiently reduced. As a result, it is possible to sufficiently suppress the power consumption of the device.

Other Embodiments

The present technology is not limited to the embodiments described above, and various other embodiments can be realized.

In the above-mentioned embodiment, the amount of charges input to the ±Dendrite lines is controlled by using a MOS transistor that operates in the subthreshold region. Therefore, the MOS transistor functions as a high-resistance element that controls the amount of charges corresponding to the multiplication value ($w_i \cdot x_i$) by the high conduction resistance R. The present technology is not limited thereto. The amount of charges corresponding to the multiplication value may be controlled by using another high-resistance element.

For example, a MOS transistor configured to operate at a higher gate-voltage than the threshold voltage Vth may be used. In this case, by providing an arbitrary high-resistance component between the current source (±Axon lines, the flip-flop circuit, and the like) and the ±Dendrite lines, it is possible to easily reduce the amount of charges output to the ±Dendrite lines. Thus, it is possible to significantly suppress the power consumed during the operation, and realize a low-power-consumption device.

The one-input two-output synapse circuit that deals with a PWM electrical signal has been described in the first embodiment. For example, a TACT electrical signal may be input to a one-input two-output synapse circuit. In this case, it is possible to perform multiply-accumulate operation processing using a TACT electrical signal by appropriately executing the arithmetic processing by a neuron circuit.

For example, as described with reference to (Math. 3) and (Math. 4), in a multiply-accumulate operation using a TACT electrical signal, the entire multiply-accumulate result is expressed as (Math. 4) in the case where the total sum $\beta^+$ of the positive weight values and the total sum $\beta^-$ of the negative weight values are equal to each other. Therefore, in the case where $\beta^+$ and $\beta^-$ differs from each other, it is possible to create the state where $\beta^+$ and $\beta^-$ are equal to each other by using a dummy weight that compensate for the difference.

This corresponds to, for example, generating charges corresponding to the dummy weight and charging the capacitor shown in FIG. 4. In this way, by providing a circuit for additionally charging the capacitor in accordance with the difference between $\beta^+$ and $\beta^-$, it is possible to deal with a TACT electrical signal using a one-input two-output synapse circuit. For example, such a configuration may be adopted.

Figure 26:
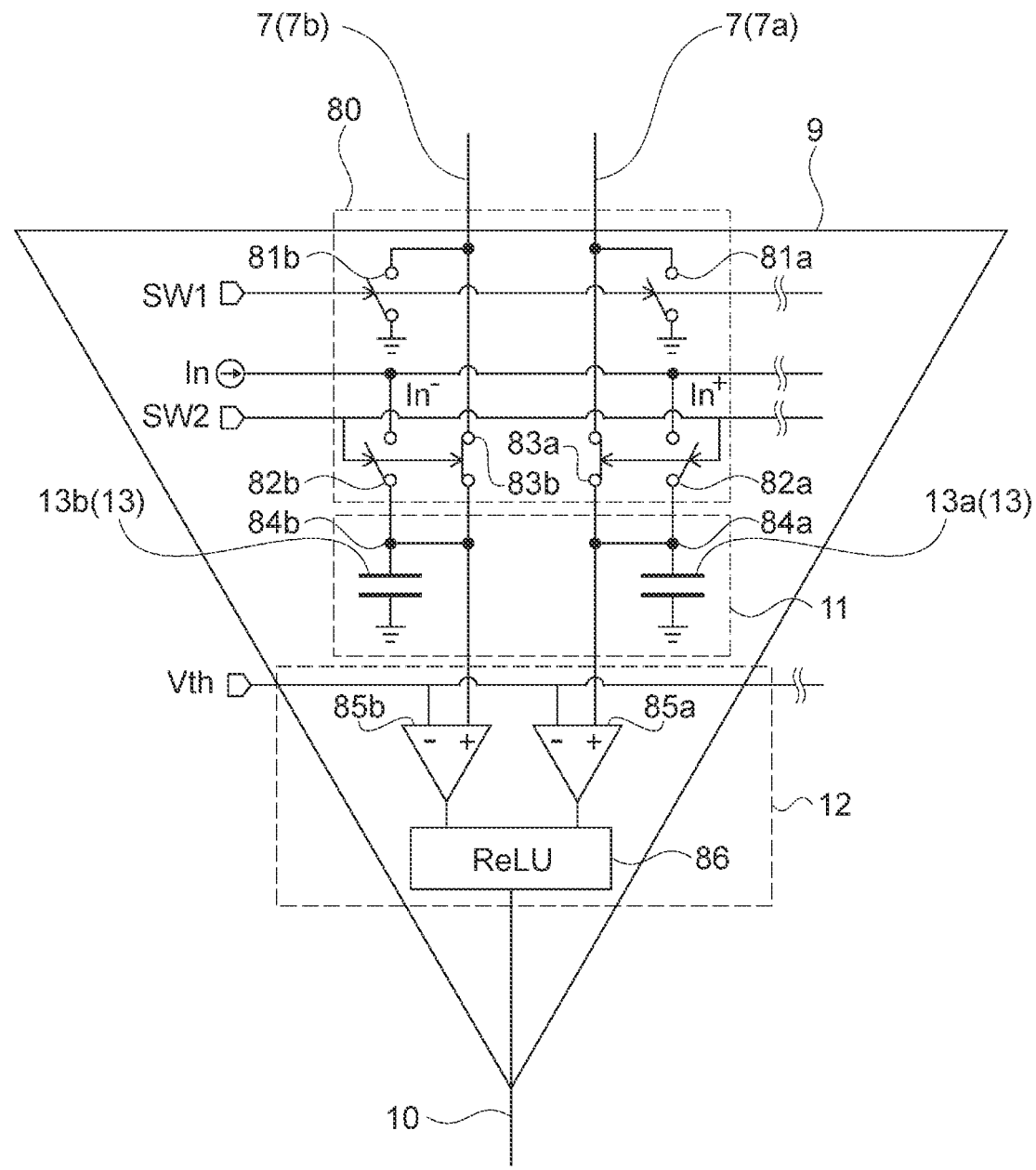
FIG. 26 is a circuit diagram showing a specific configuration example of the neuron circuit shown in FIG. 4.

FIG. 26 is a circuit diagram showing a specific configuration example of the neuron circuit 9 shown in FIG. 4. The neuron circuit 9 shown in FIG. 26 is a circuit that charges the capacitor 13 at a constant charging speed after the input period T. Further, the neuron circuit 9 receives a pair of positive and negative outputs from the pair of output lines 7 as inputs, and outputs one multiply-accumulate result from a single output signal line 10, similarly to FIG. 4. In FIG. 26, a case where charges generated by the PWM signal are input to the neuron circuit 9 will be described.

In the following, the input period T is referred to as $T_{in}$, and the output period in which a multiply-accumulate signal is generated after the input period $T_{in}$ is referred to as $T_{out}$ in some cases. Note that the input period $T_{in}$ and the output period $T_{out}$ are typically periods set to the same consecutive length T ($T_{in}=T_{out}=T$).

The neuron circuit 9 includes a charging unit 80 in addition to the accumulation unit 11 and the output unit 12 shown in FIG. 4. The charging unit 80 charges the capacitor 13 at a constant charging speed in the output period $T_{out}$ after the input period $T_{in}$. As described above, the PWM signal is a signal representing a signal value by a pulse width within the input period $T_{in}$, and all the PWM signals are zero after the input period $T_{in}$ (see FIG. 2). Therefore, in the output period $T_{out}$, charges output to each of the output line 7 are substantially zero. The charging unit 80 shown in FIG. 4 operates in this output period $T_{out}$ so as to connect the capacitor 13 to a predetermined current line In to charge the capacitor 13.

The charging unit 80 includes a first selector switch 81a, a second selector switch 82a, and a third selector switch 83a for changing the connection destination of the capacitor 13a, and a first selector switch 81b, a second selector switch 82b, and a third selector switch 83b for changing the connection destination of the capacitor 13b. Further, a first control line SW1, a second control line SW2, and the current line In are connected to the charging unit 80. Note that the connection state (ON or OFF) of each of the selector switches shown in FIG. 26 represents a connection state in the input period $T_{in}$.

The first selector switch 81a is connected between a positive output line 7a and a GND in the upstream from the capacitor 13a. The second selector switch 82a is connected between the current line In and an output node 84a of the capacitor 13a. Here, the output node 84a is a node (terminal) on the side opposite to the side of the capacitor 13a connected to a GND. The third selector switch 83a is provided between the output node 84a (the capacitor 13a) and the positive output line 7a. Further, the output node 84a is connected to the output unit 12 of a subsequent stage.

The first selector switch 81b is connected between a negative output line 7b and a GND in the upstream from the capacitor 13b. The second selector switch 82b is connected between the current line In and an output node 84b of the capacitor 13b. The third selector switch 83b is provided between the output node 84b (the capacitor 13b) and the negative output line 7b. Further, the output node 84b is connected to the output unit 12 of a subsequent stage.

The first control line SW1 controls the first selector switches 81a and 81b. The second control line SW2 controls the second selector switches 82a and 82b and the third selector switches 83a and 83b. Note that the second selector switch 82a (82b) and the third selector switch 83a (83b) are configured so that the ON/OFF states thereof are opposite to each other. In the case where one of them is ON, the other is OFF. The specific configuration of each of the selector switches is not limited, and, for example, an analogue switch using a CMOS circuit or the like may be used. Further, a control signal for operating the selector switch is appropriately input to each of the control lines.

The output unit 12 outputs a multiply-accumulate signal by performing threshold determination on the potential of the capacitor 13 in the output period $T_{out}$. Here, the potential of the capacitor 13 is the potential of each of the output nodes 84a and 84b of the capacitors 13a and 13b. Specifically, threshold determination of a potential difference (voltage) between the potential of each of the output nodes 84a and 84b and the GND potential is performed. In the following, the potential of each of the output nodes 84a and 84b with reference to the GND will be referred to simply as the voltage in some cases.

The output unit 12 includes positive and negative comparators 85a and 85b and a ReLU function circuit 86. Further, the output unit 12 is connected to a threshold voltage line Vth that supplies a predetermined threshold voltage. The positive comparator 85a (negative comparator 85b) is connected to the output node 84a (the output node 84b) and the threshold voltage line Vth, and switches the output level from Low to High in the case where the voltage of the output node 84a (the output node 85b) exceeds the threshold voltage. The specific configuration of each of the comparators 85a and 85b is not limited.

Note that the value of the threshold voltage set to the threshold voltage line Vth is set, for example, during the output period $T_{out}$, together with the charging speed of the capacitor 13 described below so that the positive and negative multiply-accumulate results can be properly detected. Alternatively, the threshold voltage may be set in accordance with the capacitance of the capacitor 13, or the like. In addition, the method of setting the threshold voltage, and the like are not limited.

The ReLU function circuit 86 is a circuit that implements the ReLU function described with reference to FIG. 1. The ReLU function circuit 86 can be configured using, for example, a logical circuit as in the circuit shown in FIG. 9 described below. Further, the ReLU function circuit 86 functions as the function circuit 5 shown in FIG. 1 and the like. That is, it can be said that the neuron circuit 9 shown in FIG. 26 includes the function circuit 5.

Figure 27:
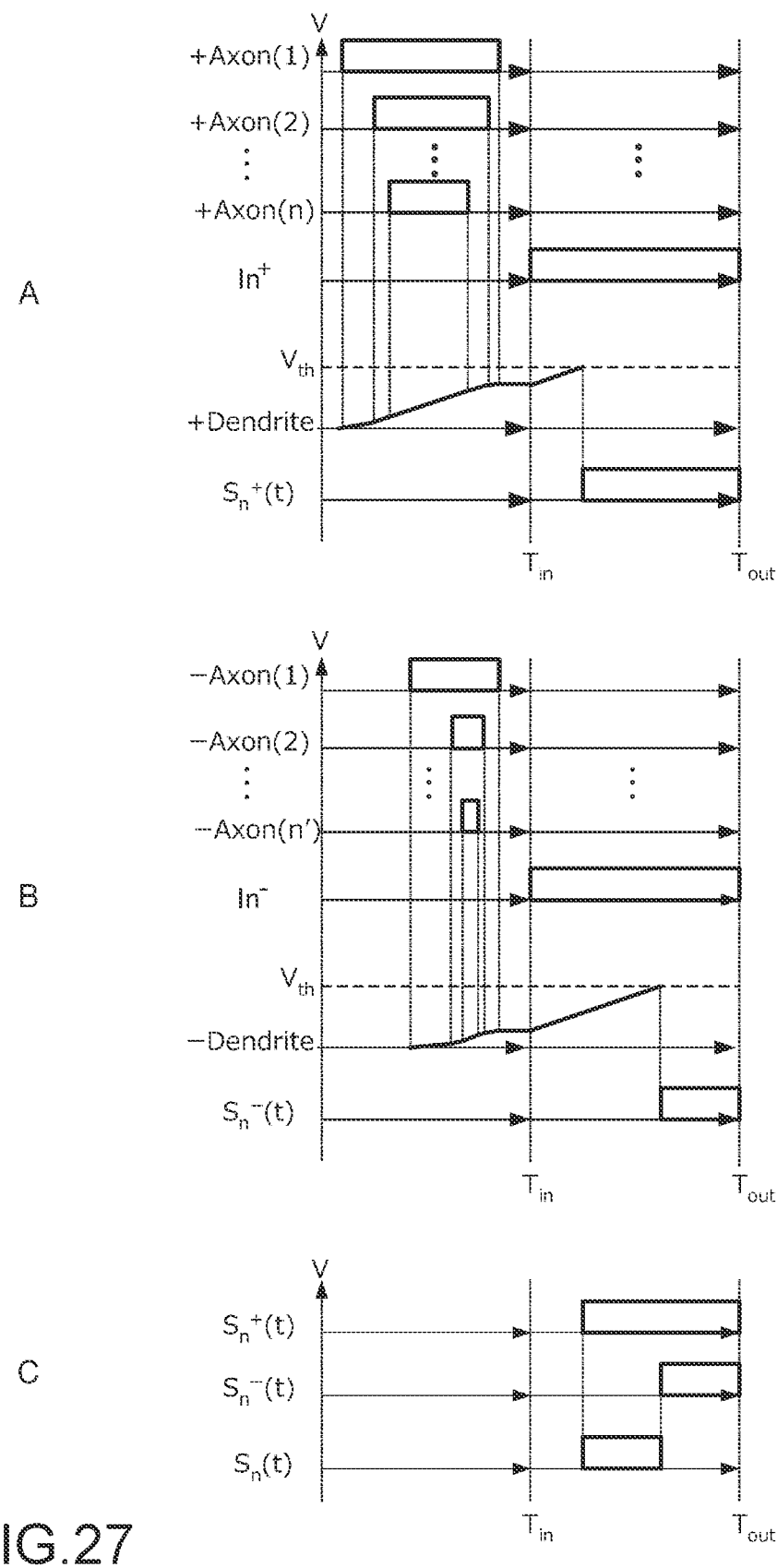
FIG. 27 is a timing chart showing an operation example of the neuron circuit shown in FIG. 26.

FIG. 27 is a timing chart showing an operation example of the neuron circuit 9 shown in FIG. 26. Part A of FIG. 27 and Part B of 27 are respectively timing charts showing multiply-accumulate operations for a positive weight value and a negative weight value. Further, Part C of FIG. 27 is a timing chart showing the operation of the ReLU function circuit 86. Hereinafter, an operation example of the neuron circuit 9 will be described with reference to FIG. 26 and FIG. 27.

First, before the input period $T_{in}$ is started, the first selector switches 81a and 81b are each set to the ON state by the first control line SW1, and the output lines 7a and 7b are grounded to the GNDs. At this time, the second selector switches 82a and 82b are each in the OFF state. Further, the third selector switches 83a and 83b are each in the ON state, and the capacitors 13a and 13b are respectively connected to the positive and negative output lines 7a and 7b. That is, the charging unit 80 connects the capacitor 13 to the GND before the input period $T_{in}$ is started.

As a result, the output lines 7a and 7b can be initialized to the GND level (installation level) and reset as the initial state before a multiply-accumulate operation is performed. As a result, charges accumulated in the capacitor 13 and charges accumulated in the parasitic capacitance of the output line 7, or the like, are discharged to the GND. As a result, charges or the like accumulated in the previous operation are reset, and thus, it is possible to repeatedly execute the appropriate arithmetic processing.

Note that when the resetting of charges is completed, the first selector switches 81a and 81b are each set to the OFF state by the first control line SW1. Further, the second selector switches 82a and 82b are each maintained in the OFF state, and the third selector switches 83a and 83b are each maintained in the ON state. In this state, the input period $T_{in}$ is started. Thus, the charging unit 80 connects the capacitor 13 to the pair of output lines 7a and 7b in the input period $T_{in}$.

In the input period $T_{in}$, PWM signals are input from a plurality of input signal lines 6 (Axon lines), and the respective capacitors 13a and 13b are charged. For example, in the input period $T_{in}$, a plurality of PWM signals (input signals) is input to each of the output lines 7a and 7b via each of the synapse circuits 8 (weights). Hereinafter, signals input to the positive and negative output lines 7a and 7b will be referred to as ±Axon(n).

For example, as shown in Part A of FIG. 27, PWM signals from +Axon(1) to +Axon(n) are input to the positive the output line 7a. As a result, the capacitor 13a on the positive side is charged in accordance with the pulse width (signal value) of each PWM signal, and the voltage (+Dendrite) of the capacitor 13a is increased in accordance with the input of each PWM signal for the positive output line 7a. Similarly, as shown in Part B of FIG. 27, PWM signals from −Axon(1) to −Axon(n') are input to the negative output line 7b. As a result, the voltage (−Dendrite) of the capacitor 13a on the negative side is increased in accordance with the input of each PWM signal for the negative output line 7a. Note that all PWM signals are input before the input period $T_{in}$ is ended.

When the input period $T_{in}$ is ended, the output period $T_{out}$ is started continuously thereto. At the timing when the output period $T_{out}$ is started, the third selector switches 83a and 83b are each set to the OFF state by the second control line SW2. As a result, the output lines 7a and 7b are separated from the subsequent stage (the accumulation unit 11 and the output unit 12) of the neuron circuit 9.

Further, at substantially the same time, the second selector switches 82a and 82b are each set to the ON state, and the current line In is connected to the capacitors 13a and 13b. As a result, the capacitors 13a and 13b are charged by the current line In. Specifically, as shown in Part A of FIG. 27 and Part B of 27, $In^+$ and $In^-$ flow into the capacitors 13a and 13b by connecting to the current line In.

In this embodiment, the current line In function as a constant current source. Therefore, the currents ($In^+$ and $In^-$) flowing into the respective capacitors 13a and 13b have the same value. These currents cause the capacitors 13a and 13b to be charged at a constant charging speed. Thus, the charging unit 80 connects the capacitor 13 to the current line In that supplies a current corresponding to the constant charging speed in the output period $T_{out}$. As a result, it is possible to easily detect charges accumulated in the input period $T_{in}$ accurately by threshold determination. In the example shown in FIG. 26, the current line In corresponds to the current source.

For example, as shown in Part A of FIG. 27 and Part B of FIG. 27, the ±Dendrite, which are the voltages of the capacitors 13a and 13b, increase at a constant rate at the beginning of the output period $T_{out}$ (the end of the input period $T_{in}$) by being connected to the current line In. The slopes of this increases are equal to each other between the capacitors 13a and 13b. As a result, for example, the timing when the ±Dendrite exceed the threshold voltage represents the voltage at the end timing of the input period $T_{in}$ of each of the capacitors 13a and 13b. As a result, charges accumulated in the input period $T_{in}$, i.e., positive and negative multiply-accumulate results can be properly represented.

The current line In supplies current until the ±Dendrite reach the threshold voltage Vth. Then, when the ±Dendrite reach the threshold voltage Vth, the output signals $S_n^+(t)$ and $S_n^-(t)$ are respectively generated from the comparators 85a and 85b. $S_n^+(t)$ and $S_n^-(t)$ are multiply-accumulate signals respectively representing a positive multiply-accumulate result and a negative multiply-accumulate result.

In the example shown in FIG. 27, since the voltage of the capacitor 13a at the end timing of the input period $T_{in}$ is higher than that of the capacitor 13b, $S_n^+(t)$ is generated earlier than $S_n^-(t)$. As described above, the signal output from the comparator is a signal having the larger accumulate result as the rising timing is earlier.

The signals ($S_n^+(t)$ and $S_n^-(t)$) representing positive and negative multiply-accumulate results are input to the ReLU function circuit 86, and the difference between them is output as the PWM signal $S_n(t)$. As shown in Part C of FIG. 27, $S_n(t)$ is a signal that is High when $S_n^+(t)$ is High and $S_n^-(t)$ is low. The pulse width of $S_n(t)$ represents the difference between the positive and negative multiply-accumulate results, i.e., the final result of the multiply-accumulate operation output from one analog circuit 3. Note that $S_n(t)$ is generated only in the case where $S_n^+(t) > S_n^-(t)$ (in the case where the difference between the positive and negative multiply-accumulate results is 0 or more) (see FIG. 9 and the like).

Thus, in the neuron circuit 9 shown in FIG. 26, it is possible to output the multiply-accumulate result processed by the ReLU function. Note that the present technology is not limited to the circuit shown in FIG. 26, and an arbitrary circuit capable of reading charges or the like accumulated in the capacitor 13 may be used as the neuron circuit 9.

Figure 28:
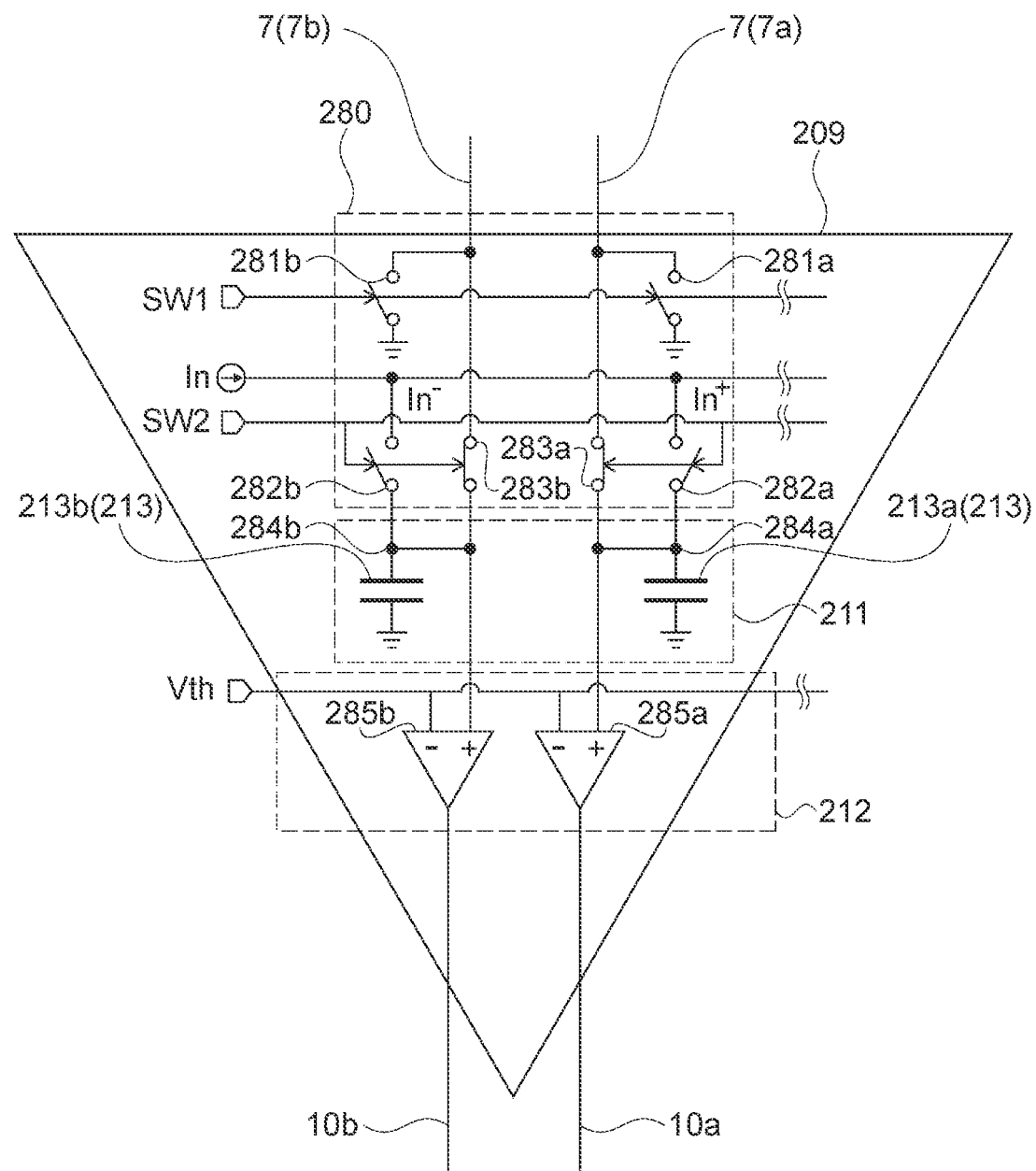
FIG. 28 is a circuit diagram showing a specific configuration example of the neuron circuit shown in FIG. 15.

FIG. 28 is a circuit diagram showing a specific configuration example of a neuron circuit 209 shown in FIG. 15. The neuron circuit 209 shown in FIG. 28 is a circuit that charges a capacitor 213 at the constant charging speed after the input period $T_{in}$. Further, the neuron circuit 209 receives a pair of positive and negative outputs from the pair of output lines 7 as inputs, and outputs positive and negative multiply-accumulate results from a pair of output signal lines 10a and 10b, similarly to FIG. 15. In FIG. 28, a case where charges generated by a signal (step signal) of a TACT system are input to the neuron circuit 209 will be described.

The neuron circuit 209 includes a charging unit 280 in addition to an accumulation unit 211 and the output unit 212. The accumulation unit 211 and the charging unit 280 have, for example, the same configuration as that of the charging unit 80 described with reference to FIG. 26. Note that in the neuron circuit 209 shown in FIG. 28, a pair of multiply-accumulate signals $S_n^+(t)$ and $S_n^-(t)$ representing positive and negative multiply-accumulate results are output as they are from comparators 285a and 285b of the output unit 212, respectively. That is, it can be said that the output unit 212 has a configuration obtained by removing the ReLU function circuit 86 from the output unit 12 shown in FIG. 26.

The charging unit 280 charges the capacitor 213 at the constant charging speed in the output period $T_{out}$ after the input period $T_{in}$. As described above, the step signal is a signal representing a signal value by timing in the input period $T_{in}$. Here, a signal representing a signal value by the timing rising from low to High in the input period $T_{in}$ is used. Note that the rising step signal continues to maintain the High level thereafter (see FIG. 13 and the like).

Figure 29:
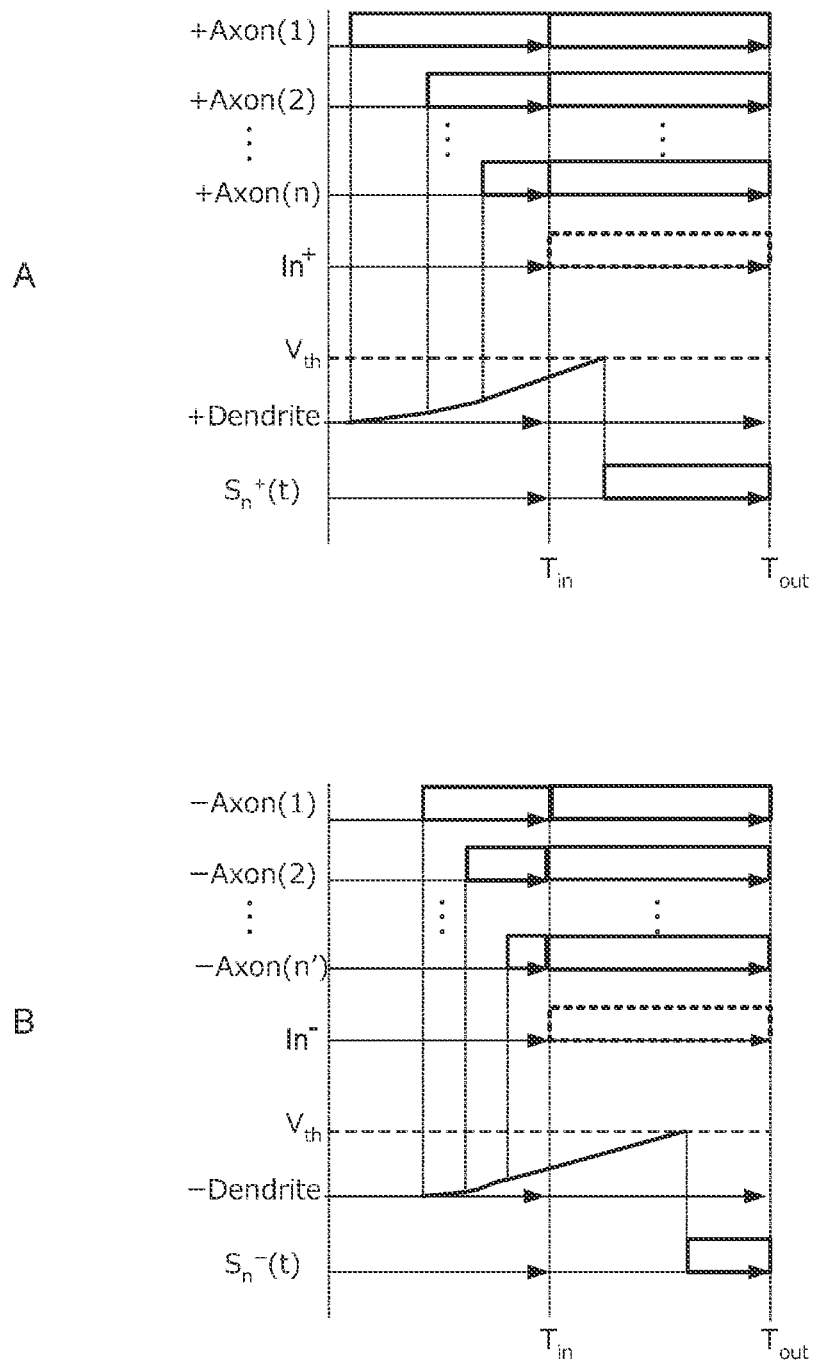
FIG. 29 is a timing chart showing an operation example of the neuron circuit shown in FIG. 28.

FIG. 29 is a timing chart showing an operation example of the neuron circuit 209 shown in FIG. 28. Part A of FIG. 29 and Part B of FIG. 29 are timing charts respectively showing multiply-accumulate operations for a positive weight value and a negative weight value.

In FIG. 29, the step signal is maintained at a High level even after completion of the input period $T_{in}$ (during the output period Taut). These step signals charge the capacitor 213 during the output period $T_{out}$. That is, during the output period $T_{out}$, the plurality of input signal lines 6 (Axon lines) and the output line 7 constitute a current source, and the capacitor 13 is charged.

Therefore, in FIG. 29, the respective Axon lines and the positive and negative output lines 7a and 7b function as a part of the charging unit 280. In this case, for example, the neuron circuit 209 can be operated in a configuration in which second selector switches 282a and 282b and the current line In shown in FIG. 28 are excluded and third selector switches 283a and 283b are short-circuited. As a result, the circuit configuration for charging the capacitor 213 can be simplified.

First, first selector switches 281a and 281b are each set to the ON state by the first control line SW1 while the positive and negative output lines 7a and 7b and the capacitors 213a and 213b are connected (third selector switches 283a and 283b are short-circuited) before the input period $T_{in}$ is started. As a result, before a multiply-accumulate operation is performed, the output lines 7a and 7b and the like can be initialized to the GND level (installation level) and reset.

In the input period $T_{in}$, step signals that rise at timing corresponding to the signal value are input to the plurality of Axon lines. In the TACT system, a signal that maintains a High level is input from all of the Axon lines subsequently after the input period $T_{in}$. That is, there is a variation in the timing at when the step signal is input in the input period $T_{in}$, but all of the Axon lines are at the High level and constant charges are continuously supplied in the output period $T_{in}$. As a result, the capacitors 213a and 213b can be charged at a constant charging speed.

The voltages of output nodes 284a and 284b of the capacitors 213a and 213b each increase at a constant rate. Then, when the voltages (±Dendrite) of the output nodes 284a and 284b reach the threshold voltage of the comparators 285a and 285b, positive and negative multiply-accumulate signals $S_n^+(t)$ and $S_n^-(t)$ are generated, respectively. The generated $S_n^+(t)$ and $S_n^-(t)$ are output to a subsequent stage as a pair of multiply-accumulate signals. As described above, by using the step signal of the TACT system, a multiply-accumulate signal representing the multiply-accumulate result can be generated with a simple configuration.

Figure 30:
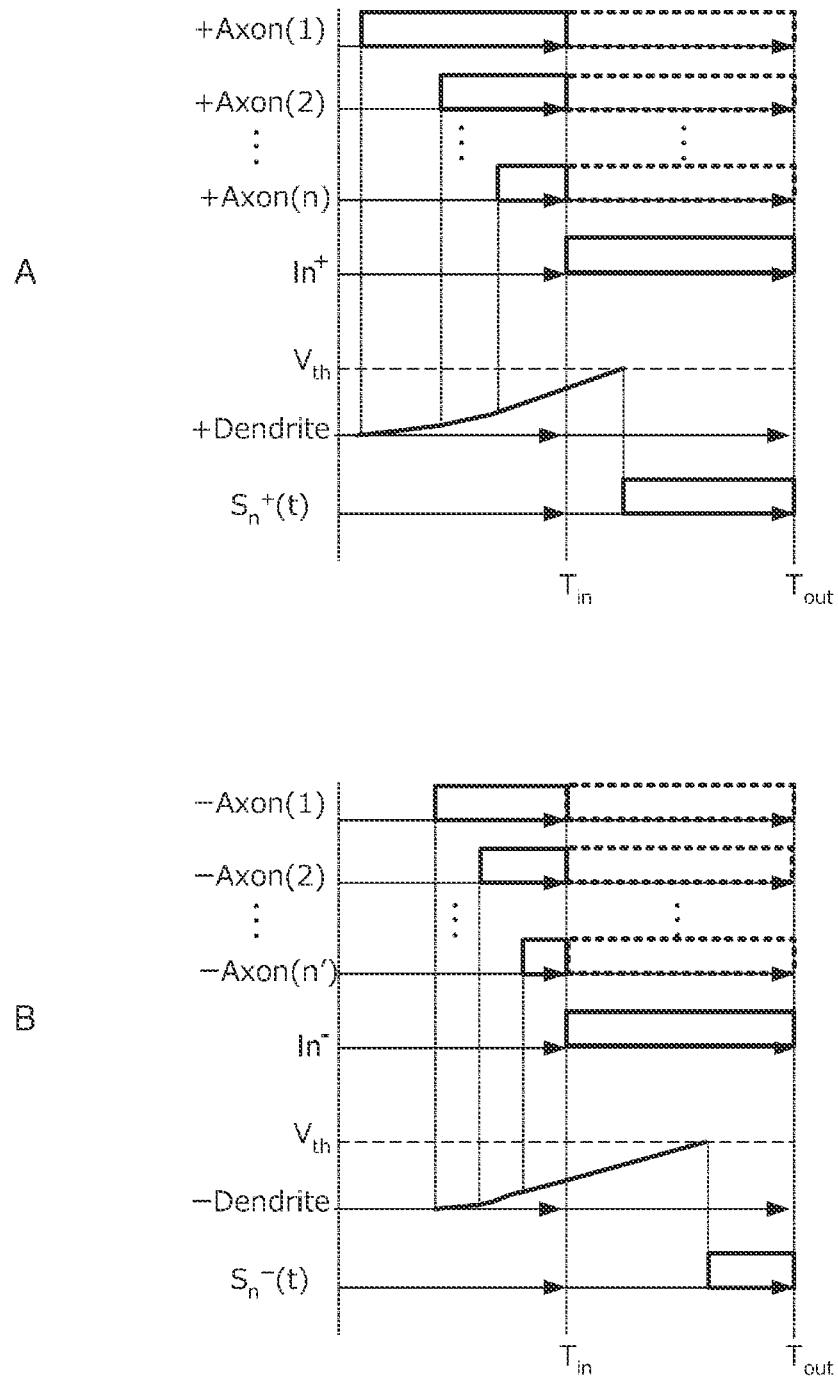
FIG. 30 is a timing chart showing another operation example of the neuron circuit shown in FIG. 28.

FIG. 30 is a timing chart showing another operation example of the neuron circuit 209 shown in FIG. 28. Part A of FIG. 30 and Part B of FIG. 30 are respectively timing charts showing multiply-accumulate operations for a positive weight value and a negative weight value. In FIG. 30, the positive and negative output lines 7a and 7b are separated after the end of the input period $T_{in}$. Then, during the output period $T_{out}$, the capacitor 213 is charged by the current line In.

After each of the output lines 7a and 7b and the like is reset to the initial state, the input period $T_{in}$ is started and a plurality of step signals are input. At this time, the selector switches 282a and 282b are set to the OFF state, and the third selector switches 283a and 283b are set to the ON state. As a result, charges corresponding to the signal value of the step signal are accumulated in the capacitors 213a and 213b from the positive and negative output lines 7a and 7b.

In FIG. 30, at the timing when the input period $T_{in}$ is ended, the third selector switches 283a and 283b are set to the OFF state by the second control line SW2, and the output lines 7a and 7b are separated from the subsequent stage (the accumulation unit 211 and the output unit 212) of the neuron circuit 209. As a result, as shown in Part A of FIG. 30 and Part B of FIG. 30, the input from each of the Axon lines is cut in the output period $T_{out}$.

Further, the second selector switches 282a and 282b are set to the ON state at substantially the same time when the output lines 7a and 7b are separated. As a result, each of the capacitors 213a and 213b are connected to the current line In and supplied with the constant currents $In^+$ and $In^-$, respectively. As a result, the capacitors 213a and 213b are charged at a constant charging speed. Further, when the voltages (±Dendrite) of the output nodes 284a and 284b reach the threshold voltage of the comparators 285a and 285b, positive and negative multiply-accumulate signals $S_n^+(t)$ and $S_n^-(t)$ are generated, respectively.

As described above, even in the case where the TACT system is used, a multiply-accumulate signal representing the multiply-accumulate result can be generated using the current line In. As a result, for example, the neuron circuit 209 for the TACT system can be easily configured by using the designing of the neuron circuit 9 (see FIG. 26) used in the PWM system.

The configurations of the arithmetic logic unit, analog circuit, synapse circuit, neuron circuit, and the like, the method of generating a multiply-accumulate signal, and the like described with reference to the drawings are merely one embodiment, and can be arbitrarily modified without departing from the essence of the present technology. That is, any other arbitrary configuration, method, and the like for carrying out the present technology may be employed.

In the present disclosure, "same", "equal", "perpendicular", and the like are concepts including "substantially the same", "substantially equal", "substantially perpendicular", and the like. For example, the states included in a predetermined range (e.g., ±10%) with reference to "completely the same", "completely equal", "completely perpendicular", and the like are also included.

Out of the feature parts according to the present technology described above, at least two feature parts can be combined. That is, the various characteristic portions described in the respective embodiments may be arbitrarily combined without distinguishing from each other in the respective embodiments. It should be noted that the effects described above are merely illustrative and are not limitative, and may have an additive effect.

It should be noted that the present technology may take the following configurations.

(1) An arithmetic logic unit, including:
  a plurality of input lines, electrical signals being input to the plurality of input lines; and
  a multiply-accumulate operation device that includes
    a pair of output lines,
    a plurality of multiplication units including a weight unit that generates, on the basis of the electrical signals input to the plurality of input lines, charges corresponding to multiplication values obtained by multiplying signal values represented by the electrical signals by weight values, a holding unit that holds a binary state, and a switch unit that outputs, on the basis of the held binary state, the charges generated by the weight unit to one of the pair of output lines,
    an accumulation unit that accumulates the charges output to the pair of output lines by the plurality of multiplication units, and
    an output unit that outputs, on the basis of the accumulated charges, a multiply-accumulate signal representing a sum of the multiplication values.

(2) The arithmetic logic unit according to (1), in which
  the weight unit includes a MOS transistor including an input terminal, an output terminal, and a gate terminal for controlling conduction between the input terminal and the output terminal.

(3) The arithmetic logic unit according to (2), in which
  the weight value is set by a resistance between the input terminal and the output terminal.

(4) The arithmetic logic unit according to (2) or (3), in which
  the holding unit includes a first terminal and a second terminal that switch and output, on the basis of the held binary state, two types of voltages so that the voltages differ from each other.

(5) The arithmetic logic unit according to (4), in which
  the gate terminal is connected to the input line, and
  the input terminal is connected to one of the first terminal, the second terminal, and a predetermined constant voltage source.

(6) The arithmetic logic unit according to (4), in which
  the input terminal is connected to the input line, and
  the gate terminal is connected to one of the first terminal, the second terminal, and a predetermined gate voltage source.

(7) The arithmetic logic unit according to any one of (2) to (6), in which
  the weight unit includes a first MOS transistor and a second MOS transistor connected to the same input line, and
  the switch unit includes the first and second MOS transistors.

(8) The arithmetic logic unit according to any one of (2) to (6), in which
  the pair of output lines includes a first output line and a second output line, and
  the switch unit include a first switch element that connects the output terminal and the first output line to each other and a second switch element that connects the output terminal and the second output line to each other.

(9) The arithmetic logic unit according to any one of (2) to (5) and (7), in which
  the holding unit is connected to the input terminal, and
  the weight unit outputs a control signal for controlling the binary state of the holding unit from the input terminal.

(10) The arithmetic logic unit according to any one of (1) to (9), in which
  the weight unit generates charges corresponding to a multiplication value obtained by multiplying the signal value by an absolute value of the weight value, and
  the holding unit holds a binary state corresponding to a sign of the weight value.

(11) The arithmetic logic unit according to any one of (1) to (10), in which
  the weight value is set to one of a first value and a second value having equal absolute values and different signs in the plurality of multiplication units.

(12) The arithmetic logic unit according to any one of (1) to (11), in which
  the plurality of input lines includes pairs of the input lines, each of the pairs including a first input line and a second input line, and
  the multiplication unit includes a first weight unit connected to the first input line and a second weight unit connected to the second input line, of the pair of input lines.

(13) The arithmetic logic unit according to (12), in which
  the multiplication unit includes a first switch unit that outputs, on the basis of the held binary state, charges generated by the first weight unit to one of the pair of output lines, and a second switch unit that outputs, on the basis of the held binary state, charges generated by the second weight unit to the other of the pair of output lines.

(14) The arithmetic logic unit according to any one of (1) to (13), in which
  the weight unit includes a high-resistance element that controls an amount of charges corresponding to the multiplication value.

(15) The arithmetic logic unit according to any one of (1) to (14), in which
  the weight unit includes a MOS transistor that operates in a subthreshold region.

(16) The arithmetic logic unit according to any one of (1) to (15), further including
  a plurality of the multiply-accumulate operation devices connected in parallel to each of the plurality of input lines.

(17) The arithmetic logic unit according to (16), in which
  the plurality of input lines is wired so as to cross a plurality of pairs of the output lines included in the plurality of multiply-accumulate operation devices.

(18) The arithmetic logic unit according to any one of (1) to (17), in which
  the electrical signal is a signal representing the signal value by timing within an input period or a pulse width,
  the multiply-accumulate operation device includes a charging unit that charges the accumulation unit at a constant charging speed in an output period after the input period, and
  the output unit outputs the multiply-accumulate signal by performing threshold determination on a potential of the accumulation unit in the output period.

(19) The arithmetic logic unit according to (18), in which
  the charging unit connects the accumulation unit to the pair of output lines in the input period, and connects the accumulation unit to a current source in the output period, the current source supplying a current corresponding to the constant charging speed.

(20) The arithmetic logic unit according to (18) or (19), in which
the charging unit connects the accumulation unit to a GND before the input period.

(21) A multiply-accumulate operation device, including:
a pair of output lines;
a plurality of multiplication units that includes a weight unit that generates, on the basis of electrical signals input to a plurality of input lines, charges corresponding to multiplication values obtained by multiplying signal values represented by the electrical signals by weight values, a holding unit that holds a binary state, and a switch unit that outputs, on the basis of the held binary state, the charges generated by the weight unit to one of the pair of output lines;
an accumulation unit that accumulates the charges output to the pair of output lines by the plurality of multiplication units; and
an output unit that outputs, on the basis of the accumulated charges, a multiply-accumulate signal representing a sum of the multiplication values.

(22) A multiply-accumulate operation circuit, including:
a pair of output lines;
a plurality of multiplication units that includes a weight unit that generates, on the basis of electrical signals input to a plurality of input lines, charges corresponding to multiplication values obtained by multiplying signal values represented by the electrical signals by weight values, a holding unit that holds a binary state, and a switch unit that outputs, on the basis of the held binary state, the charges generated by the weight unit to one of the pair of output lines;
an accumulation unit that accumulates the charges output to the pair of output lines by the plurality of multiplication units; and
an output unit that outputs, on the basis of the accumulated charges, a multiply-accumulate signal representing a sum of the multiplication values.

(23) A multiply-accumulate operation system, including:
a plurality of input lines, electrical signals being input to the plurality of input lines;
a plurality of analog circuits that includes a pair of output lines, a plurality of multiplication units including a weight unit that generates, on the basis of the electrical signals input to the plurality of input lines, charges corresponding to multiplication values obtained by multiplying signal values represented by the electrical signals by weight values, a holding unit that holds a binary state, and a switch unit that outputs, on the basis of the held binary state, the charges generated by the weight unit to one of the pair of output lines, an accumulation unit that accumulates the charges output to the pair of output lines by the plurality of multiplication units, and an output unit that outputs, on the basis of the accumulated charges, a multiply-accumulate signal representing a sum of the multiplication values; and
a network circuit configured by connecting the plurality of analog circuits.

(24) The multiply-accumulate operation system according to (23), in which
the plurality of analog circuits is connected in series to each of the plurality of input lines.

(25) The multiply-accumulate operation system according to (24), in which
the plurality of input lines is wired so as to cross a plurality of pairs of the output lines included in the plurality of analog circuits.

(26) A multiply-accumulate operation method, comprising:
inputting electrical signals to a plurality of input lines;
generating, on a basis of the electrical signals input to the plurality of input lines, charges corresponding to multiplication values obtained by multiplying signal values represented by the electrical signals by weight values;
holding a binary state;
outputting, on a basis of the held binary state, the generated charges to one of a pair of output lines;
accumulating the charges output to the pair of output lines; and
outputting, on a basis of the accumulated charges, a multiply-accumulate signal representing a sum of the multiplication values.

REFERENCE SIGNS LIST 3 analog circuit
6 input signal line
6, 6a, 6b Axon line
7 output line
7a, 7b Dendrite line
8, 108, 208, 308, 408, 508, 608, 708 synapse circuit
9, 209 neuron circuit
11, 211 accumulation unit
12, 212 output unit
18, 18a, 18b electrical signal
120 MOS transistor
20a, 220a, 320a, 420a, 520a, 620a, 720a first MOS transistor
20b, 220b, 320b, 420b, 520b, 620b, 720b second MOS transistor
520c, 620c, 720c third MOS transistor
520d, 620d, 720d fourth MOS transistor
30, 130, 230, 330, 430, 530, 630, 730 flip-flop circuit
32a, 132a, 232a, 332a, 432a, 532a, 632a, 732a first terminal
32b, 132b, 232b, 332b, 432b, 532b, 632b, 732b second terminal
60 operating voltage line
61, 61a, 61b control line
80, 280 charging unit
100, 200 arithmetic logic unit

The invention claimed is:
1. An arithmetic logic unit, comprising:
a plurality of input lines, electrical signals being input to the plurality of input lines; and
a multiply-accumulate operation device that includes
a pair of output lines,
a plurality of multiplication units each including a weight unit that generates, on a basis of the electrical signals input to the plurality of input lines, charges corresponding to multiplication values obtained by multiplying signal values represented by the electrical signals by weight values, a holding unit that holds a binary state, and a switch unit that outputs, on a basis of the held binary state, the charges generated by the weight unit to one of the pair of output lines,
an accumulation unit that accumulates the charges output to the pair of output lines by the plurality of multiplication units, and
an output unit that outputs, on a basis of the accumulated charges, a multiply-accumulate signal representing a sum of the multiplication values.

2. The arithmetic logic unit according to claim 1, wherein
the weight unit includes a MOS transistor including an input terminal, an output terminal, and a gate terminal for controlling conduction between the input terminal and the output terminal.

3. The arithmetic logic unit according to claim 2, wherein
the weight value is set by a resistance between the input terminal and the output terminal.

4. The arithmetic logic unit according to claim 2, wherein
the holding unit includes a first terminal and a second terminal that switch and output, on a basis of the held binary state, two types of voltages so that the voltages differ from each other.

5. The arithmetic logic unit according to claim 4, wherein
the gate terminal is connected to the input line, and
the input terminal is connected to one of the first terminal, the second terminal, and a predetermined constant voltage source.

6. The arithmetic logic unit according to claim 4, wherein
the input terminal is connected to the input line, and
the gate terminal is connected to one of the first terminal, the second terminal, and a predetermined gate voltage source.

7. The arithmetic logic unit according to claim 2, wherein
the weight unit includes a first MOS transistor and a second MOS transistor connected to the same input line, and
the switch unit includes the first and second MOS transistors.

8. The arithmetic logic unit according to claim 2, wherein
the pair of output lines includes a first output line and a second output line, and
the switch unit include a first switch element that connects the output terminal and the first output line to each other and a second switch element that connects the output terminal and the second output line to each other.

9. The arithmetic logic unit according to claim 2, wherein
the holding unit is connected to the input terminal, and
the weight unit outputs a control signal for controlling the binary state of the holding unit from the input terminal.

10. The arithmetic logic unit according to claim 1, wherein
the weight unit generates charges corresponding to a multiplication value obtained by multiplying the signal value by an absolute value of the weight value, and
the holding unit holds a binary state corresponding to a sign of the weight value.

11. The arithmetic logic unit according to claim 1, wherein
the weight value is set to one of a first value and a second value having equal absolute values and different signs in the plurality of multiplication units.

12. The arithmetic logic unit according to claim 1, wherein
the plurality of input lines includes pairs of the input lines, each of the pairs including a first input line and a second input line, and
the multiplication unit includes a first weight unit connected to the first input line and a second weight unit connected to the second input line, of the pair of input lines.

13. The arithmetic logic unit according to claim 12, wherein
the multiplication unit includes a first switch unit that outputs, on a basis of the held binary state, charges generated by the first weight unit to one of the pair of output lines, and a second switch unit that outputs, on a basis of the held binary state, charges generated by the second weight unit to the other of the pair of output lines.

14. The arithmetic logic unit according to claim 1, wherein
the weight unit includes a high-resistance element that controls an amount of charges corresponding to the multiplication value.

15. The arithmetic logic unit according to claim 1, wherein
the weight unit includes a MOS transistor that operates in a subthreshold region.

16. The arithmetic logic unit according to claim 1, further comprising
a plurality of the multiply-accumulate operation devices connected in parallel to each of the plurality of input lines.

17. The arithmetic logic unit according to claim 16, wherein
the plurality of input lines is wired so as to cross a plurality of pairs of the output lines included in the plurality of multiply-accumulate operation devices.

18. The arithmetic logic unit according to claim 1, wherein
the electrical signal is a signal representing the signal value by timing within an input period or a pulse width,
the multiply-accumulate operation device includes a charging unit that charges the accumulation unit at a constant charging speed in an output period after the input period, and
the output unit outputs the multiply-accumulate signal by performing threshold determination on a potential of the accumulation unit in the output period.

19. The arithmetic logic unit according to claim 18, wherein
the charging unit connects the accumulation unit to the pair of output lines in the input period, and connects the accumulation unit to a current source in the output period, the current source supplying a current corresponding to the constant charging speed.

20. The arithmetic logic unit according to claim 18, wherein
the charging unit connects the accumulation unit to a GND before the input period.

21. A multiply-accumulate operation device, comprising:
a pair of output lines;
a plurality of multiplication units each that includes a weight unit that generates, on a basis of electrical signals input to a plurality of input lines, charges corresponding to multiplication values obtained by multiplying signal values represented by the electrical signals by weight values, a holding unit that holds a binary state, and a switch unit that outputs, on a basis of the held binary state, the charges generated by the weight unit to one of the pair of output lines;
an accumulation unit that accumulates the charges output to the pair of output lines by the plurality of multiplication units; and
an output unit that outputs, on a basis of the accumulated charges, a multiply-accumulate signal representing a sum of the multiplication values.

22. A multiply-accumulate operation circuit, comprising:
a pair of output lines;
a plurality of multiplication units each that includes a weight unit that generates, on a basis of electrical signals input to a plurality of input lines, charges corresponding to multiplication values obtained by multiplying signal values represented by the electrical signals by weight values, a holding unit that holds a binary state, and a switch unit that outputs, on a basis of the held binary state, the charges generated by the weight unit to one of the pair of output lines;

an accumulation unit that accumulates the charges output to the pair of output lines by the plurality of multiplication units; and an output unit that outputs, on a basis of the accumulated charges, a multiply-accumulate signal representing a sum of the multiplication values.

23. A multiply-accumulate operation system, comprising:

a plurality of input lines, electrical signals being input to the plurality of input lines;

a plurality of analog circuits that includes a pair of output lines, a plurality of multiplication units each including a weight unit that generates, on a basis of the electrical signals input to the plurality of input lines, charges corresponding to multiplication values obtained by multiplying signal values represented by the electrical signals by weight values, a holding unit that holds a binary state, and a switch unit that outputs, on a basis of the held binary state, the charges generated by the weight unit to one of the pair of output lines, an accumulation unit that accumulates the charges output to the pair of output lines by the plurality of multiplication units, and an output unit that outputs, on a basis of the accumulated charges, a multiply-accumulate signal representing a sum of the multiplication values; and a network circuit configured by connecting the plurality of analog circuits.

* * * * *